US012588405B2

(12) United States Patent
Yoo et al.

(10) Patent No.: US 12,588,405 B2
(45) Date of Patent: Mar. 24, 2026

(54) ORGANOMETALLIC COMPOUND, LIGHT-EMITTING DEVICE INCLUDING THE ORGANOMETALLIC COMPOUND, AND ELECTRONIC APPARATUS INCLUDING THE LIGHT-EMITTING DEVICE

(71) Applicant: Samsung Display Co., Ltd., Yongin-si (KR)

(72) Inventors: Dongsun Yoo, Yongin-si (KR); Donguk Kang, Yongin-si (KR); Gyeongheon Kim, Yongin-si (KR); Seran Kim, Yongin-si (KR); Sohae Kim, Yongin-si (KR); Jihye Kim, Yongin-si (KR); Hoilim Kim, Yongin-si (KR); Saerom Park, Yongin-si (KR); Yongsub Shim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 388 days.

(21) Appl. No.: 18/241,749

(22) Filed: Sep. 1, 2023

(65) Prior Publication Data

US 2024/0114767 A1 Apr. 4, 2024

(30) Foreign Application Priority Data

Sep. 7, 2022 (KR) ........................ 10-2022-0113780

(51) Int. Cl.

*H10K 85/30* (2023.01)
*C07F 15/00* (2006.01)

(Continued)

(52) U.S. Cl.

CPC ....... *H10K 85/342* (2023.02); *C07F 15/0033* (2013.01); *C09K 11/06* (2013.01);

(Continued)

(58) Field of Classification Search

CPC ............. C07F 15/0033; C07F 15/0086; H10K 85/342; H10K 50/11; H10K 85/346; H10K 85/40; C09K 11/06

See application file for complete search history.

(56) References Cited

U.S. PATENT DOCUMENTS

| | | | | |
|---|---|---|---|---|
| 6,835,469 | B2 | 12/2004 | Kwong et al. | |
| 2007/0082284 | A1* | 4/2007 | Stoessel | C07F 15/0033 430/84 |

(Continued)

FOREIGN PATENT DOCUMENTS

KR 10-2005-0037479 A 4/2005

*Primary Examiner* — Moazzam Hossain
(74) *Attorney, Agent, or Firm* — Womble Bond Dickinson (US) LLP

(57) ABSTRACT

Provided are an organometallic compound represented by Formula 1, a light-emitting device including the organometallic compound, and an electronic apparatus including the light-emitting device. The first ligand, $L_1$, of the organometallic compound may include a first polycyclic coordinate ring in which four or more rings are condensed with each other and a second polycyclic coordinate ring in which three or more rings are condensed with each other.

$$M_1(L_1)_{n1}(L_2)_{n2}$$ Formula 1.

20 Claims, 9 Drawing Sheets

10

(51) Int. Cl.
*C09K 11/06* (2006.01)
*H10K 50/11* (2023.01)

(52) U.S. Cl.
CPC ................. *C09K 2211/1011* (2013.01); *C09K 2211/1033* (2013.01); *C09K 2211/1037* (2013.01); *C09K 2211/1088* (2013.01); *C09K 2211/1092* (2013.01); *C09K 2211/185* (2013.01); *H10K 50/11* (2023.02)

(56) References Cited

U.S. PATENT DOCUMENTS

| | | | | |
|---|---|---|---|---|
| 2010/0244004 | A1 | 9/2010 | Xia et al. | |
| 2012/0327326 | A1* | 12/2012 | Suh | H01J 63/02<br>977/890 |
| 2015/0357587 | A1* | 12/2015 | Kishino | H10K 85/30<br>257/40 |
| 2016/0336520 | A1* | 11/2016 | Boudreault | C09K 11/025 |
| 2021/0399236 | A1 | 12/2021 | Layek et al. | |

* cited by examiner

ORGANOMETALLIC COMPOUND, LIGHT-EMITTING DEVICE INCLUDING THE ORGANOMETALLIC COMPOUND, AND ELECTRONIC APPARATUS INCLUDING THE LIGHT-EMITTING DEVICE

CROSS-REFERENCE TO RELATED APPLICATION

This application claims priority to and the benefit of Korean Patent Application No. 10-2022-0113780, filed on Sep. 7, 2022, in the Korean Intellectual Property Office, the content of which is incorporated by reference herein in its entirety.

BACKGROUND

1. Field

One or more embodiments of the present disclosure relate to an organometallic compound, a light-emitting device including the organometallic compound, and an electronic apparatus including the light-emitting device.

2. Description of the Related Art

Self-emissive devices (for example, organic light-emitting devices) in light-emitting devices have wide viewing angles, high contrast ratios, short response times, and excellent or suitable characteristics in terms of luminance, driving voltage, and/or response speed.

In a light-emitting device, a first electrode is located on a substrate, and a hole transport region, an emission layer, an electron transport region, and a second electrode are sequentially arranged on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. These excitons transition and relax from an excited state to a ground state to thereby generate light.

SUMMARY

One or more aspects of embodiments of the present disclosure are directed toward an organometallic compound that may provide excellent or suitable emission efficiency and color purity characteristics, a light-emitting device having excellent or suitable emission efficiency and color purity characteristics by employing the organometallic compound, and an electronic apparatus including the light-emitting device.

Additional aspects will be set forth in part in the description which follows and, in part, will be apparent from the description, or may be learned by practice of the presented embodiments of the disclosure.

According to one or more embodiments of the present disclosure, an organometallic compound represented by Formula 1 is provided:

$$M_1(L_1)_{n1}(L_2)_{n2},$$ Formula 1 wherein, in Formula 1, $M_1$ may be a transition metal, $L_1$ may be a ligand represented by Formula 1A, $L_2$ may be a bidentate ligand, n1 and n2 may each independently be 1 or 2, Formula 1A

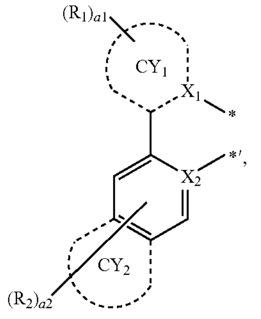

wherein, in Formula 1A, $X_1$ may be C or N, and $X_2$ may be C or N, ring $CY_1$ and ring $CY_2$ may each independently be a $C_5$-$C_{60}$ carbocyclic group or a $C_1$-$C_{60}$ heterocyclic group, ring $CY_1$ may be a polycyclic group in which four or more rings are condensed with each other, $R_1$ and $R_2$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, a1 and a2 may each independently be an integer from 1 to 10, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl; a $C_2$-$C_{60}$ alkenyl group; a $C_2$-$C_{60}$ group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

According to one or more embodiments of the present disclosure, an organometallic compound may include a first metal and a first ligand, wherein the first metal may be iridium (Ir), platinum (Pt), osmium (Os), titanium (Ti), zirconium (Zr), hafnium (Hf), europium (Eu), terbium (Tb), thulium (Tm), or rhodium (Rh), the first ligand may be a bidentate ligand bonded to the first metal, the first ligand may include a first ring and a second ring which are directly bonded to the first metal, the first ring and the second ring may each independently be a $C_5$-$C_{60}$ carbocyclic group or a $C_1$-$C_{60}$ heterocyclic group, the organometallic compound may be to emit first light, a photoluminescence (PL) spectrum of the first light may include a first peak ($\lambda_1$), which is a peak having a highest intensity ($I_1$), and a second peak ($\lambda_2$), which is a peak having a second-highest intensity ($I_2$), and Condition 1 and Condition 2 may be satisfied:

Condition 1 a wavelength in which the first peak is exhibited is 610 nm to 640 nm, and

Condition 2 a ratio of an intensity of the second peak to an intensity of the first peak ($I_2/I_1$) is 0.1 to 0.2.

According to one or more embodiments of the present disclosure, a light-emitting device may include a first electrode, a second electrode facing the first electrode, an interlayer between the first electrode and the second electrode, and the organometallic compound.

According to one or more embodiments of the present disclosure, an electronic apparatus may include the light-emitting device.

BRIEF DESCRIPTION OF THE DRAWINGS

The accompanying drawings are included to provide a further understanding of the present disclosure and are incorporated in and constitute a part of the present disclosure. The drawings illustrate embodiments of the present disclosure and, together with the description, serve to explain principles of the present disclosure. The above and other aspects, features, and advantages of certain embodiments of the disclosure will be more apparent from the following description taken in conjunction with the accompanying drawings, in which.

DETAILED DESCRIPTION

Figure 1:
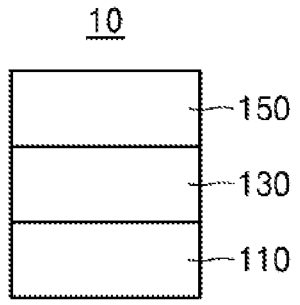
FIG. 1 is a schematic diagram of a structure of a light-emitting device according to one or more embodiments of the present disclosure.

Reference will now be made in more detail to embodiments, examples of which are illustrated in the accompanying drawings, wherein like reference numerals refer to like elements throughout the present disclosure, and duplicative descriptions thereof may not be provided for conciseness. In this regard, the embodiments of the present disclosure may have different forms and should not be construed as being limited to the descriptions set forth herein. Accordingly, the embodiments of the present disclosure are merely described, by referring to the drawings, to explain aspects of the present disclosure. As utilized herein, the term "and/or" or "or" may include any and all combinations of one or more of the associated listed items. Throughout the disclosure, the expression "at least one of a, b or c" indicates only a, only b, only c, both (e.g., simultaneously) a and b, both (e.g., simultaneously) a and c, both (e.g., simultaneously) b and c, all of a, b, and c, or variations thereof.

In the present disclosure, a wavelength in which a peak of first light is exhibited (or a maximum emission wavelength) and a peak intensity of the first light may be evaluated from an emission spectrum of a film including the organometallic compound (see Evaluation Example 2).

In the present disclosure, the "first peak" may refer to a peak having a highest intensity in a photoluminescence (PL) spectrum of the first light. The first peak may be separated by fitting the PL spectrum in a wavelength range less than a wavelength in which the highest intensity is exhibited by utilizing a normal distribution. A center wavelength of the separated first peak corresponds to $\lambda_1$, and an intensity of the separated first peak corresponds to $I_1$.

In the present disclosure, the "second peak" may refer to a peak having a second-highest intensity in the PL spectrum of the first light. The second peak may be separated by fitting the PL spectrum in the [$\lambda_1$, $\lambda_1$+60 nm] range by utilizing a normal distribution. A center wavelength of the separated second peak corresponds to $\lambda_2$, and an intensity of the separated second peak corresponds to $I_2$.

In one or more embodiments, $\lambda_2$ may satisfy the [$\lambda_1$+30 nm, $\lambda_1$+40 nm] range.

In the present disclosure, the "reorganization energy" may be calculated according to Equation 1 based on density functional theory (DFT) calculation:

$$G=E(S0;T1)-E(S0;S0). \qquad \text{Equation 1}$$

Figure 7:
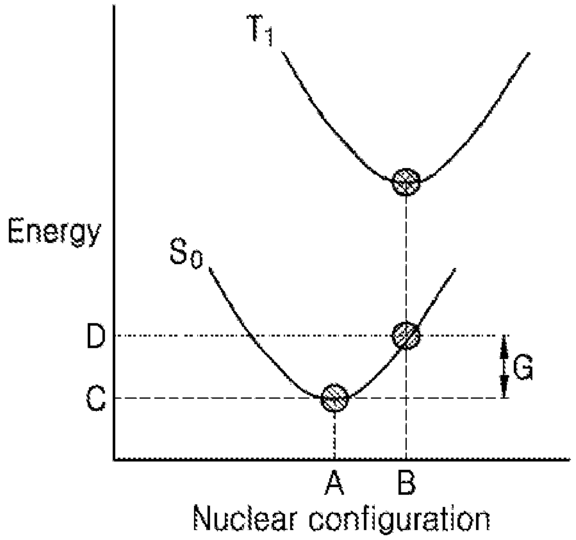
FIG. 7 is a graph showing a method of deriving reorganization energy according to density functional theory (DFT) calculation.

In Equation 1,

G represents a reorganization energy value of the organometallic compound,

E(S0;S0) represents an energy value in a S0 state in a S0 structure of the organometallic compound (e.g., corresponding to C of FIG. 7), and E(S0;T1) represents an energy value in a S0 state in a T1 structure of the organometallic compound (e.g., corresponding to D of FIG. 7).

The S0 structure may refer to a structure having a lowest energy in the S0 state (e.g., corresponding to A of FIG. 7, a ground singlet state), and the T1 structure may refer to a structure having a lowest energy in the T1 state (e.g., corresponding to B of FIG. 7, a first triplet state).

According to one or more aspects of embodiments of the present disclosure, an organometallic compound represented by Formula 1 is provided:

$$M_1(L_1)_{n1}(L_2)_{n2}.\qquad\text{Formula 1}$$

In Formula 1, $M_1$ may be a transition metal.

According to one or more embodiments, $M_1$ in Formula 1 may be a first-row transition metal of the Periodic Table of Elements, a second-row transition metal of the Periodic Table of Elements, or a third-row transition metal of the Periodic Table of Elements.

According to one or more embodiments, $M_1$ may be iridium (Ir), platinum (Pt), osmium (Os), titanium (Ti), zirconium (Zr), hafnium (Hf), europium (Eu), terbium (Tb), thulium (Tm), or rhodium (Rh).

For example, in some embodiments, $M_1$ may be Ir.

In Formula 1, n1 and n2 may each independently be 1 or 2.

According to one or more embodiments, the sum of n1 and n2 may be 3.

For example, in some embodiments, n1 may be 2, and n2 may be 1.

In Formula 1, $L_1$ may be a ligand represented by Formula 1A:

Formula 1A

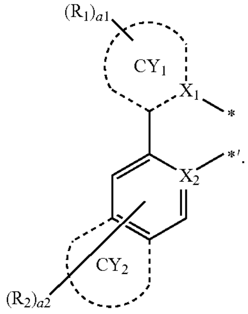

In Formula 1A, $X_1$ may be C or N, and $X_2$ may be C or N.

For example, in some embodiments, $X_1$ may be N, and $X_2$ may be C.

In Formula 1A, ring $CY_1$ and $CY_2$ may each independently be a $C_5$-$C_{60}$ carbocyclic group or a $C_1$-$C_{60}$ heterocyclic group.

According to one or more embodiments, ring $CY_1$ may be a polycyclic group in which four or more rings are condensed with each other.

According to one or more embodiments, ring $CY_1$ may include at least one 5-membered ring. For example, in some embodiments, a 5-membered ring of ring $CY_1$ may include at least one heteroatom.

According to one or more embodiments, in Formula 1A, a part represented by

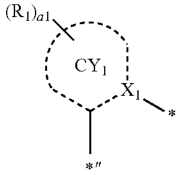

may be a group represented by any one selected from among Formulae CY1(1) to CY1(4):

CY1(1)

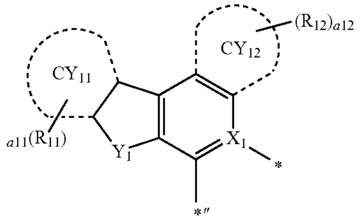

CY1(2)

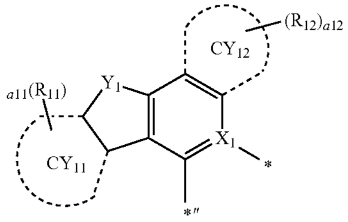

CY1(3)

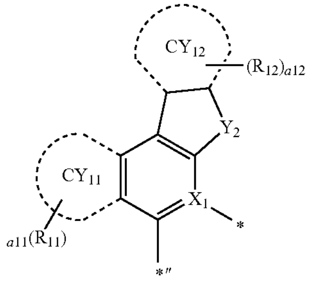

CY1(4)

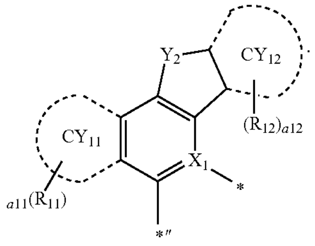

In Formulae CY1(1) to CY1(4), ring $CY_{11}$ and ring $CY_{12}$ may each independently be a $C_5$-$C_{60}$ carbocyclic group or a $C_1$-$C_{60}$ heterocyclic group, $X_1$ may be C or N, $Y_1$ may be O, S, Se, $N(R_{1a})$, $C(R_{1a})(R_{1b})$, or $Si(R_{1a})(R_{1b})$, $Y_2$ may be O, S, Se, $N(R_{1c})$, $C(R_{1c})(R_{1d})$, or $Si(R_{1c})(R_{1d})$, $R_{11}$, $R_{12}$, $R_{1a}$, $R_{1b}$, $R_{1c}$, and $R_{1d}$ may each independently be as described herein with respect to $R_1$, a11 and a12 may each independently be an integer from 1 to 10, and

* and *" may each indicate a binding site to a neighboring atom.

According to one or more embodiments, ring $CY_{11}$ and $CY_{12}$ may each independently be a benzene group, a naphthalene group, a pyridine group, a pyrimidine group, a pyrazine group, a pyridazine group, a quinoline group, or an isoquinoline group.

According to one or more embodiments, in Formula 1A, a part represented by

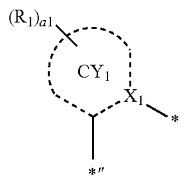

may be a group represented by any one selected from among Formulae CY1(1A) to CY1(4A):

CY1(1A)

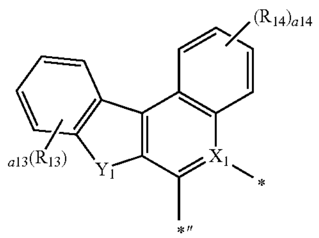

CY1(2A)

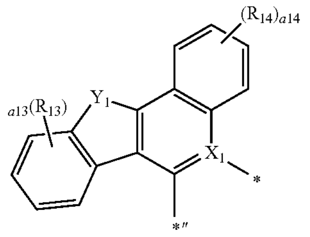

CY1(3A)

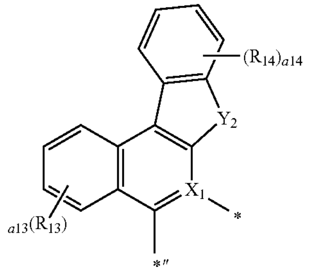

CY1(4A)

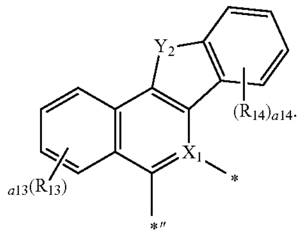

In Formulae CY1(1A) to CY1(4A), $X_1$ may be C or N, $Y_1$ may be O, S, Se, $N(R_{1a})$, $C(R_{1a})(R_{1b})$, or $Si(R_{1a})(R_{1b})$, $Y_2$ may be O, S, Se, $N(R_{1c})$, $C(R_{1c})(R_{1d})$, or $Si(R_{1c})(R_{1d})$, $R_{13}$, $R_{14}$, $R_{1a}$, $R_{1b}$, $R_{1c}$, and $R_{1d}$ may each independently be as described herein with respect with $R_1$, a13 and a14 may each independently be an integer from 1 to 4, and

* and *" may each indicate a binding site to a neighboring atom.

According to one or more embodiments, ring $CY_2$ may be a polycyclic group in which two or more cyclic groups are condensed with each other. For example, in some embodiments, ring $CY_2$ may be a polycyclic group in which two cyclic groups are condensed.

According to one or more embodiments, ring $CY_2$ may be i) a polycyclic group in which two or more cyclic groups selected from Group A1 are condensed with each other, ii) a polycyclic group in which two or more cyclic groups selected from Group A2 are condensed with each other, or iii) a polycyclic group in which at least one cyclic group selected from Group A1 and at least one cyclic group selected from Group A2 are condensed with each other.

Group A1 a cyclopentane group, a cyclopentadiene group, a furan group, a thiophene group, a pyrrole group, a silole group, an indene group, a benzofuran group, a benzothiophene group, an indole group, a benzosilole group, an oxazole group, an isooxazole group, an oxadiazole group, an isooxadiazole group, an oxatriazole group, an isooxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, Group A2 an adamantane group, a norbornane group, a norbornene group, a cyclohexane group, a cyclohexene group, a benzene group, a pyridine group, a pyrimidine group, a pyrazine group, a pyridazine group, and a triazine group.

According to one or more embodiments, ring $CY_2$ may be a naphthalene group, an anthracene group, a phenanthrene group, an indole group, a benzoborole group, a benzophosphole group, an indene group, a benzosilole group, a benzogermole group, a benzothiophene group, a benzoselenophene group, a benzofuran group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, a quinoline group, an isoquinoline group, a quinoxaline group, a quinazoline group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

According to one or more embodiments, in Formula 1A, a part represented by

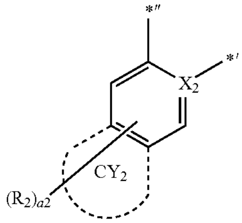

may be a group represented by any one selected from Formulae CY2(1) to CY2(5):

CY2(1)

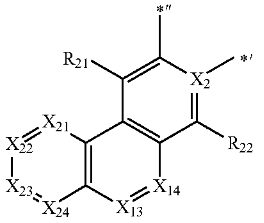

CY2(2)

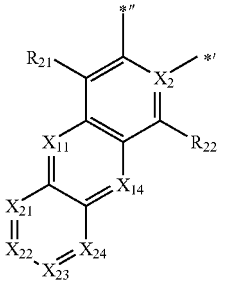

CY2(3)

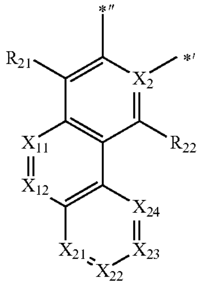

CY2(4)

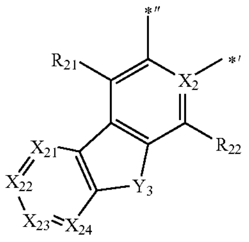

-continued

CY2(5)

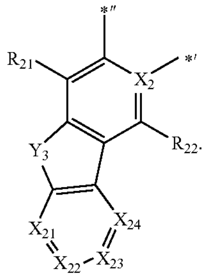

In Formulae CY2(1) to CY2(5), $X_2$ may be C or N, $X_{11}$ may be $C(Z_{11})$ or N, $X_{12}$ may be $C(Z_{12})$ or N, $X_{13}$ may be $C(Z_{13})$ or N, $X_{14}$ may be $C(Z_{14})$ or N, $X_{21}$ may be $C(Z_{21})$ or N, $X_{22}$ may be $C(Z_{22})$ or N, $X_{23}$ may be $C(Z_{23})$ or N, $X_{24}$ may be $C(Z_{24})$ or N, $Y_3$ may be O, S, Se, $N(R_{3a})$, $C(R_{3a})(R_{3b})$, $Si(R_{3a})(R_{3b})$, or $Ge(R_{3a})(R_{3b})$, $R_{21}$, $R_{22}$, $Z_{11}$ to $Z_{14}$, $Z_{21}$ to $Z_{24}$, $R_{3a}$, and $R_{3b}$ may each independently be as described herein with respect to $R_2$, and

*' and *" may each indicate a binding site to a neighboring atom.

In Formula 1A, $R_1$ and $R_2$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_6$ alkoxy group unsubstituted or substituted with at least one $R_{10a}$, a $C_1$-$C_6$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$. $R_{10a}$ and $Q_1$ to $Q_3$ may each be as described herein.

According to one or more embodiments, $R_1$ and $R_2$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one selected from among deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_7$-$C_{16}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, or an azadibenzosilolyl group, each unsubstituted or substituted with at least one selected from among deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_7$-$C_{16}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, and $—P(=O)(Q_{31})(Q_{32})$; or $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, and $Q_1$ to $Q_3$ and $Q_{31}$ to $Q_{33}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with at least one selected from among deuterium, a $C_1$-$C_{10}$ alkyl group, a phenyl group, a biphenyl group, a pyridinyl group, a pyrimidinyl group, a pyridazinyl group, a pyrazinyl group, and a triazinyl group.

According to one or more embodiments, $R_1$ and $R_2$ may each independently be:

hydrogen, deuterium, —F, —Cl, —Br, —I, $—CD_3$, $—CD_2H$, $—CDH_2$, $—CF_3$, $—CF_2H$, $—CFH_2$, a $C_1$-$C_{60}$ alkyl, a $C_2$-$C_{60}$ alkenyl group, a $C_2$-$C_{60}$ group, or a $C_1$-$C_{60}$ alkoxy group;

a group represented by one selected from Formulae 9-1 to 9-61, 9-201 to 9-237, 10-1 to 10-129, and 10-201 to 10-350; or $—N(Q_1)(Q_2)$:

9-1

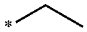

9-2

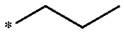

9-3

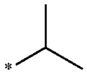

9-4

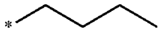

9-5

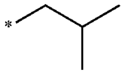

9-6

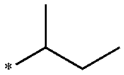

9-7

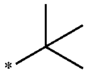

9-8

9-9

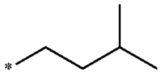

9-10

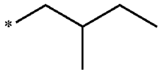

9-11

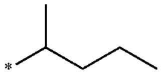

9-12

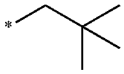

9-13

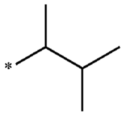

9-14

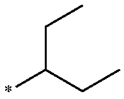

-continued
9-15
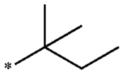
9-16
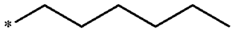
9-17
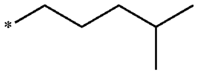
9-18
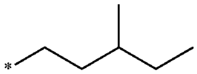
9-19
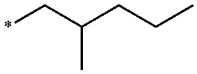
9-20
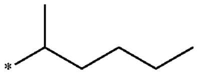
9-21
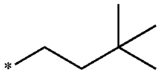
9-22
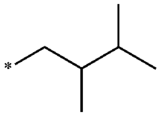
9-23
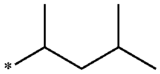
9-24
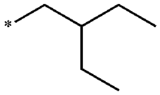
9-25
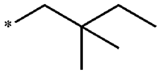
9-26
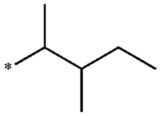
9-27
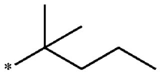
9-28
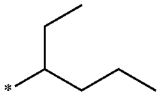
9-29
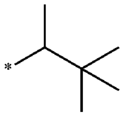
9-30
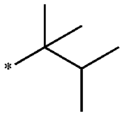
-continued
9-31
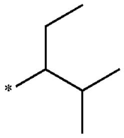
9-32
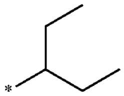
9-33
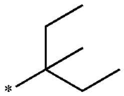
9-34
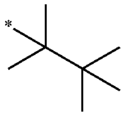
9-35
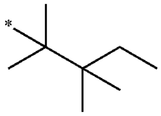
9-36
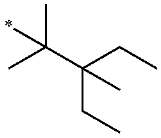
9-37
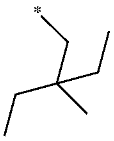
9-38
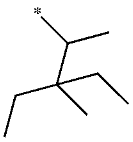
9-39
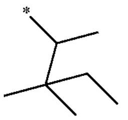
9-40
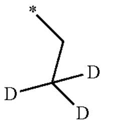
9-41
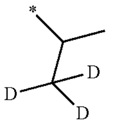

-continued
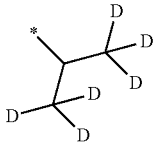
9-42
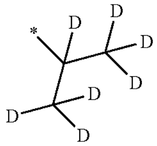
9-43
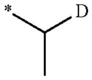
9-44
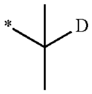
9-45
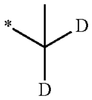
9-46
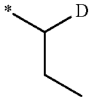
9-47
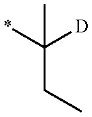
9-48
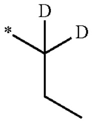
9-49
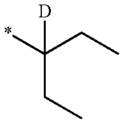
9-50
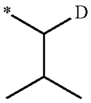
9-51
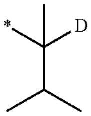
9-52
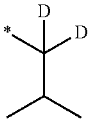
9-53
-continued
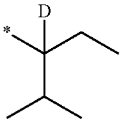
9-54
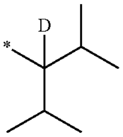
9-55
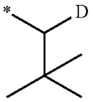
9-56
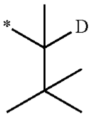
9-57
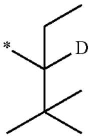
9-58
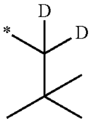
9-59
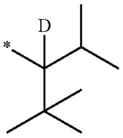
9-60
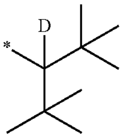
9-61
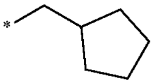
9-201
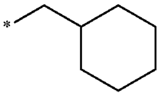
9-202
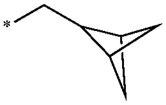
9-203
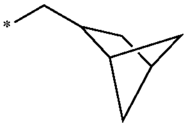
9-204

-continued
9-205
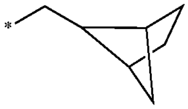
9-206
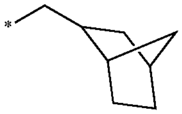
9-207
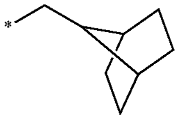
9-208
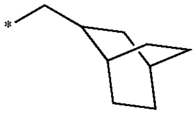
9-209
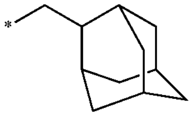
9-210
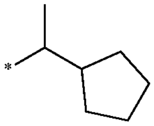
9-211
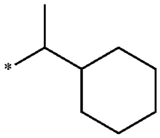
9-212
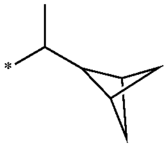
9-213
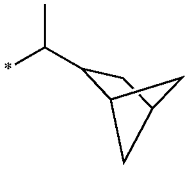
9-214
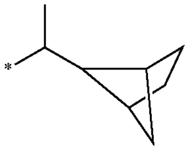
9-215
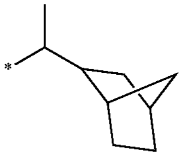
-continued
9-216
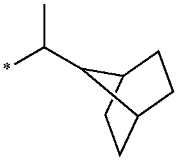
9-217
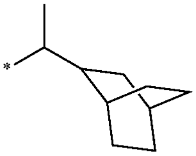
9-218
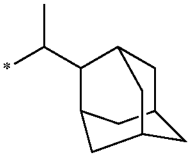
9-219
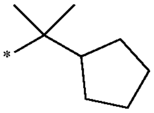
9-220
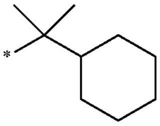
9-221
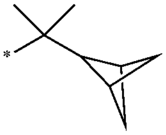
9-222
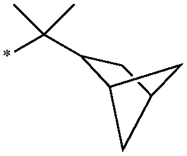
9-223
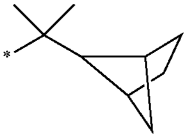
9-224
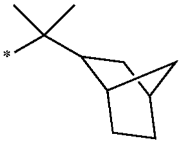
9-225
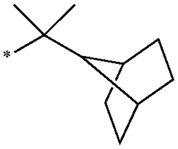

-continued
9-226
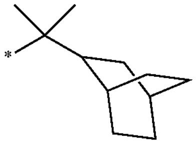
9-227
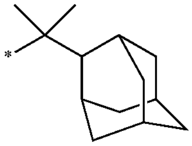
9-228
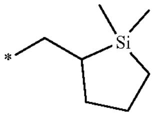
9-229
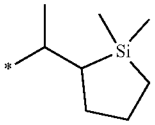
9-230
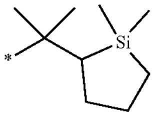
9-231
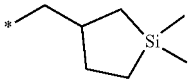
9-232
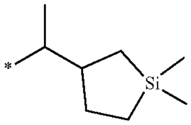
9-233
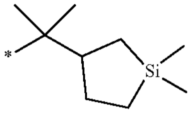
9-234
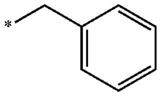
9-235
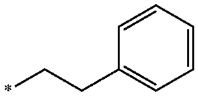
9-236
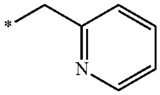
9-237
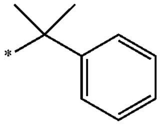
-continued
10-1
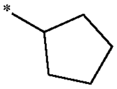
10-2
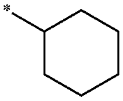
10-3
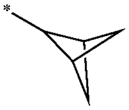
10-4
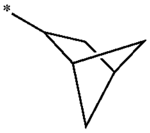
10-5
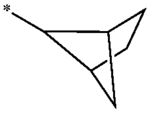
10-6
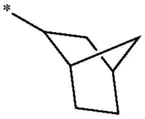
10-7
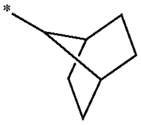
10-8
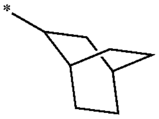
10-9
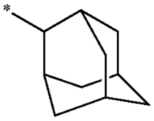
10-10
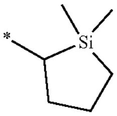
10-11
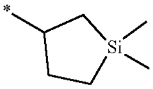
10-12
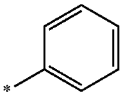
10-13
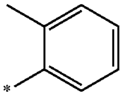

-continued
10-14
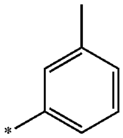
10-15
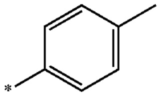
10-16
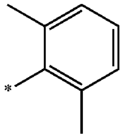
10-17
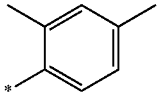
10-18
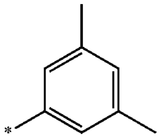
10-19
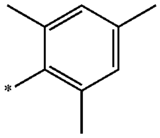
10-20
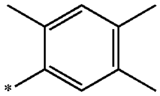
10-21
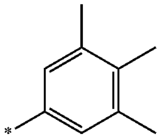
10-22
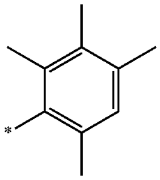
10-23
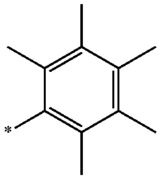
10-24
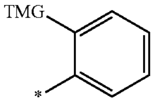
-continued
10-25
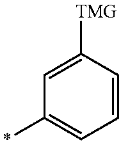
10-26
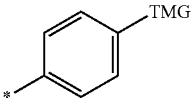
10-27
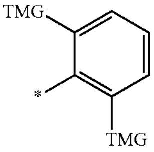
10-28
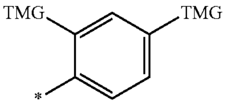
10-29
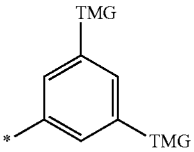
10-30
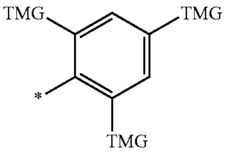
10-31
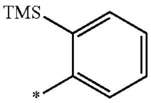
10-32
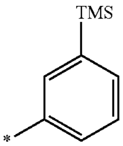
10-33
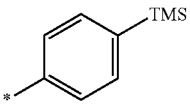
10-34
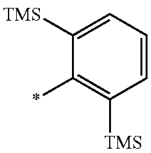
10-35
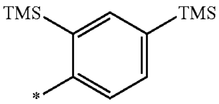

-continued
10-36
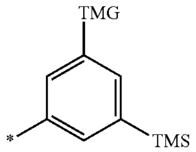
10-37
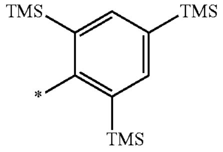
10-38
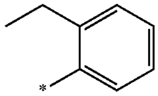
10-39
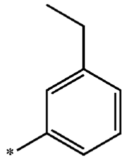
10-40
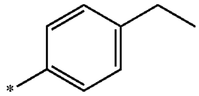
10-41
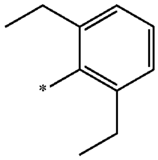
10-42
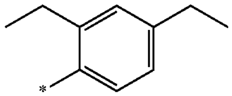
10-43
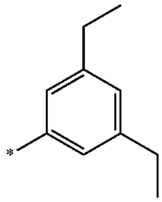
10-44
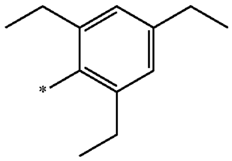
10-45
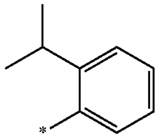
-continued
10-46
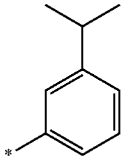
10-47
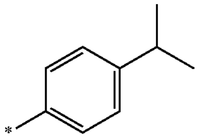
10-48
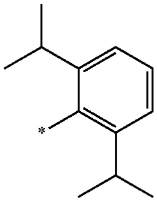
10-49
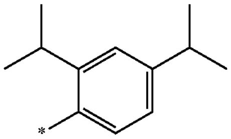
10-50
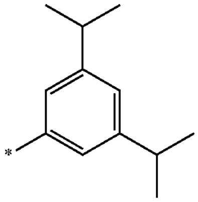
10-51
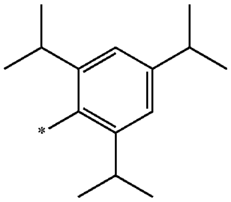
10-52
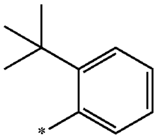
10-53
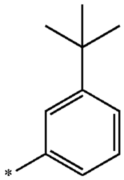
10-54
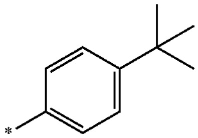

-continued
10-55
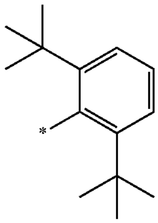
10-56
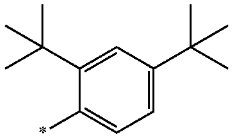
10-57
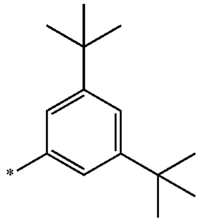
10-58
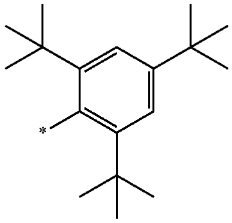
10-59
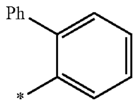
10-60
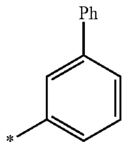
10-61
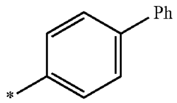
10-62
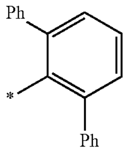
10-63
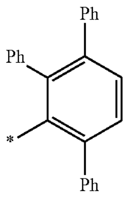
-continued
10-64
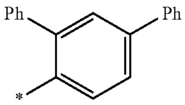
10-65
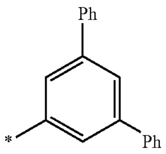
10-66
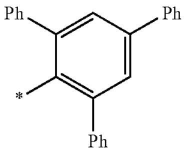
10-67
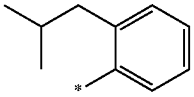
10-68
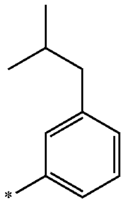
10-69
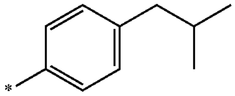
10-70
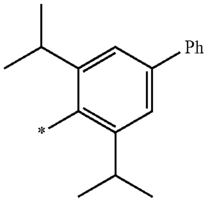
10-71
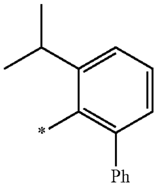
10-72
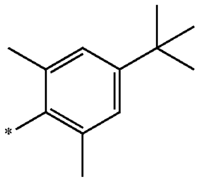
10-73
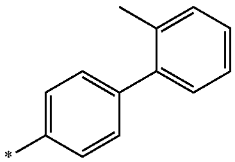

-continued
10-74
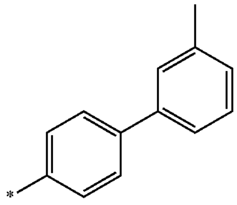
10-75
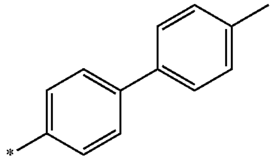
10-76
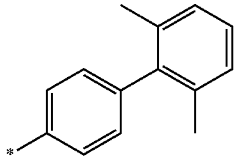
10-77
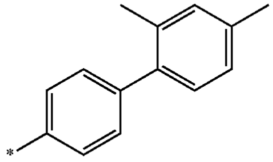
10-78
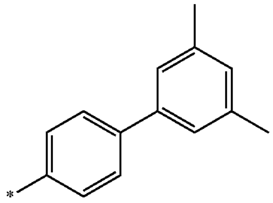
10-79
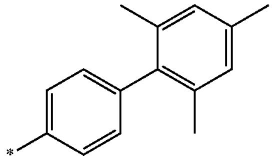
10-80
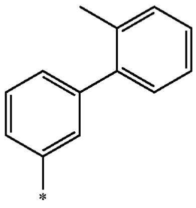
10-81
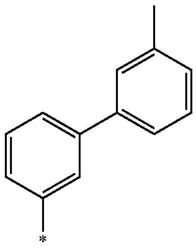
-continued
10-82
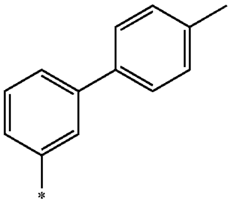
10-83
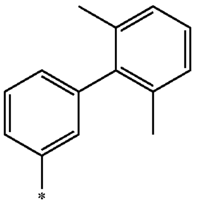
10-84
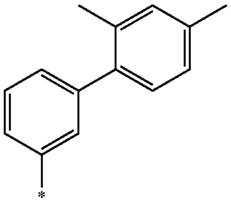
10-85
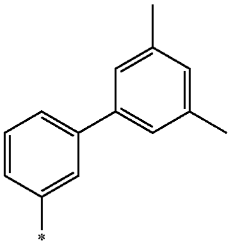
10-86
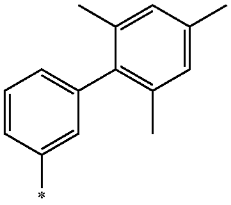
10-87
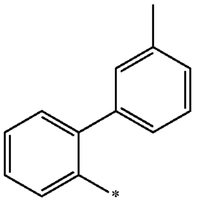
10-88
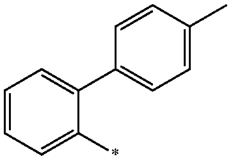

-continued
10-89
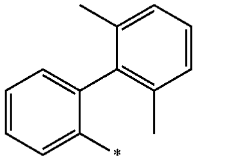
10-90
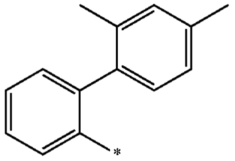
10-91
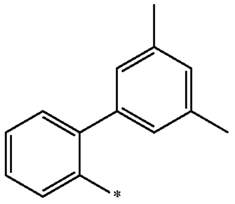
10-92
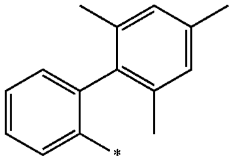
10-94
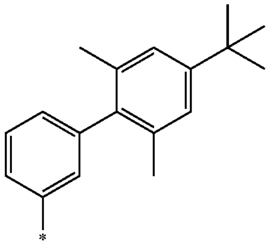
10-95
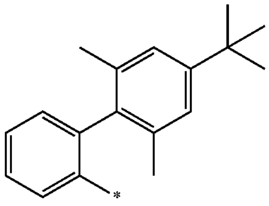
10-96
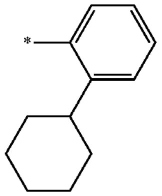
10-97
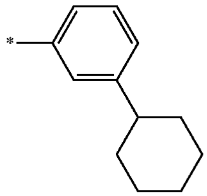
-continued
10-98
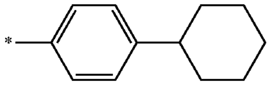
10-99
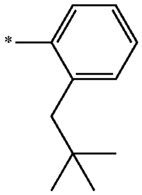
10-100
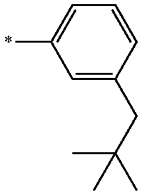
10-101
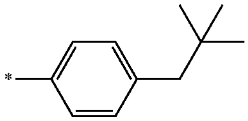
10-102
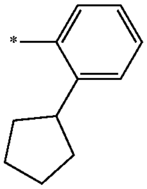
10-103
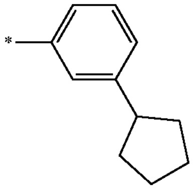
10-104
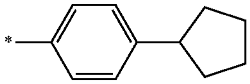
10-105
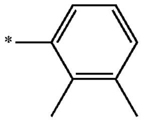
10-106
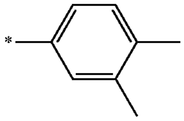

-continued
10-107
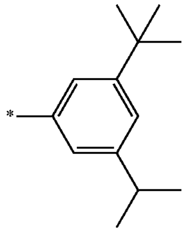
10-108
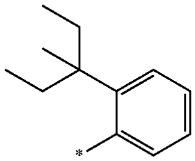
10-109
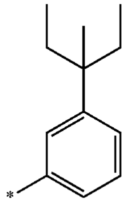
10-110
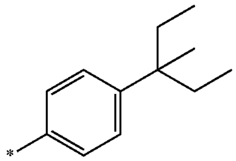
10-111
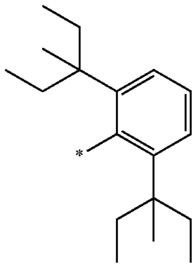
10-112
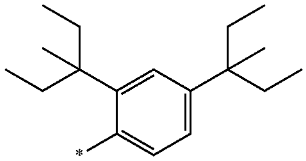
10-113
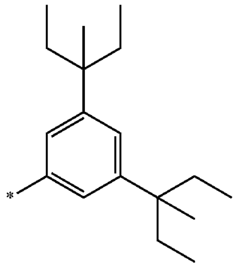
-continued
10-114
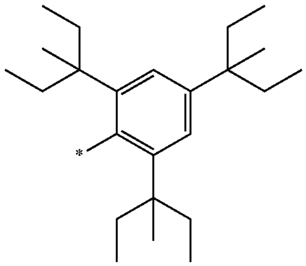
10-115
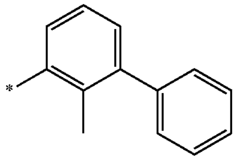
10-116
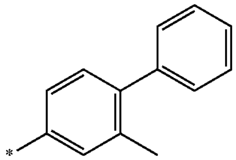
10-117
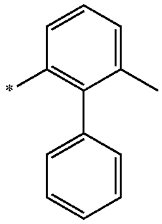
10-118
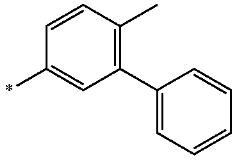
10-119
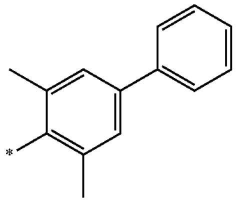
10-120
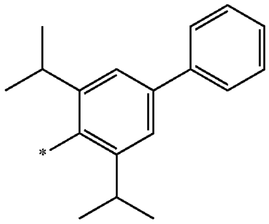
10-121
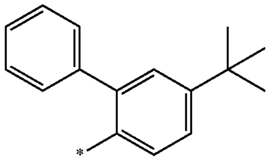

-continued
10-122
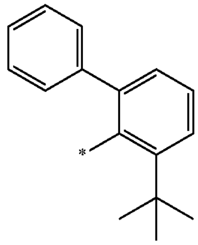
10-123
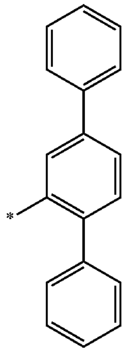
10-124
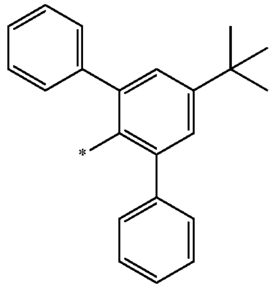
10-125
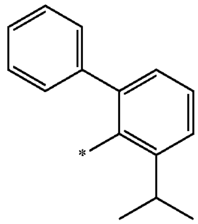
10-126
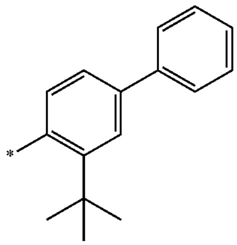
10-127
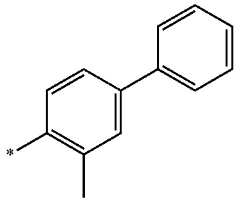
-continued
10-128
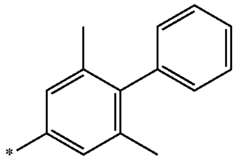
10-129
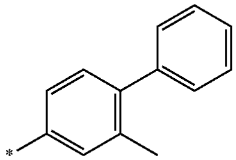
10-201
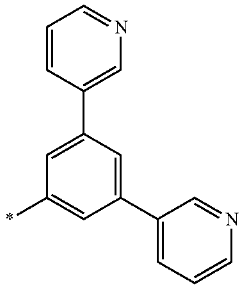
10-202
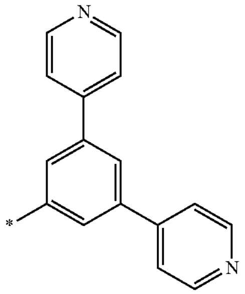
10-203
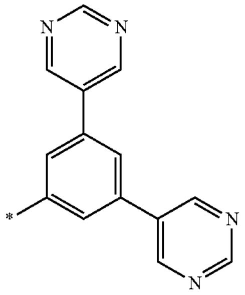
10-204
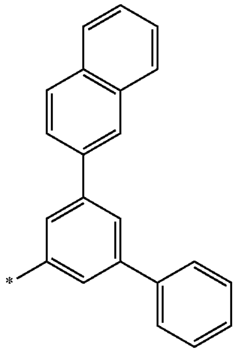

-continued
10-205
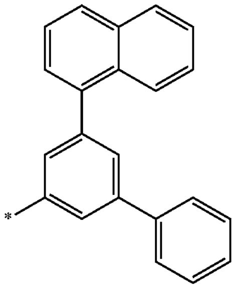
10-206
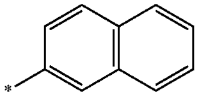
10-207
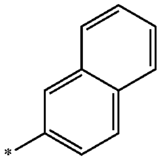
10-208
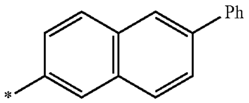
10-209
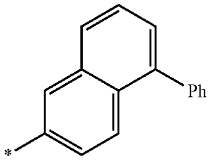
10-210
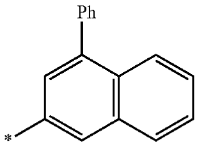
10-211
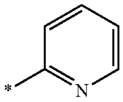
10-212
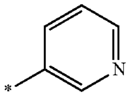
10-213
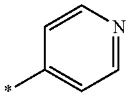
10-214
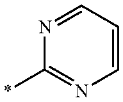
10-215
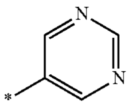
-continued
10-216
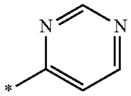
10-217
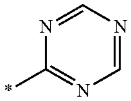
10-218
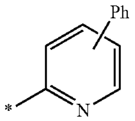
10-219
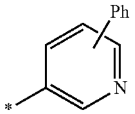
10-220
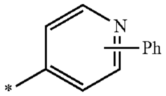
10-221
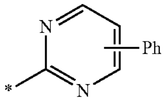
10-222
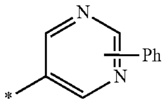
10-223
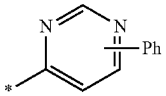
10-224
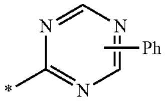
10-225
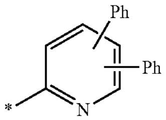
10-226
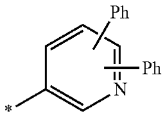
10-227
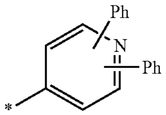
10-228
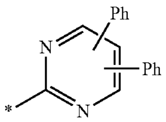

-continued
10-229
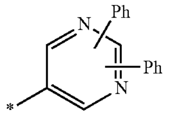
10-230
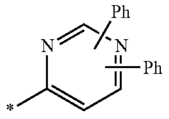
10-231
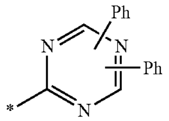
10-232
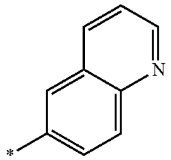
10-233
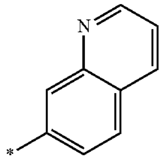
10-234
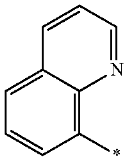
10-235
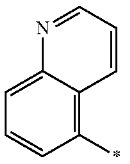
10-236
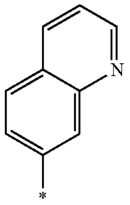
10-237
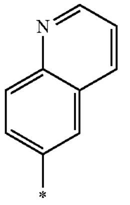
-continued
10-238
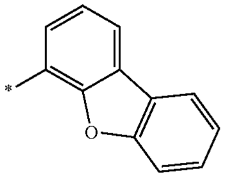
10-239
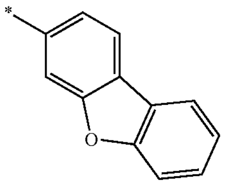
10-240
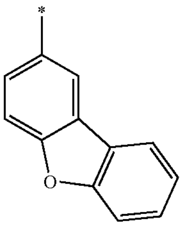
10-241
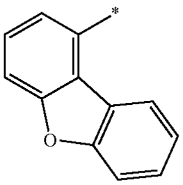
10-242
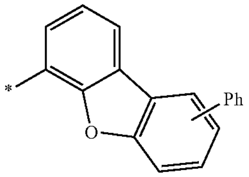
10-243
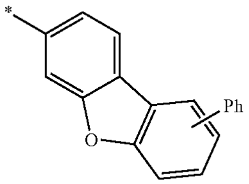
10-244
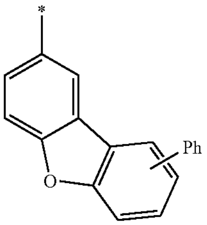
10-245
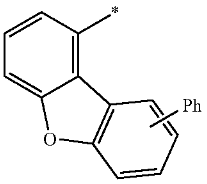

-continued
10-246
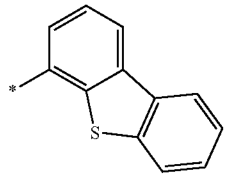
10-247
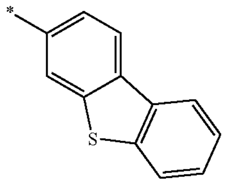
10-248
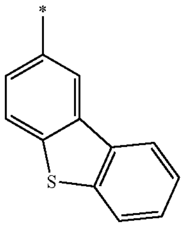
10-249
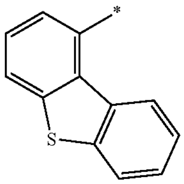
10-250
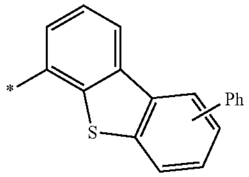
10-251
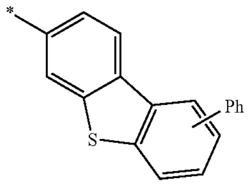
10-252
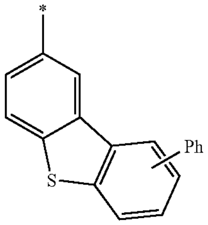
10-253
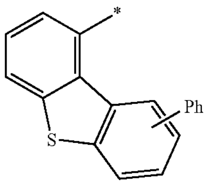
-continued
10-254
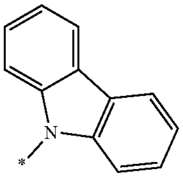
10-255
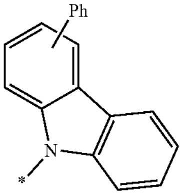
10-256
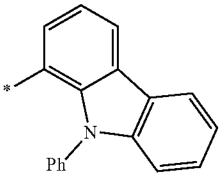
10-257
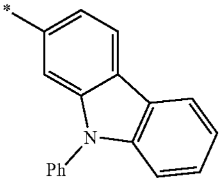
10-258
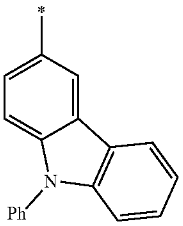
10-259
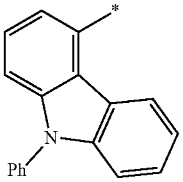
10-260
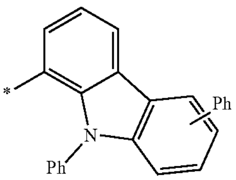
10-261
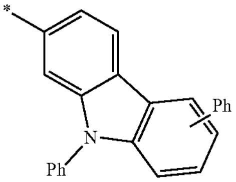

-continued
10-262
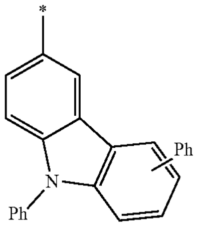
10-263
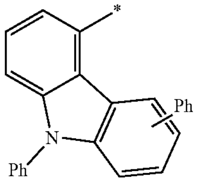
10-264
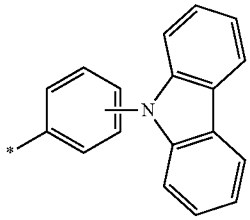
10-265
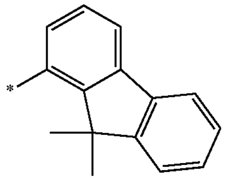
10-266
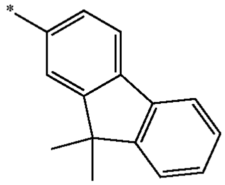
10-267
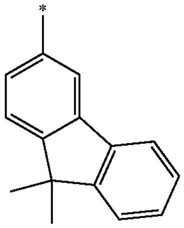
10-268
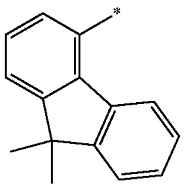
-continued
10-269
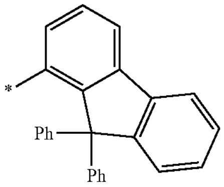
10-270
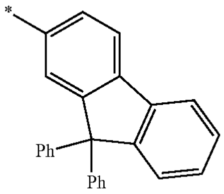
10-271
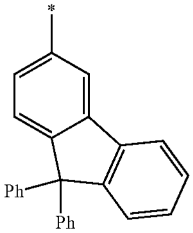
10-272
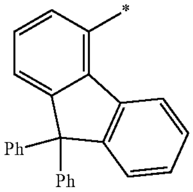
10-273
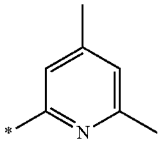
10-274
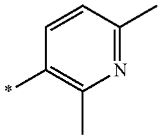
10-275
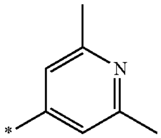
10-276
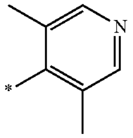
10-277
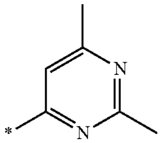

-continued
10-278
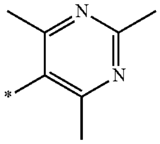
10-279
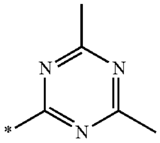
10-280
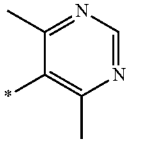
10-281
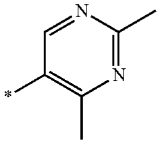
10-282
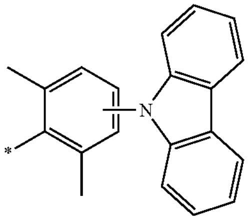
10-283
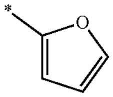
10-284
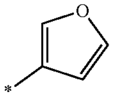
10-285
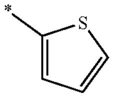
10-286
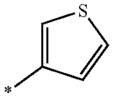
10-287
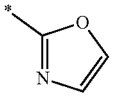
10-288
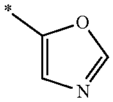
10-289
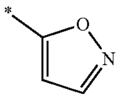
-continued
10-290
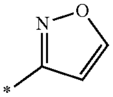
10-291
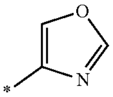
10-292
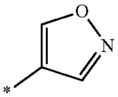
10-293
10-294
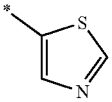
10-295
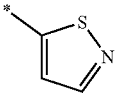
10-296
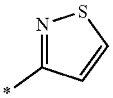
10-297
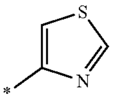
10-298
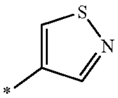
10-299
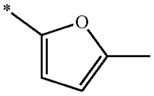
10-300
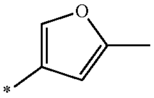
10-301
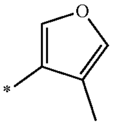
10-302
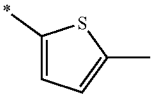
10-303
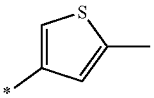

-continued
10-304
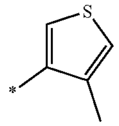
10-305
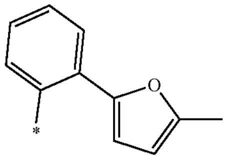
10-306
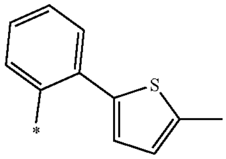
10-307
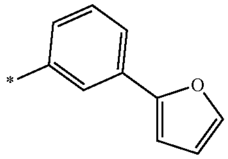
10-308
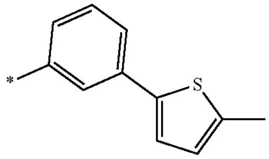
10-309
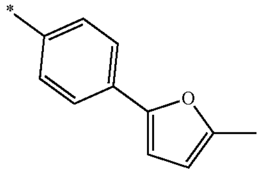
10-310
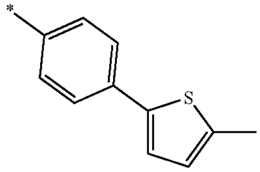
10-311
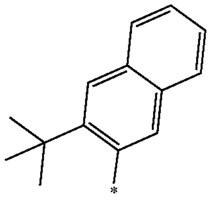
10-312
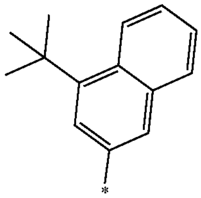
-continued
10-313
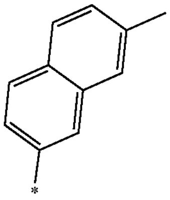
10-314
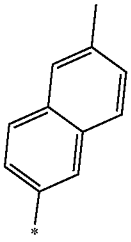
10-315
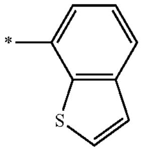
10-316
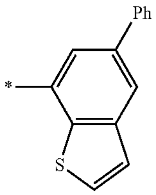
10-317
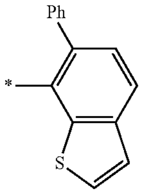
10-318
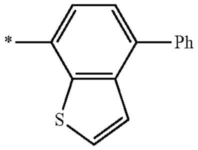
10-319
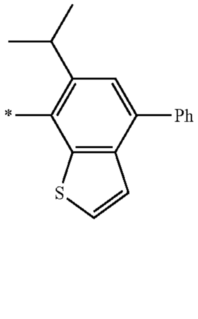

-continued
10-320
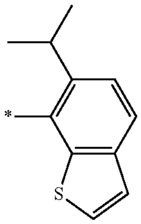
10-321
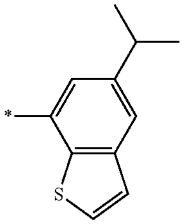
10-322
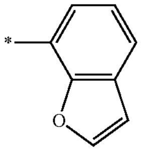
10-323
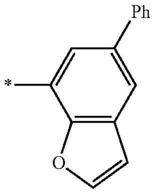
10-324
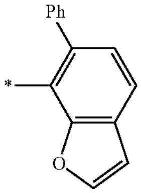
10-325
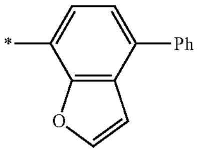
10-326
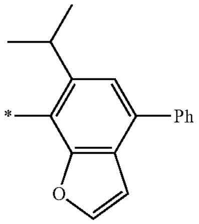
-continued
10-327
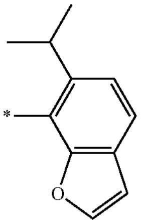
10-328
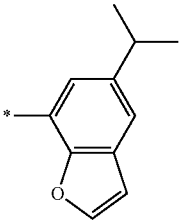
10-329
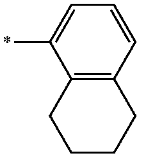
10-330
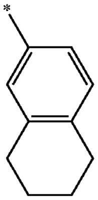
10-331
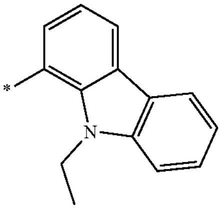
10-332
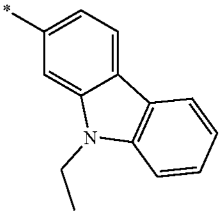
10-333
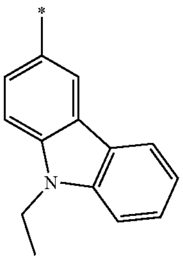

-continued
10-334
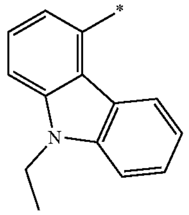
10-335
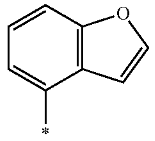
10-336
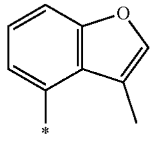
10-337
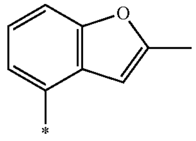
10-338
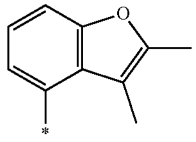
10-339
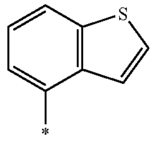
10-339
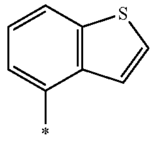
10-340
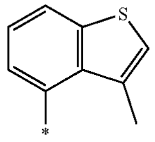
10-341
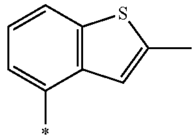
10-342
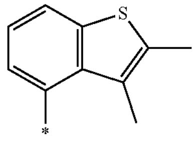
-continued
10-343
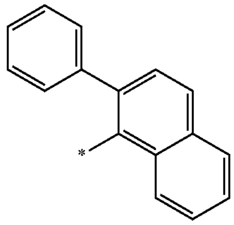
10-344
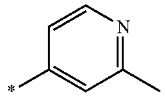
10-345
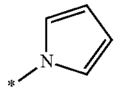
10-346
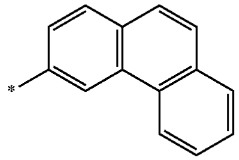
10-347
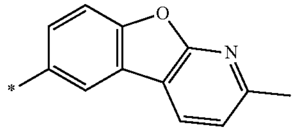
10-348
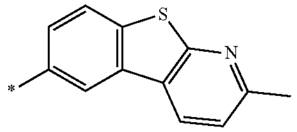
10-349
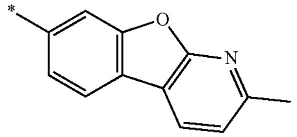
10-350
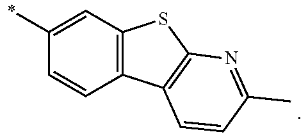
* in Formulae 9-1 to 9-61, 9-201 to 9-237, 10-1 to 10-129, and 10-201 to 10-350 indicates a binding site to a neighboring atom, Ph is a phenyl group, TMS is a trimethylsilyl group, and TMG is a trimethylgermyl group.
In Formula 1A, a1 and a2 may each independently be an integer from 1 to 10.
According to one or more embodiments, in Formula 1, $L_2$ may be a ligand re resented by Formula 1B:

Formula 1B

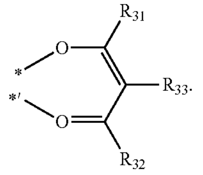

In Formula 1B, $R_{31}$ to $R_{33}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_6$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), and

* and *' may each indicate a binding site to a neighboring atom.

According to one or more embodiments, $R_{31}$ to $R_{33}$ may each independently be: hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one selected from among deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_7$-$C_{16}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, or an azadibenzosilolyl group, each unsubstituted or substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_7$-$C_{16}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)$_2$($Q_{31}$), and —P(=O)($Q_{31}$)($Q_{32}$); or —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), and $Q_1$ to $Q_3$ and $Q_{31}$ to $Q_{33}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with at least one selected from among deuterium, a $C_1$-$C_{10}$ alkyl group, a phenyl group, a biphenyl group, a pyridinyl group, a pyrimidinyl group, a pyridazinyl group, a pyrazinyl group, and a triazinyl group.

In one or more embodiments, $R_{31}$ to $R_{33}$ may each independently be:

hydrogen, deuterium, —F, —Cl, —Br, —I, —$CD_3$, —$CD_2H$, —$CDH_2$, —$CF_3$, —$CF_2H$, —$CFH_2$, a $C_1$-$C_{60}$ alkyl, a $C_2$-$C_{60}$ alkenyl group, a $C_2$-$C_{60}$ group, or a $C_1$-$C_{60}$ alkoxy group;

a group represented by one selected from Formulae 9-1 to 9-61, 9-201 to 9-237, 10-1 to 10-129, and 10-201 to 10-350; or

—N($Q_1$)($Q_2$).

For example, in some embodiments, $R_{33}$ may be hydrogen or deuterium.
According to one or more embodiments, the organometallic compound may be any one selected from Compounds 1 to 12:
1
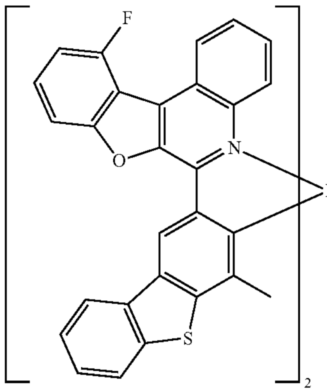
2
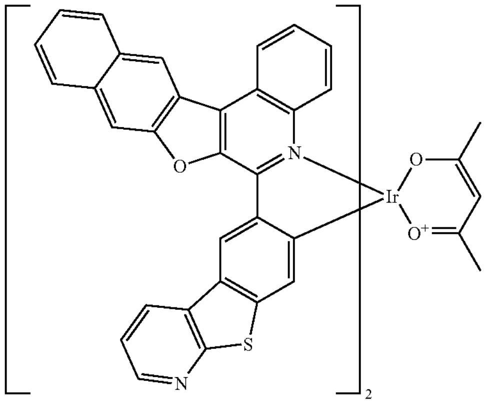
3
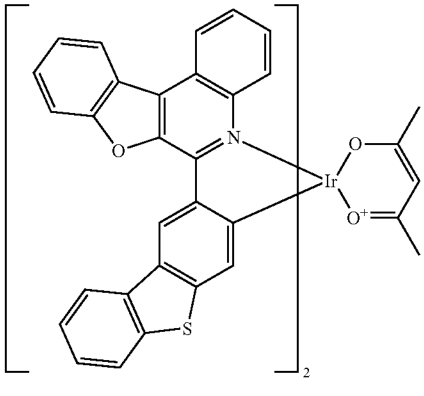
-continued
4
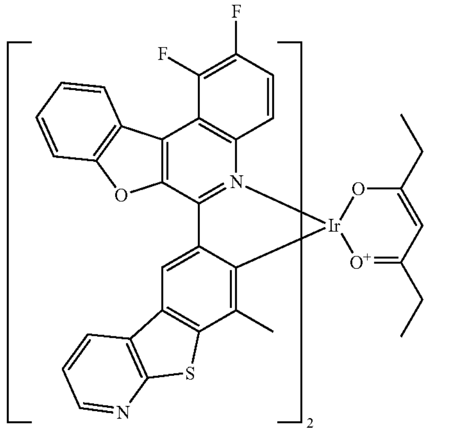
5
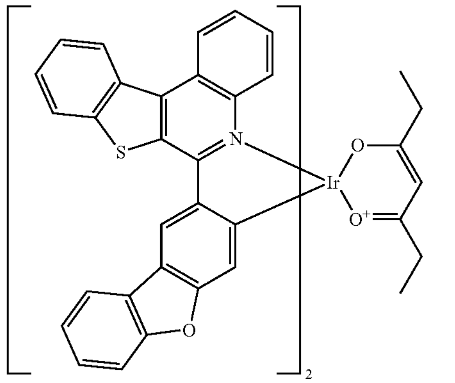
6
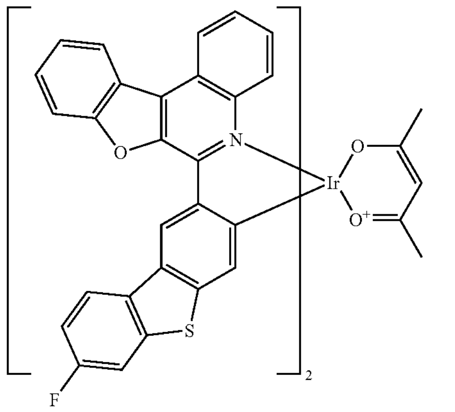
7
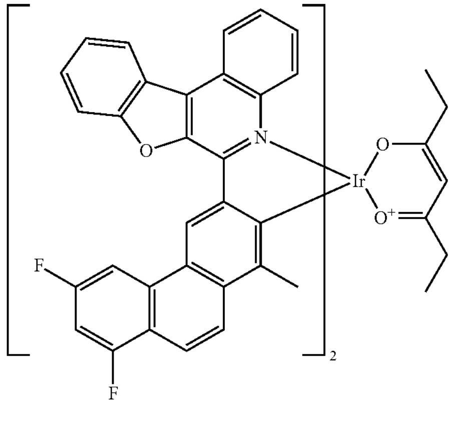

-continued

8

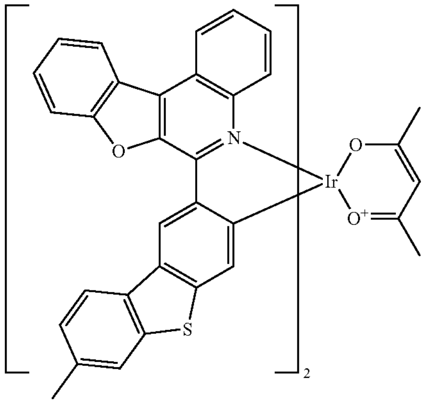

9

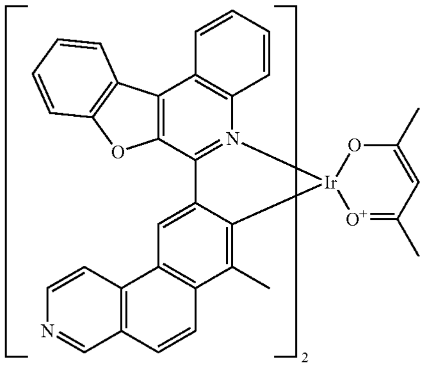

10

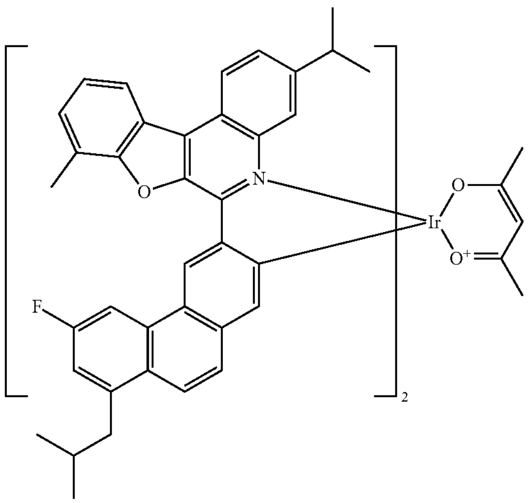

-continued

11

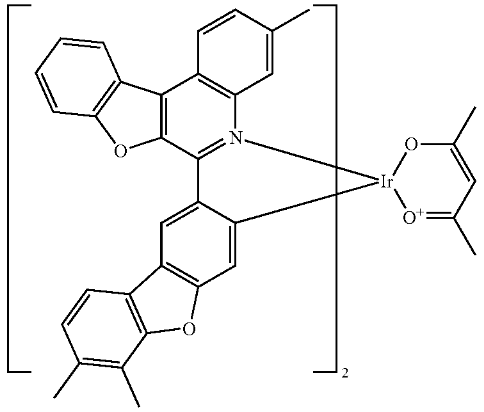

12

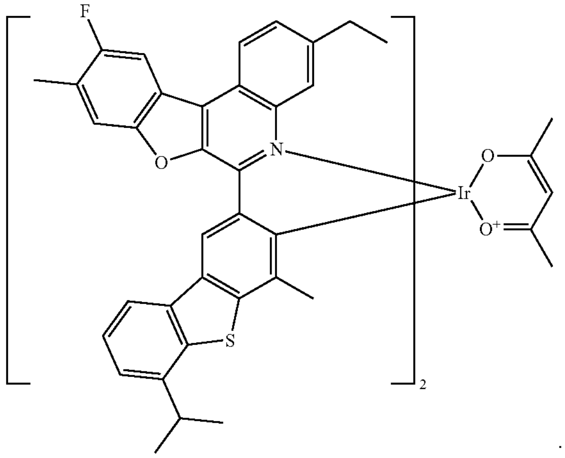

As the organometallic compound represented by Formula 1 includes a ligand represented by Formula 1A, the organometallic compound may provide excellent or suitable emission efficiency and color purity characteristics. Accordingly, a light-emitting device employing the organometallic compound represented by Formula 1 may also have excellent or suitable emission efficiency and color purity characteristics.

According to one or more embodiments, the organometallic compound may be to emit first light, a PL spectrum of the first light may include a first peak ($\lambda_1$), which is a peak having a highest intensity ($I_1$), and a second peak ($\lambda_2$), which is a peak having a second-highest intensity ($I_2$), and a wavelength in which the first peak is exhibited (a maximum emission wavelength or a maximum emission peak wavelength) may be 610 nm to 640 nm. For example, in some embodiments, the wavelength in which the first peak is exhibited may be 611 nm to 631 nm.

According to one or more embodiments, the organometallic compound may be to emit the first light, the PL spectrum of the first light may include the first peak ($\lambda_1$), which is a peak having a highest intensity ($I_1$), and the second peak ($\lambda_2$), which is a peak having a second-highest intensity ($I_2$), and a ratio of an intensity of the second peak to an intensity of the first peak ($I_2/I_1$) may be less than or equal to 0.2. For example, in some embodiments, the ratio of the intensity of the second peak to the intensity of the first peak ($I_2/I_1$) may be 0.1 to 0.2 or 0.136 to 0.160.

According to one or more embodiments, the reorganization energy of the organometallic compound may be less than or equal to 0.11 eV.

Synthesis methods of the organometallic compound represented by Formula 1 may be recognizable by one of ordinary skill in the art by referring to Synthesis Examples and/or Examples provided in the present disclosure.

According to one or more aspects of embodiments of the present disclosure, an organometallic compound may include a first metal and a first ligand, wherein the organometallic compound may be to emit first light, a PL spectrum of the first light may include a first peak ($\lambda_1$), which is a peak having a highest intensity ($I_1$), and a second peak ($\lambda_2$), which is a peak having a second-highest intensity ($I_2$), and Condition 1 and Condition 2 may be satisfied:

Condition 1 a wavelength in which the first peak is exhibited is 610 nm to 640 nm; and

Condition 2 a ratio of an intensity of the second peak to an intensity of the first peak ($I_2/I_1$) is 0.1 to 0.2.

When the first peak of the first light emitted by the organometallic compound is exhibited in the wavelength from 610 nm to 640 nm, and the ratio of the intensity of the first peak to the intensity of the second peak of the first light ($I_2/I_1$) is 0.1 to 0.2, the organometallic compound may have high color purity, and due to less electron vibronic coupling, non-radiative decay may be reduced, which leads to excellent or suitable emission efficiency and color purity characteristics.

Accordingly, a light-emitting device employing the organometallic compound may have excellent or suitable front (0°) emission efficiency and color purity characteristics, and by utilizing such light-emitting device, high-quality electronic apparatuses may be manufactured.

According to one or more embodiments, the reorganization energy of the organometallic compound may be less than or equal to 0.11 eV. When such a range is satisfied, the structural change due to excitation may be reduced, which leads to a small (e.g., narrow) full width at half maximum (FWHM). Moreover, less electron vibronic coupling may result in reduction of non-radiative decay, thereby facilitating provision of excellent or suitable emission efficiency and color purity characteristics.

The first metal may be iridium (Ir), platinum (Pt), osmium (Os), titanium (Ti), zirconium (Zr), hafnium (Hf), europium (Eu), terbium (Tb), thulium (Tm), or rhodium (Rh).

For example, in some embodiments, the first metal may be iridium (Ir).

The first ligand may be a bidentate ligand bonded to the first metal.

According to one or more embodiments, the first ligand may include a first ring and a second ring which are directly bonded to the first metal, and the first ring and the second ring may each independently be a $C_5$-$C_{60}$ carbocyclic group or a $C_1$-$C_{60}$ heterocyclic group.

According to one or more embodiments, the first ring and the second ring may each be a polycyclic group in which two or more cyclic groups are condensed with each other.

According to one or more embodiments, the first ring may be a polycyclic group in which four or more cyclic groups are condensed with each other.

According to one or more embodiments, the first ring may include at least one 5-membered ring.

According to one or more embodiments, a 5-membered ring of the first ring may include at least one heteroatom, for example, oxygen (O), sulfur (S) atom, etc.

For example, in some embodiments, the first ring may be a polycyclic group in which three or four 6-membered rings and one 5-membered ring are condensed with each other.

According to one or more embodiments, the first ring may include at least one nitrogen (N), and the nitrogen (N) may be directly bonded to the first metal. For example, in some embodiments, the first ring may include a pyridine group, and nitrogen (N) of the pyridine group may be bonded to the first metal through a coordination bond.

According to one or more embodiments, carbon (C) of the first ring may be directly bonded to carbon (C) of the second ring.

According to one or more embodiments, the second ring may be a polycyclic group in which three or more cyclic groups are condensed with each other.

For example, in some embodiments, the second ring may be i) a polycyclic group in which two 6-membered rings and one 5-membered ring are condensed with each other, or ii) a polycyclic group in which three 6-membered rings are condensed with each other.

According to one or more embodiments, one carbon (C) of the second ring may be directly bonded to the first metal.

According to one or more embodiments, the organometallic compound including the first metal and the first ligand may further include a second ligand, and the second ligand may be a bidentate ligand bonded to the first metal.

According to one or more embodiments, the second ligand may include at least one oxygen (O). For example, in some embodiments, the second ligand may include two or more oxygens (O).

According to one or more embodiments, oxygen of the second ligand may be directly bonded to the first metal.

According to one or more embodiments, the second ligand may not include (e.g., may exclude) a ring directly bonded to the first metal.

According to one or more embodiments, the organometallic compound including the first metal and the first ligand may further include a second ligand and a third ligand, and the second ligand and the third ligand may be a bidentate ligand bonded to the first metal.

For example, in some embodiments, the second ligand and the third ligand may be identical to each other.

For example, in some embodiments, the second ligand and the third ligand may be different from each other.

According to one or more embodiments, the organometallic compound including the first metal and the first ligand may include at least one substituent $R_x$.

According to one or more embodiments, the first ligand, the second ligand, and the third ligand may each independently include at least one substituent $R_x$. For example, in some embodiments, the first ring and the second ring of the first ligand may each independently include at least one substituent $R_x$.

According to one or more embodiments, $R_x$ may be:

deuterium, —F, a cyano group, or a $C_1$-$C_{20}$ alkyl group;

a $C_1$-$C_{20}$ alkyl group or a $C_3$-$C_{10}$ cycloalkyl group, each substituted with deuterium, —F, a cyano group, or any combination thereof; or a $C_3$-$C_{60}$ carbocyclic group or a $C_1$-$C_{60}$ heterocyclic group, each substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a deuterated phenyl group, a fluorinated phenyl group, a ($C_1$-$C_{20}$ alkyl)phenyl group, a deuterated biphenyl group, a fluorinated biphenyl group, or any combination thereof.

According to one or more embodiments, the organometallic compound may include at least one deuterium, —F, a cyano group, or a $C_1$-$C_{20}$ alkyl group.

According to one or more embodiments, the first ligand, the second ligand, and the third ligand may each independently include deuterium, —F, a cyano group, or a $C_1$-$C_{20}$ alkyl group.

According to one or more aspects of embodiments of the present disclosure, a light-emitting device (e.g., an organic light-emitting device) including: a first electrode; a second electrode facing the first electrode; an interlayer between the first electrode and the second electrode and including an emission layer; and the organometallic compound described above, is provided.

According to one or more embodiments, the first electrode of the organic light-emitting device may be an anode, the second electrode of the organic light-emitting device may be a cathode, the interlayer may further include a hole transport region between the first electrode and the emission layer and an electron transport region between the emission layer and the second electrode, the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

According to one or more embodiments, the organometallic compound of the present disclosure may be included between a pair of electrodes of the light-emitting device. Accordingly, the organometallic compound may be included in the interlayer of the light-emitting device, for example, in the emission layer of the interlayer.

According to one or more embodiments, the interlayer may include an emission layer, the emission layer may include the organometallic compound and a host, and in terms of weight, a content (e.g., amount) of the host in the emission layer may be greater than a content (e.g., amount) of the organometallic compound in the emission layer. For example, in some embodiments, the amount of the organometallic compound may be greater than or equal to 5 parts by weight and/or less than or equal to 15 parts by weight, based on the total weight of 100 parts by weight of the emission layer.

According to one or more embodiments, the emission layer of the light-emitting device may include a dopant and a host, and the dopant may include the organometallic compound. For example, the organometallic compound may act as a dopant. In some embodiments, the emission layer may be to emit red light.

According to one or more embodiments, the emission layer may be to emit light having a CIE(x) value greater than or equal to 0.67.

According to one or more embodiments, the emission layer may be to emit light having a full width at half maximum (FWHM) of an emission spectrum from 40 nm to 47 nm.

According to one or more embodiments, the light-emitting device may further include at least one selected from a first capping layer located outside the first electrode and a second capping layer located outside the second electrode, and at least one selected from the first capping layer and the second capping layer may include the organometallic compound. More details for the first capping layer and/or second capping layer are as described in the specification.

According to one or more embodiments, the light-emitting device may include: a first capping layer located outside the first electrode and including the organometallic compound; a second capping layer located outside the second electrode and including the organometallic compound; or the first capping layer and the second capping layer.

The expression "(an interlayer) includes/including an organometallic compound" utilized herein may include an embodiment in which "(an interlayer) includes/including identical organometallic compounds represented by Formula 1" and/or an embodiment in which "(an interlayer) includes two or more different organometallic compounds represented by Formula 1."

In one or more embodiments, the interlayer may include, as the organometallic compound, only Compound 1. In this regard, Compound 1 may be present in the emission layer of the light-emitting device. In one or more embodiments, the interlayer may include, as the organometallic compound, Compound 1 and Compound 2. In this regard, Compound 1 and Compound 2 may be present in substantially the same layer (for example, all of Compound 1 and Compound 2 may be present in the emission layer), or may be present in different layers (for example, Compound 1 may be present in the emission layer, and Compound 2 may be present in the electron transport region).

The term "interlayer" as utilized herein may refer to a single layer and/or all of a plurality of layers between the first electrode and the second electrode of the light-emitting device.

According to one or more aspects of embodiments of the present disclosure, an electronic apparatus including the organic light-emitting device is provided. The electronic apparatus may further include a thin-film transistor. For example, the electronic apparatus may further include a thin-film transistor including a source electrode and a drain electrode, wherein the first electrode of the light-emitting device may be electrically connected to the source electrode or the drain electrode. In some embodiments, the electronic apparatus may further include a color filter, a color conversion layer, a touch screen layer, a polarizing layer, or any combination thereof. For more details on the electronic apparatus, related descriptions provided herein may be referred to.

According to one or more aspects of embodiments of the present disclosure, an electronic apparatus including the organic light-emitting device is provided.

For example, the electronic apparatus may be a flat panel display, a curved display, a computer monitor, a medical monitor, a TV, a billboard, indoor or outdoor illuminations and/or signal light, a head-up display, a fully or partially transparent display, a flexible display, a rollable display, a foldable display, a stretchable display, a laser printer, a phone, a cell phone, a tablet, a phablet, a personal digital assistant (PDA), a wearable device, laptop computers, digital cameras, camcorders, viewfinders, micro displays, 3D displays, virtual or augmented reality displays, vehicles, a video wall including multiple displays tiled together, a theater or stadium screen, a phototherapy device, or a signage.

Description of FIG. 1

FIG. 1 is a schematic cross-sectional view of an organic light-emitting device 10 according to one or more embodiments of the present disclosure. The organic light-emitting device 10 may include a first electrode 110, an interlayer 130, and a second electrode 150.

Hereinafter, the structure of the organic light-emitting device 10 according to one or more embodiments and a method of manufacturing the organic light-emitting device 10 will be described with reference to FIG. 1.

First Electrode 110

In FIG. 1, in some embodiments, a substrate may be additionally provided and located under the first electrode 110 or on the second electrode 150. As the substrate, a glass substrate or a plastic substrate may be utilized. In one or more embodiments, the substrate may be a flexible substrate, and may include plastics with excellent or suitable heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. In one or more embodiments, when the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure including (e.g., consisting of) a single layer or a multi-layered structure including a plurality of layers. For example, in one or more embodiments, the first electrode 110 may have a three-layered structure of ITO/Ag/ITO.

Interlayer 130

The interlayer 130 may be on the first electrode 110. The interlayer 130 may include an emission layer.

In one or more embodiments, the interlayer 130 may further include a hole transport region located between the first electrode 110 and the emission layer, and an electron transport region located between the emission layer and the second electrode 150.

In one or more embodiments, the interlayer 130 may further include, in addition to one or more suitable organic materials, a metal-containing compound such as an organometallic compound, an inorganic material such as quantum dots, and/or the like.

In one or more embodiments, the interlayer 130 may include, i) two or more emitting units sequentially stacked between the first electrode 110 and the second electrode 150, and ii) a charge generation layer located between the two or more emitting units. When the interlayer 130 includes emitting units and a charge generation layer as described above, the light-emitting device 10 may be a tandem light-emitting device.

Hole Transport Region in Interlayer 130

The hole transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron-blocking layer, or any combination thereof.

For example, in some embodiments, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron-blocking layer structure, the layers of each structure being stacked sequentially from the first electrode 110 in the stated order.

The hole transport region may include a compound represented by Formula 201, a compound represented by Formula 202, or any combination thereof:

Formula 201

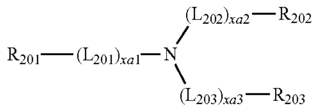

Formula 202

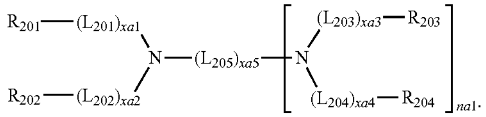

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one selected from groups represented by Formulae CY201 to CY217:

-continued

CY201

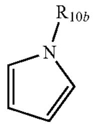

CY202

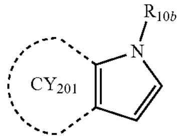

CY203

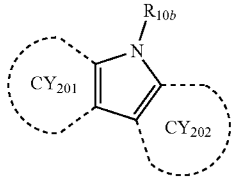

CY204

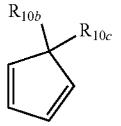

CY205

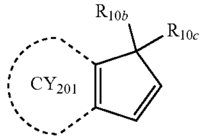

CY206

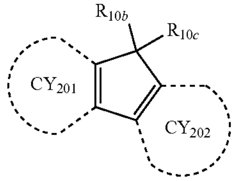

CY207

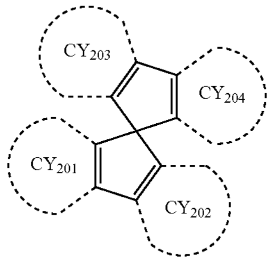

CY208

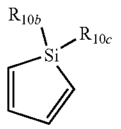

CY209

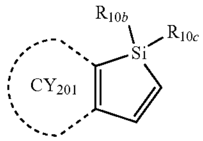

CY210

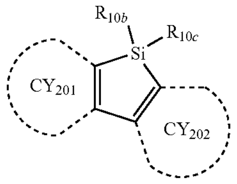

CY211

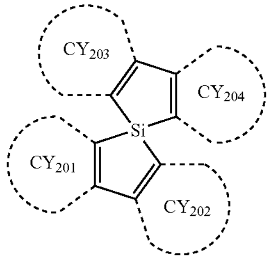

CY212

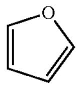

CY213

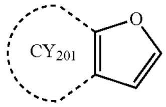

CY214

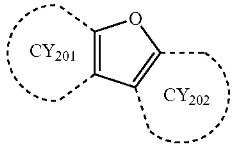

CY215

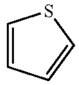

CY216

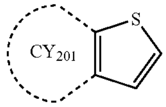

CY217

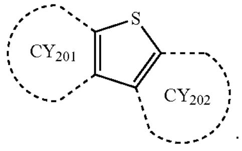

.

In Formulae CY201 to CY217, $R_{10b}$ and $R_{10c}$ may each be the same as described with respect to $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described above.

In one or more embodiments, ring $CY_{201}$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one selected from groups represented by Formulae CY201 to CY203.

In one or more embodiments, Formula 201 may include at least one selected from the groups represented by Formulae CY201 to CY203 and at least one selected from the groups represented by Formulae CY204 to CY217.

In one or more embodiments, in Formula 201, xa1 may be 1, $R_{201}$ may be a group represented by one selected from Formulae CY201 to CY203, xa2 may be 0, and $R_{202}$ may be a group represented by one selected from Formulae CY204 to CY207.

In one or more embodiments, each of Formulae 201 and 202 may not include (e.g., may exclude) a group represented by one selected from Formulae CY201 to CY203.

In one or more embodiments, each of Formulae 201 and 202 may not include (e.g., may exclude) a group represented by one selected from Formulae CY201 to CY203, and may include at least one selected from the groups represented by Formulae CY204 to CY217.

In one or more embodiments, each of Formulae 201 and 202 may not include (e.g., may exclude) a group represented by one selected from Formulae CY201 to CY217.

In one or more embodiments, the hole transport region may include at least one selected from Compounds HT1 to HT46, 4,4',4"-[tris(3-methylphenyl)phenylamino]triphenylamine (m-MTDATA), 4,4',4"-tris(N,N-diphenylamino) triphenylamine (TDATA), 4,4',4"-tris[N-(2-naphthyl)-N-phenylamino]-triphenylamine (2-TNATA), N,N'-di(1-naphthalene-1-yl)-N,N'-diphenyl-benzidine (NPB(NPD)), β-NPB, N,N'-bis(3-methylphenyl)-N,N'-diphenyl-[1,1'-biphenyl]-4,4'-diamine (TPD), Spiro-TPD, Spiro-NPB, methylated NPB, 4,4'-cyclohexylidene bis[N,N-bis(4-methylphenyl)benzenamine](TAPC), 4,4'-bis[N,N'-(3-tolyl)amino]-3,3'-dimethylbiphenyl (HMTPD), 4,4',4"-tris(N-carbazolyl) triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), and/or any combination thereof:

HT1

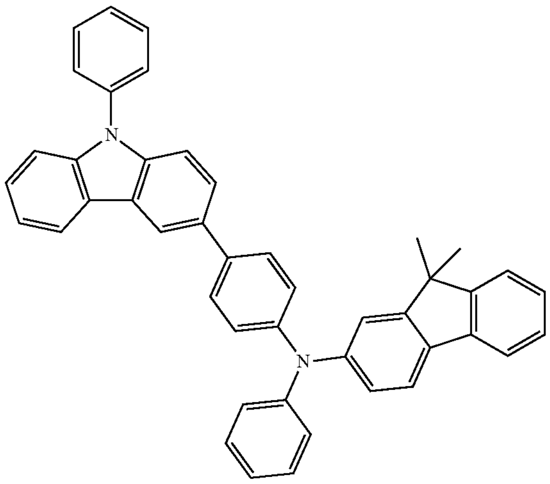

HT2

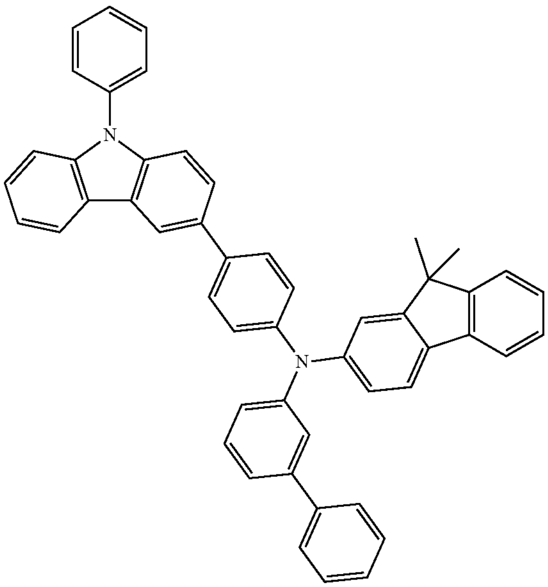

HT3

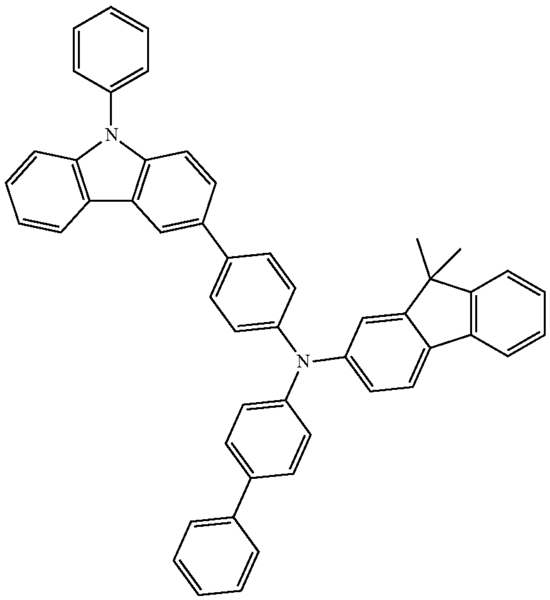

HT4

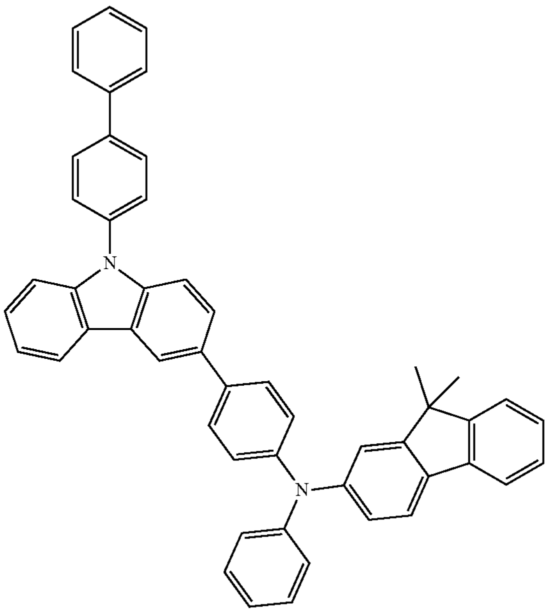

-continued
HT5
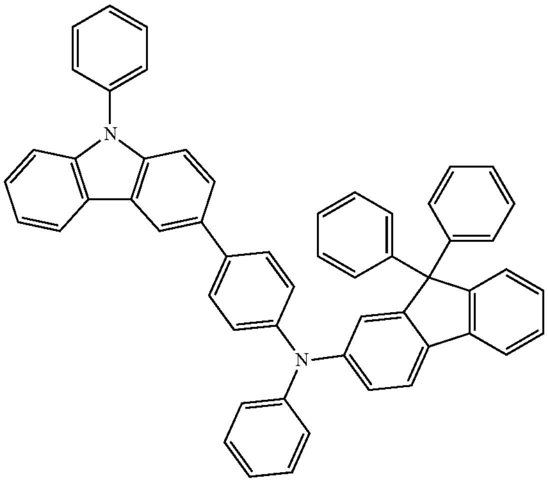
HT6
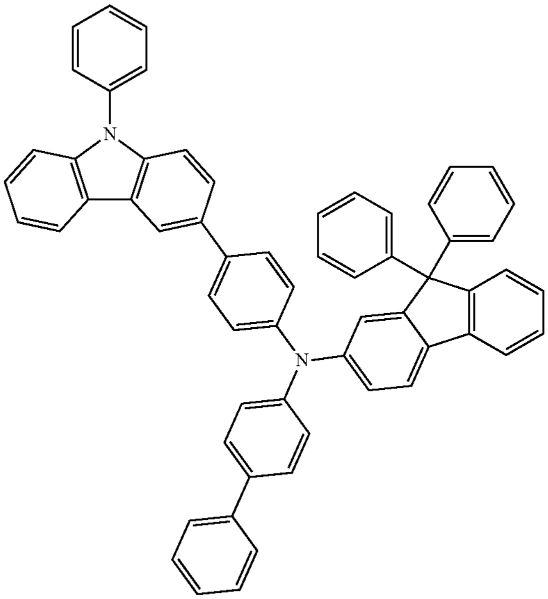
HT7
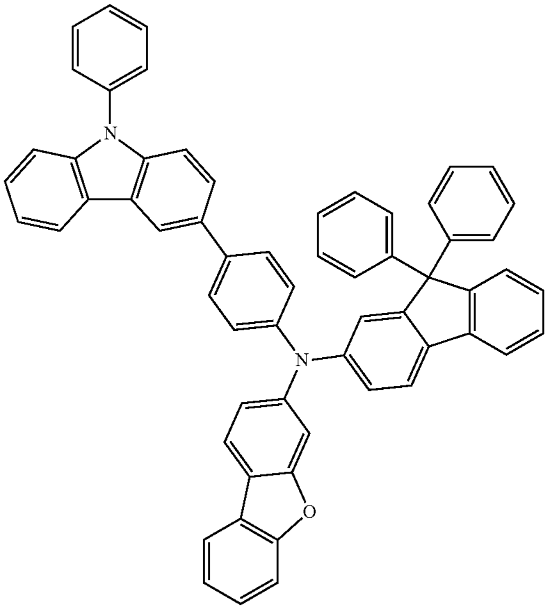
HT8
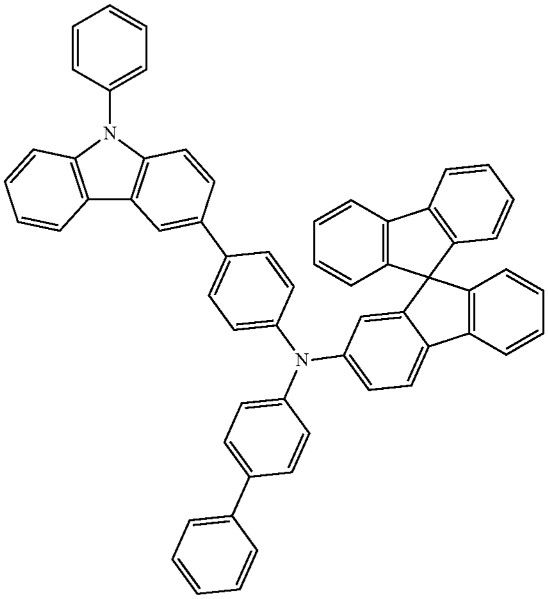

-continued
HT9
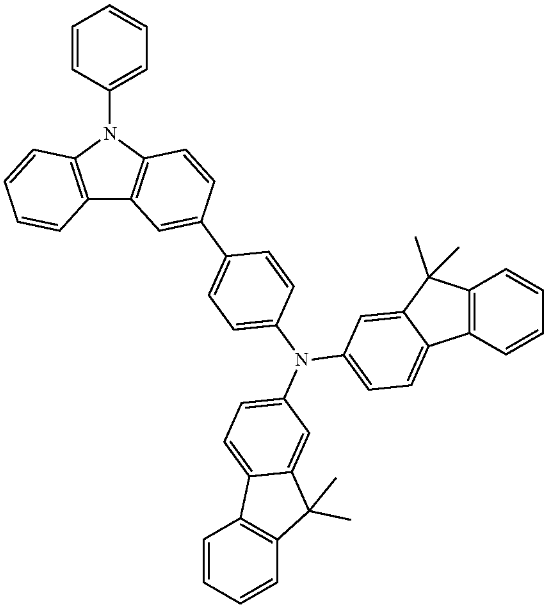
HT10
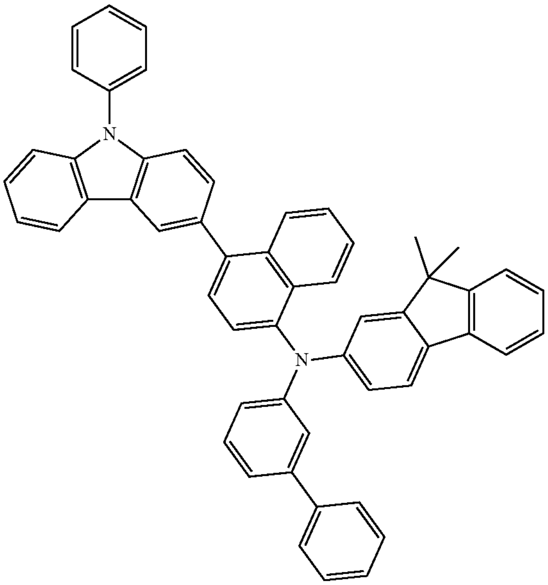
HT11
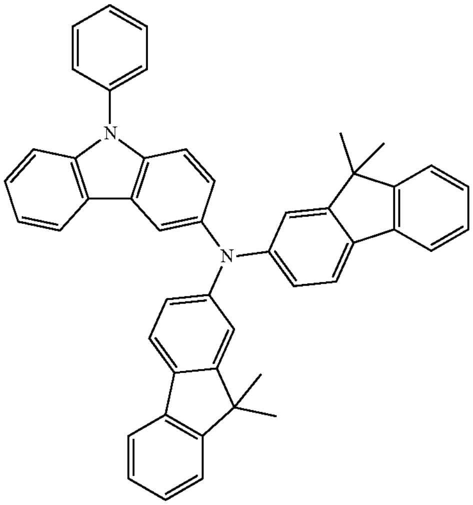
HT12
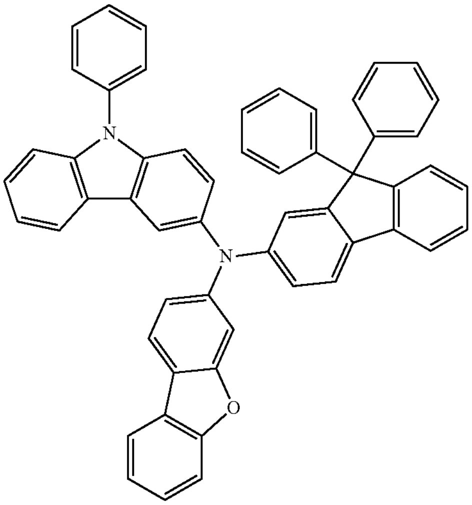

-continued
HT13
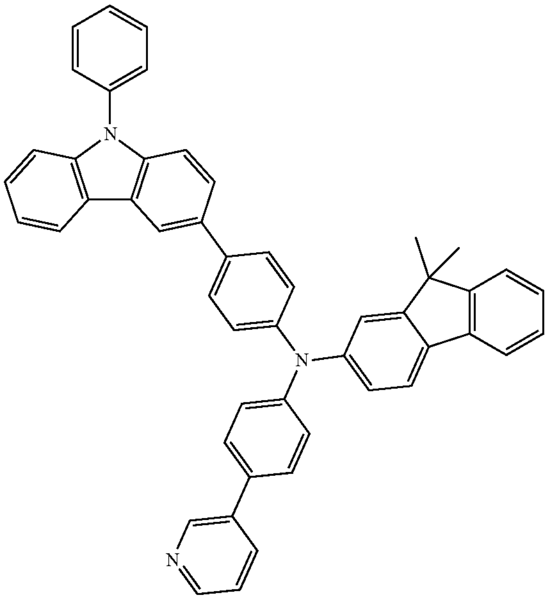
HT14
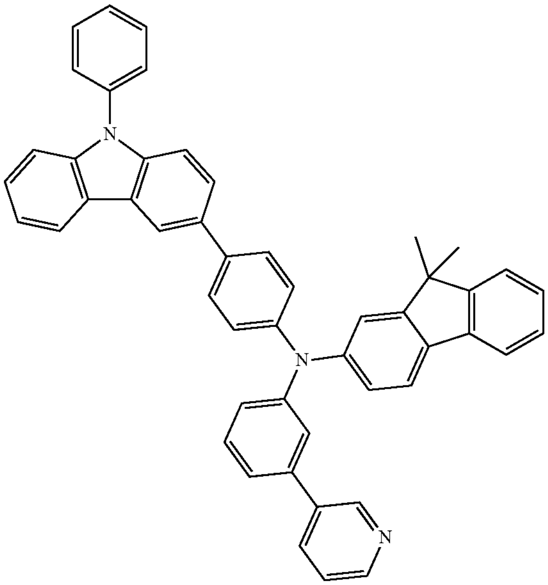
HT15
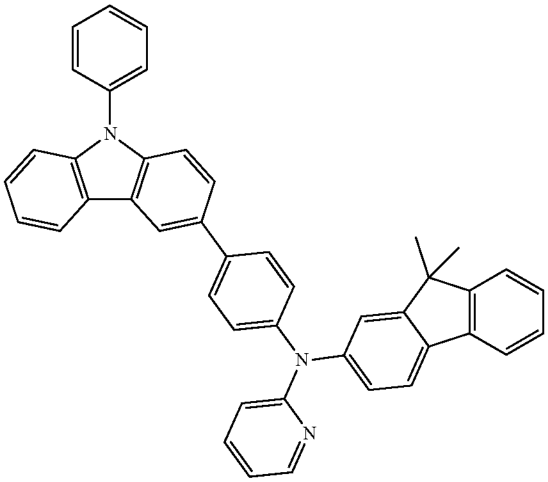
HT16
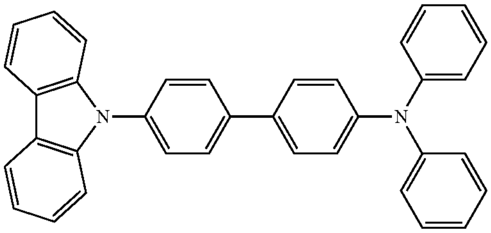
HT17
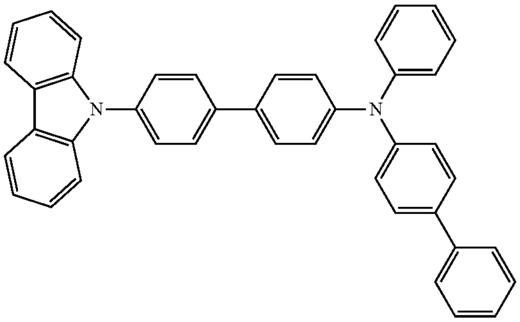
HT18
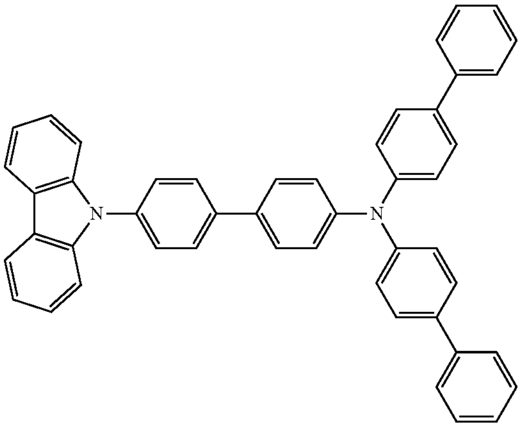

-continued
HT19
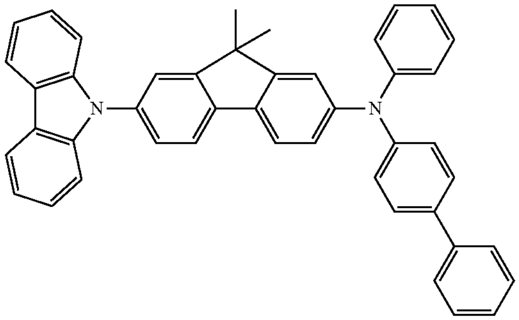
HT20
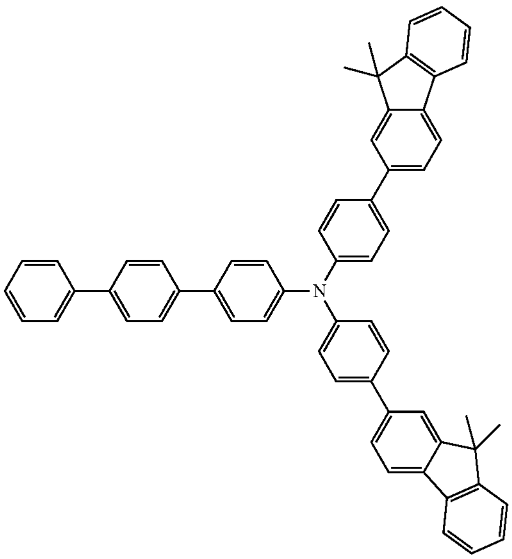
HT21
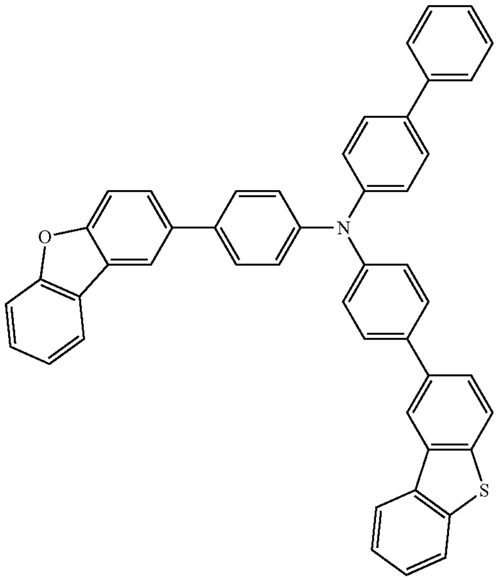
HT22
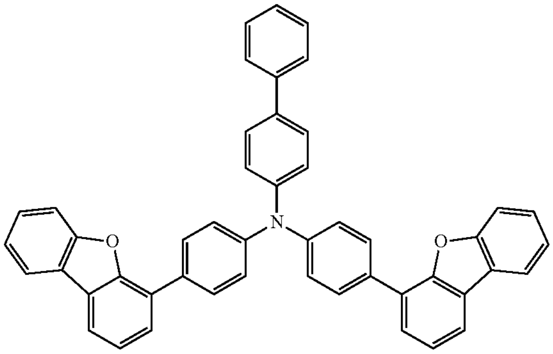
HT23
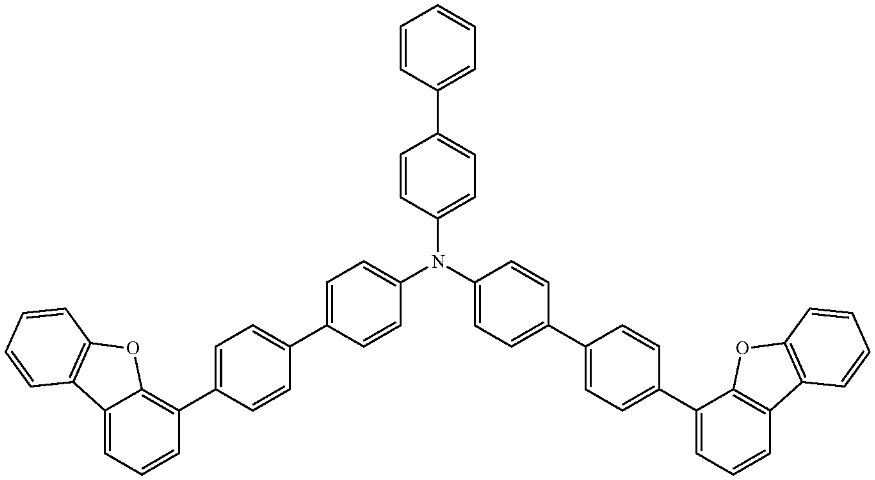

-continued
HT24
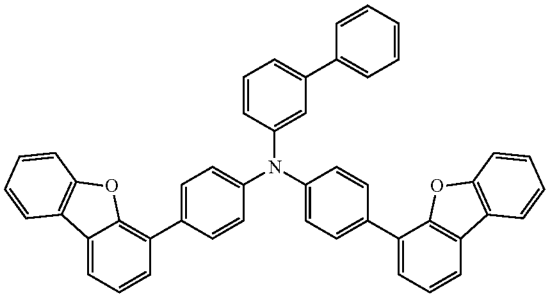
HT25
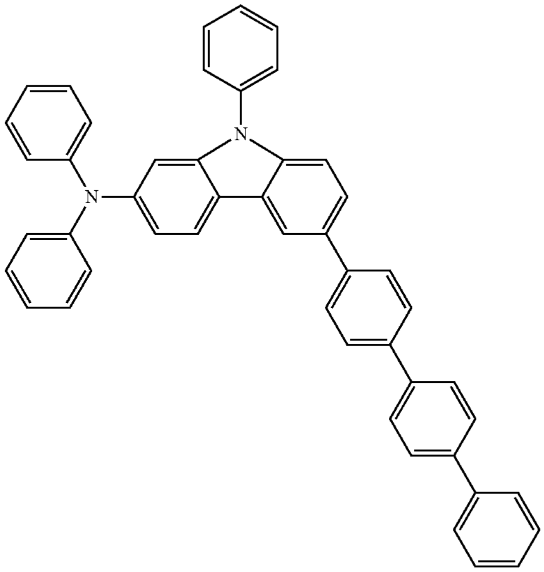
HT26
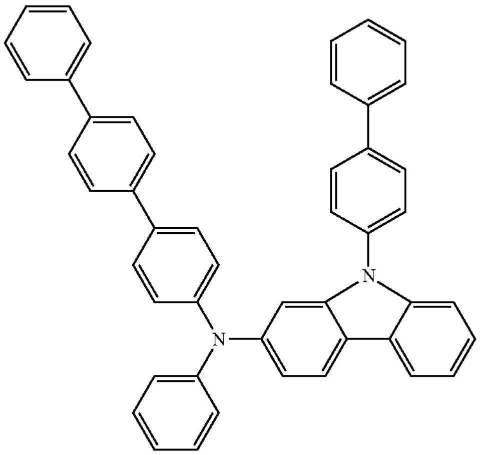
HT27
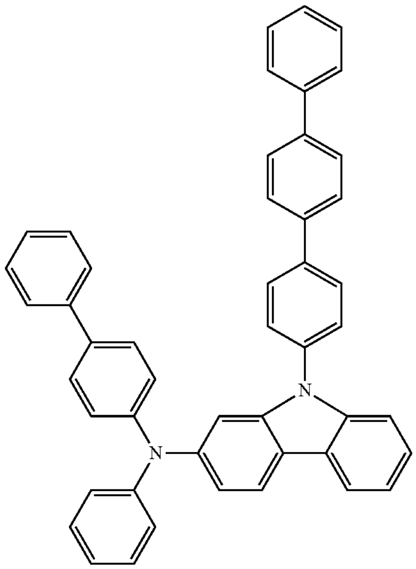
HT28
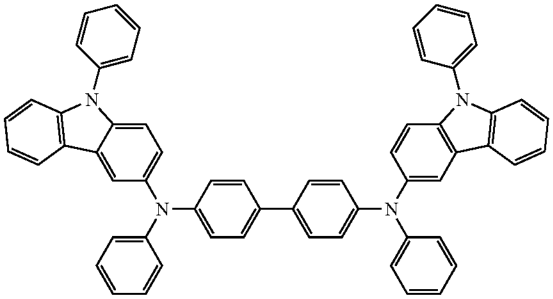
HT29
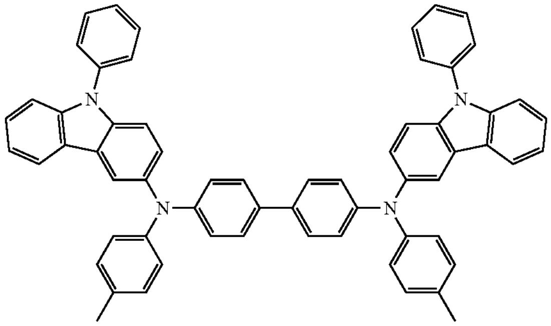

-continued
HT30
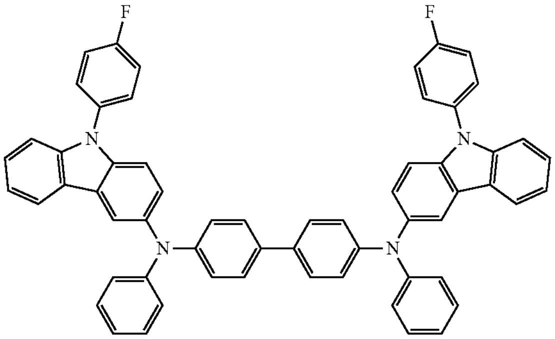
HT31
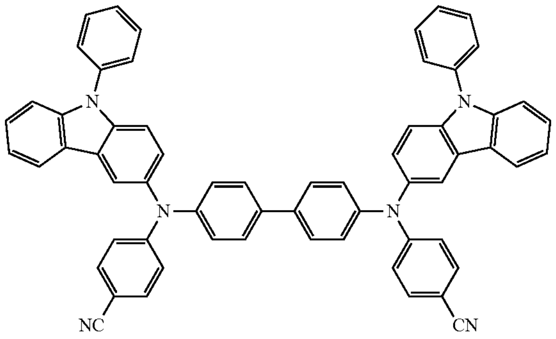
HT32
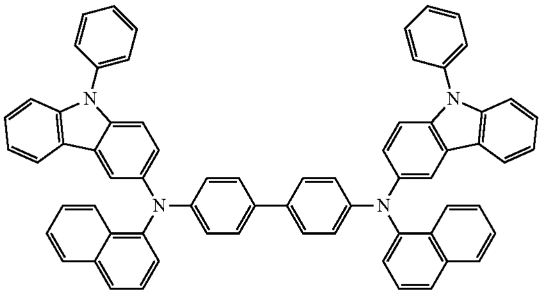
HT33
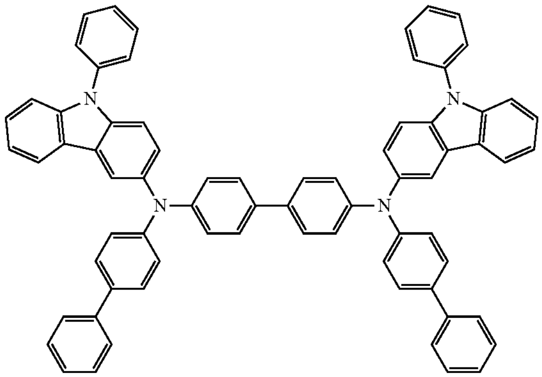
HT34
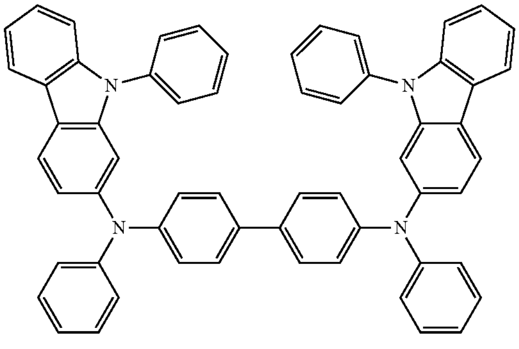
HT35
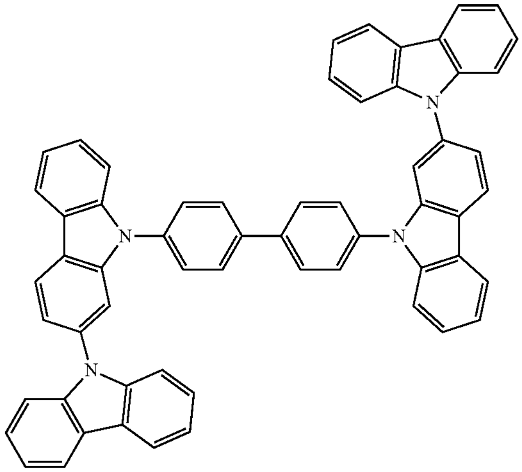

-continued
HT36
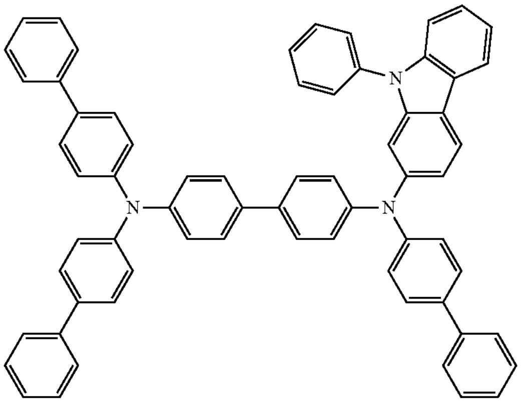
HT37
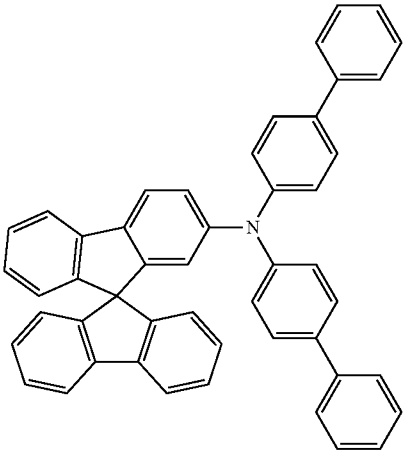
HT38
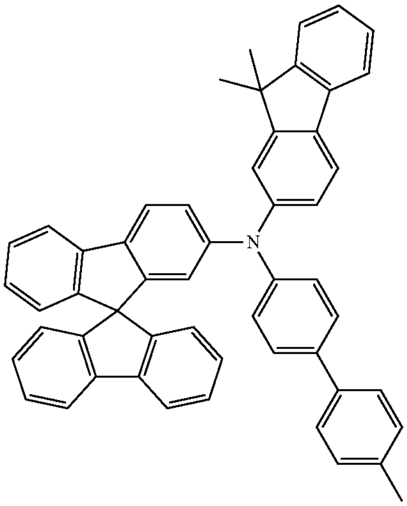
HT39
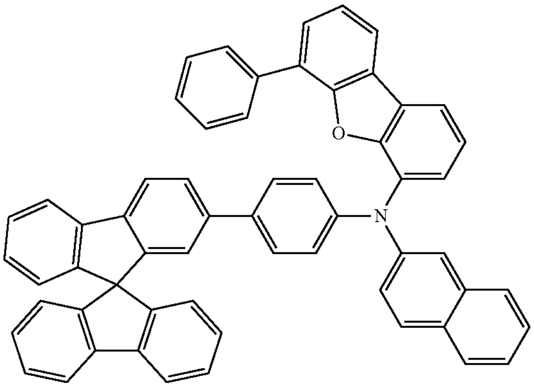
HT40
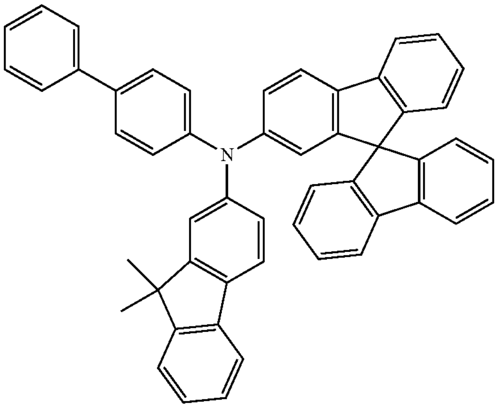
HT41
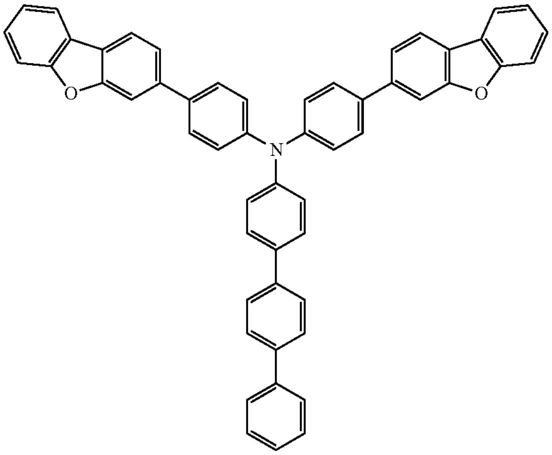

-continued
HT42
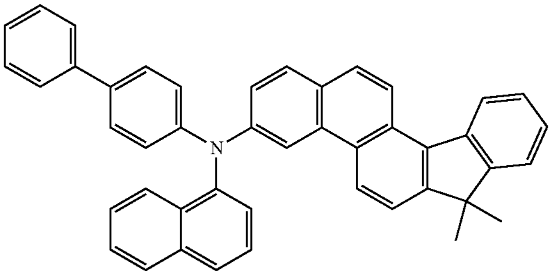
HT43
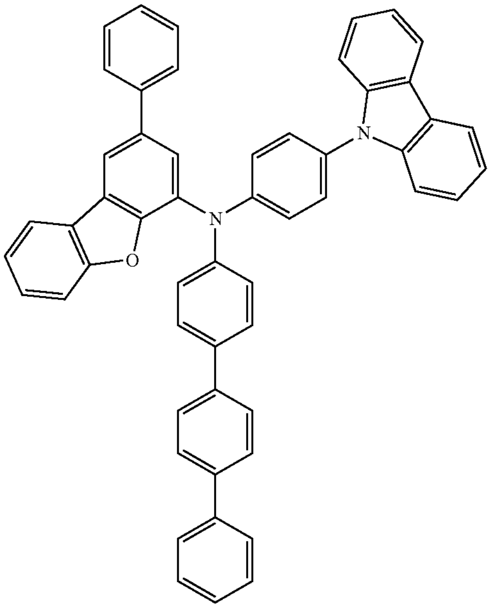
HT44
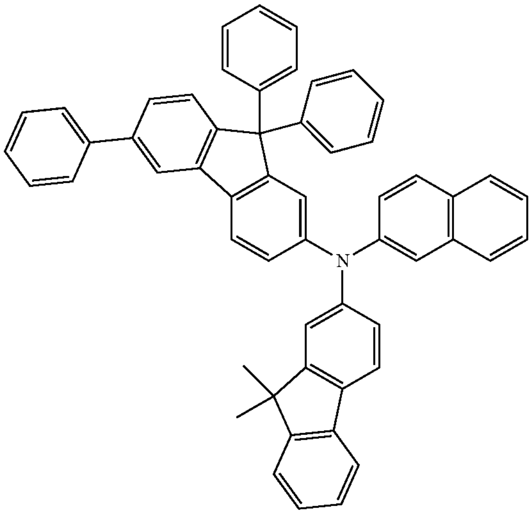
HT45
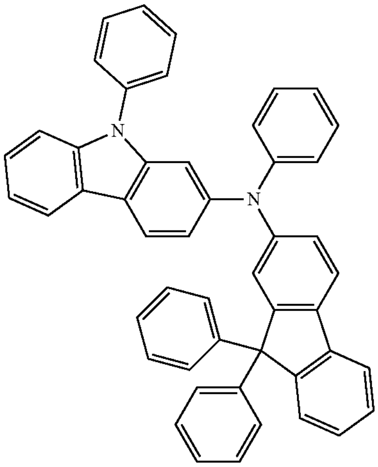

-continued
HT46
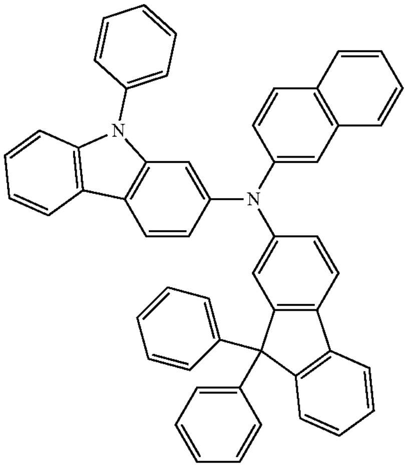
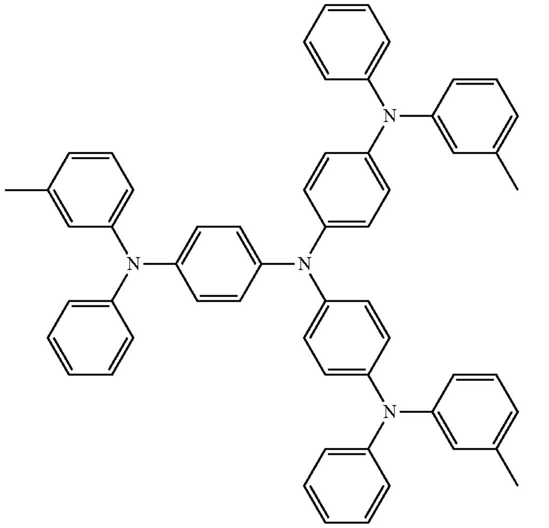
m-MTDATA
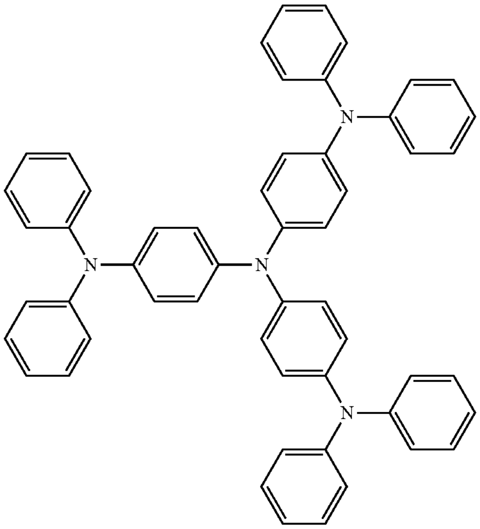
TDATA
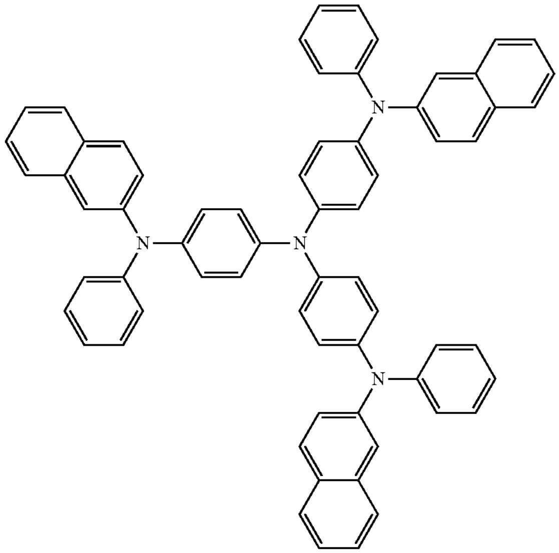
2-TNATA
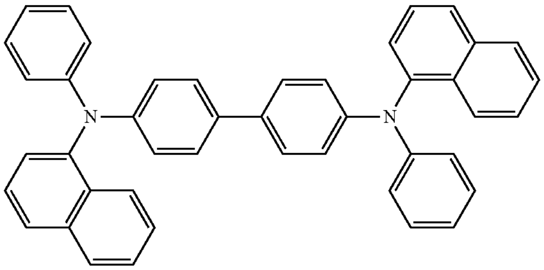
NPB
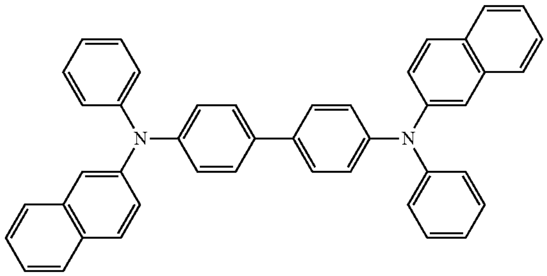
β-NPB -continued

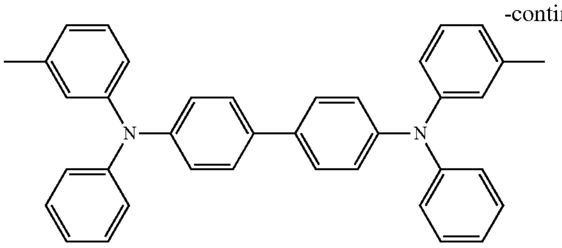

TPD

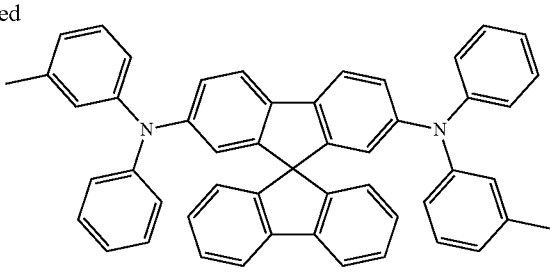

Spiro-TPD

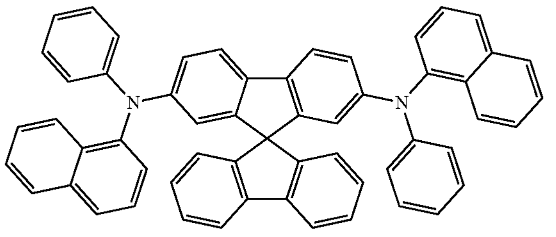

Spiro-NPB

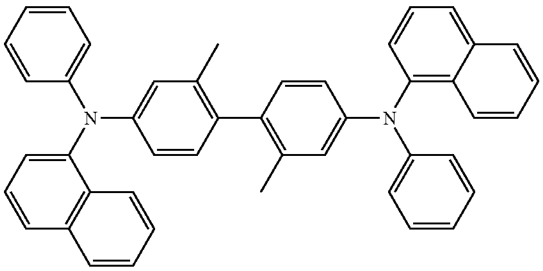

methylated-NPB

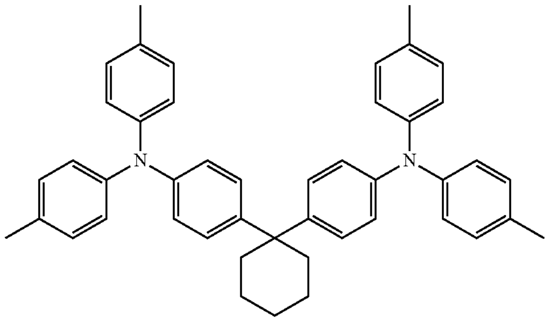

TAPC

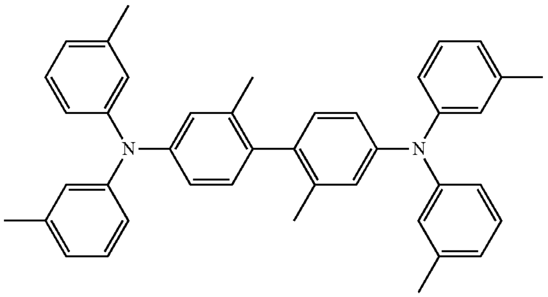

HMTPD

.

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron-blocking layer may block or reduce the leakage of electrons from an emission layer to a hole transport region. Materials that may be included in the hole transport region may be included in the emission auxiliary layer and the electron-blocking layer.

p-Dopant

In one or more embodiments, the hole transport region may further include, in addition to these materials, a charge-generation material for the improvement of conductive properties. The charge-generation material may be uniformly or non-uniformly dispersed in the hole transport region (for example, in the form of a single layer including (e.g., consisting) of a charge-generation material).

The charge-generation material may be, for example, a p-dopant.

For example, the lowest unoccupied molecular orbital (LUMO) energy level of the p-dopant may be −3.5 eV or less.

In one or more embodiments, the p-dopant may include a quinone derivative, a cyano group-containing compound, a compound including element EL1 and element EL2, or any combination thereof.

Non-limiting examples of the quinone derivative may include (e.g., may be) tetracyanoquinodimethane (TCNQ), 2,3,5,6-tetrafluoro-7,7,8,8-tetracyanoquinodimethane (F4-TCNQ), etc.

Non-limiting examples of the cyano group-containing compound may include (e.g., may be) dipyrazino[2,3-f: 2',3'-h] quinoxaline-2,3,6,7,10,11-hexacarbonitrile (HAT-CN), and a compound represented by Formula 221:

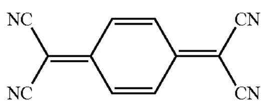

TCNQ

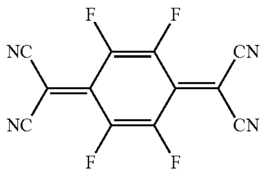

F4-TCNQ

-continued

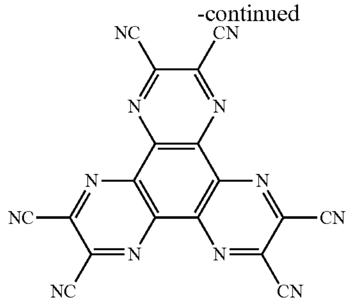

HAT-CN

Formula 221

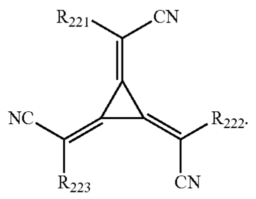

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one selected from among $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be metal, metalloid, or any combination thereof, and element EL2 may be non-metal, metalloid, or any combination thereof.

Non-limiting examples of the metal may include (e.g., may be) an alkali metal (for example, lithium (Li), sodium (Na), potassium (K), rubidium (Rb), cesium (Cs), etc.); alkaline earth metal (for example, beryllium (Be), magnesium (Mg), calcium (Ca), strontium (Sr), barium (Ba), etc.); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); post-transition metal (for example, zinc (Zn), indium (In), tin (Sn), etc.); and/or lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Non-limiting examples of the metalloid may include (e.g., may be) silicon (Si), antimony (Sb), and/or tellurium (Te).

Non-limiting examples of the non-metal may include (e.g., may be) oxygen (O) and/or halogen (for example, F, Cl, Br, I, etc.).

Non-limiting examples of the compound including element EL1 and element EL2 may include (e.g., may be) metal oxide, metal halide (for example, metal fluoride, metal chloride, metal bromide, or metal iodide), metalloid halide (for example, metalloid fluoride, metalloid chloride, metalloid bromide, or metalloid iodide), metal telluride, and/or any combination thereof.

Non-limiting examples of the metal oxide may include (e.g., may be) tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and/or rhenium oxide (for example, $ReO_3$, etc.).

Non-limiting examples of the metal halide may include (e.g., may be) alkali metal halide, alkaline earth metal halide, transition metal halide, post-transition metal halide, and/or lanthanide metal halide.

Non-limiting examples of the alkali metal halide may include (e.g., may be) LiF, NaF, KF, RbF, CsF, LiCl, NaCl, KCl, RbCl, CsCl, LiBr, NaBr, KBr, RbBr, CsBr, LiI, NaI, KI, RbI, and/or CsI.

Non-limiting examples of the alkaline earth metal halide may include (e.g., may be) $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and/or $BaI_2$.

Non-limiting examples of the transition metal halide may include (e.g., may be) titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and/or gold halide (for example, AuF, AuCl, AuBr, AuI, etc.).

Non-limiting examples of the post-transition metal halide may include (e.g., may be) zinc halide (for example, $ZnF_2$, $ZnCl_2$, $ZnBr_2$, $ZnI_2$, etc.), indium halide (for example, $InI_3$, etc.), and/or tin halide (for example, $SnI_2$, etc.).

Non-limiting examples of the lanthanide metal halide may include (e.g., may be) YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, $SmI_3$, and/or the like.

Non-limiting examples of the metalloid halide may include (e.g., may be) antimony halide (for example, $SbCl_5$, etc.).

Non-limiting examples of the metal telluride may include (e.g., may be) alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and/or lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers selected from a red emission layer, a green emission layer, and a blue emission layer, in which the two or more layers contact each other or are separated from each other to emit white light (e.g., combined white light). In one or more embodiments, the emission layer may include two or more materials selected from a red light-emitting material, a green light-emitting material, and a blue light-emitting material, in which the two or more materials are mixed with each other in a single layer to emit white light (e.g., combined white light).

The emission layer may include a host and a dopant. The dopant may include a phosphorescent dopant, a fluorescent dopant, or any combination thereof.

The amount of the dopant in the emission layer may be from about 0.01 part by weight to about 15 parts by weight based on 100 parts by weight of the host.

In one or more embodiments, the emission layer may include a quantum dot.

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, or $—P(=O)(Q_{301})(Q_{302})$, xb21 may be an integer from 1 to 5, and $Q_{301}$ to $Q_{303}$ may each be the same as described herein with respect to $Q_1$.

For example, in some embodiments, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, or any combination thereof:

Formula 301-1

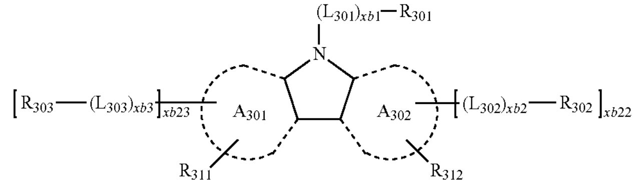

Formula 301-2

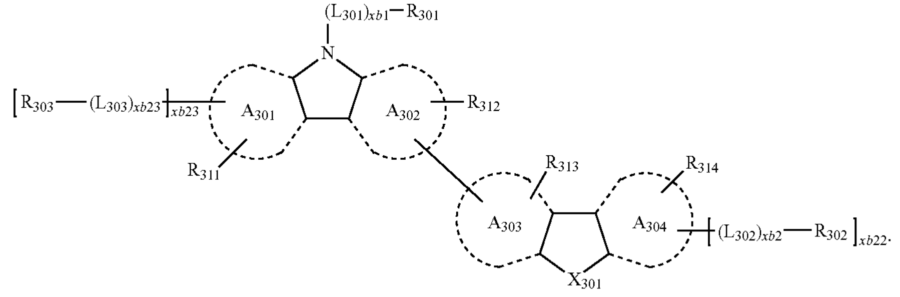

In some embodiments, the emission layer may include a delayed fluorescence material. The delayed fluorescence material may act as a host or a dopant in the emission layer.

A thickness of the emission layer may be in a range of about 100 Å to about 1,000 Å, for example, about 200 Å to about 600 Å. When the thickness of the emission layer is within these ranges, excellent or suitable light-emission characteristics may be obtained without a substantial increase in driving voltage.

Host

In one or more embodiments, the host may include a compound represented by Formula 301:

$$[Ar_{301}]_{xb11}\text{-}[(L_{301})_{xb1}\text{-}R_{301}]_{xb21}. \quad \text{Formula 301}$$

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, $N[(L_{304})_{xb4}\text{-}R_{304}]$, $C(R_{304})(R_{305})$, or $Si(R_{304})(R_{305})$, xb22 and xb23 may each independently be 0, 1, or 2, $L_{301}$, xb1, and $R_{301}$ may each be the same as described herein, $L_{302}$ to $L_{304}$ may each independently be the same as described herein with respect to with $L_{301}$, xb2 to xb4 may each independently be the same as described herein with respect to xb1, and $R_{302}$ to $R_{305}$ and $R_{311}$ to $R_{314}$ may each be the same as described herein with respect to $R_{301}$.

In one or more embodiments, the host may include an alkaline earth metal complex, a post-transition metal complex, or any combination thereof. For example, in some embodiments, the host may include a Be complex (for example, Compound H55), an Mg complex, a Zn complex, or any combination thereof.

In one or more embodiments, the host may include at least one selected from among Compounds H1 to H126, 9,10-di(2-naphthyl)anthracene (ADN), 2-methyl-9,10-bis(naphthalen-2-yl)anthracene (MADN), 9,10-di(2-naphthyl)-2-t-butyl-anthracene (TBADN), 4,4'-bis(N-carbazolyl)-1,1'-biphenyl (CBP), 1,3-di(carbazol-9-yl)benzene (mCP) 1,3,5-tri(carbazol-9-yl)benzene (TCP) and/or any combination thereof:

H1

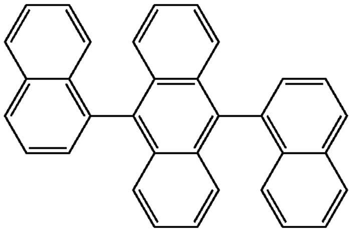

H2

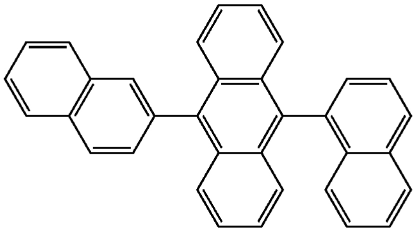

H3

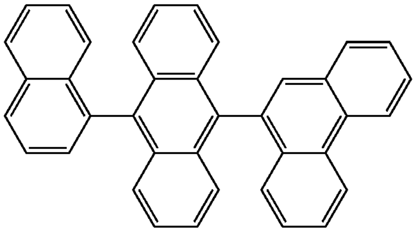

H4

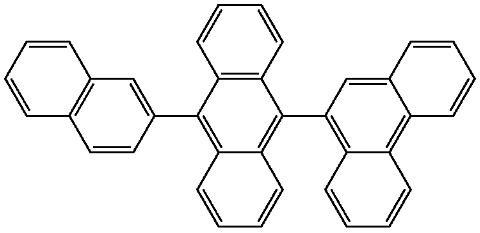

-continued

H5

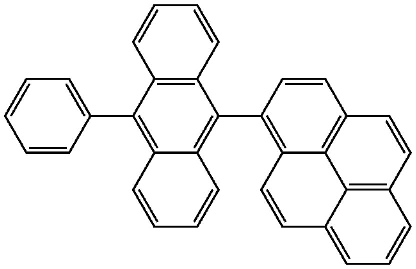

H6

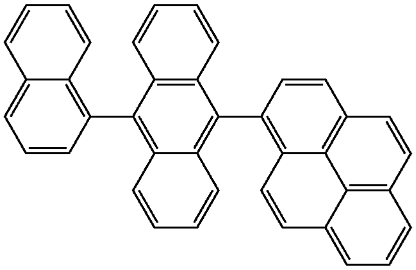

H7

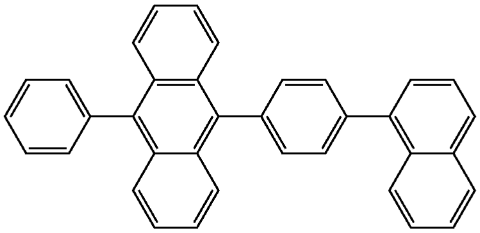

H8

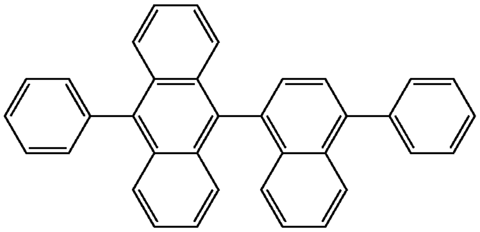

H9

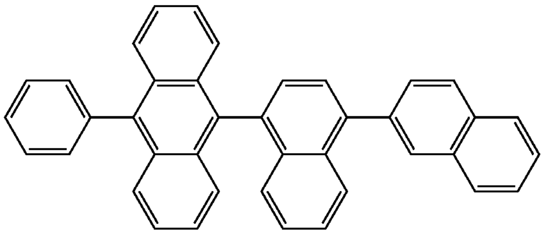

H10

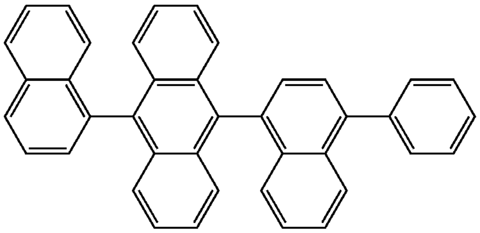

-continued
H11
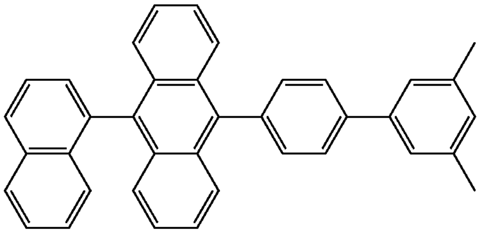
H12
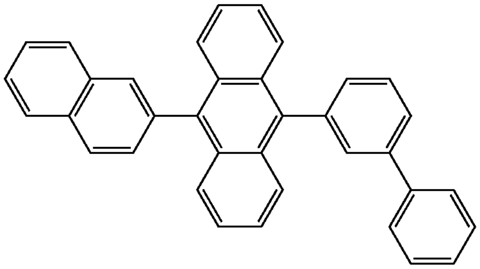
H13
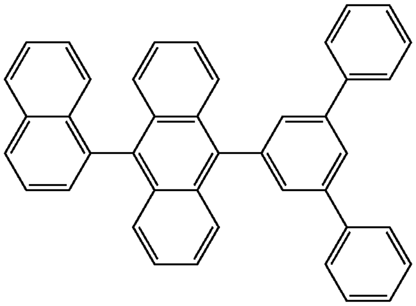
H14
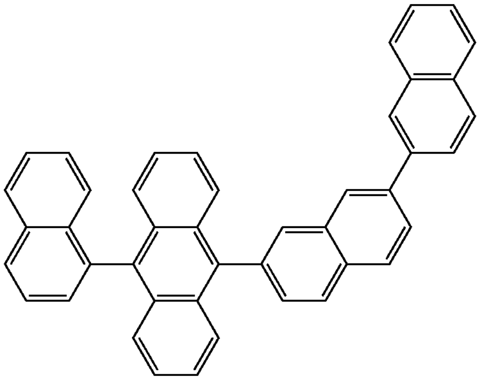
H15
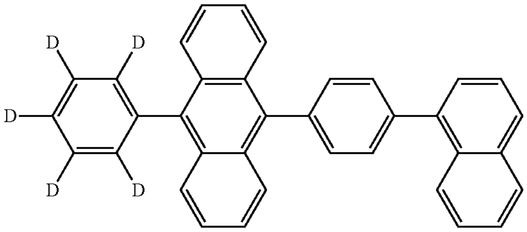
-continued
H16
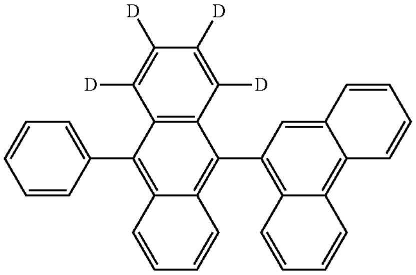
H17
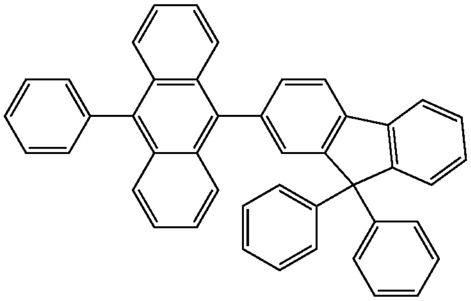
H18
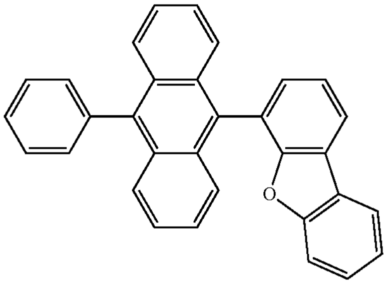
H19
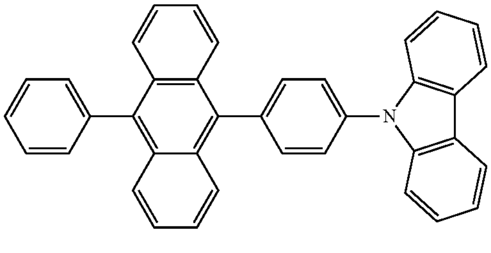
H20
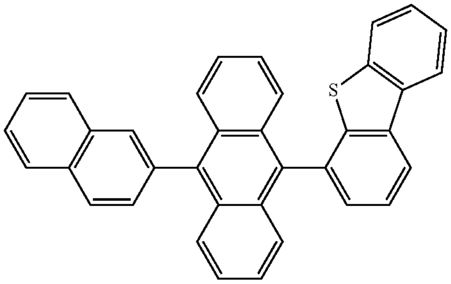

-continued
H21
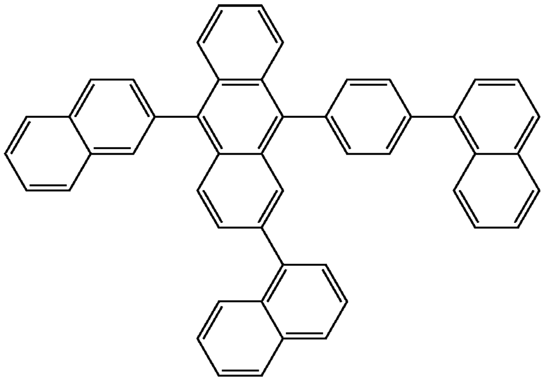
H22
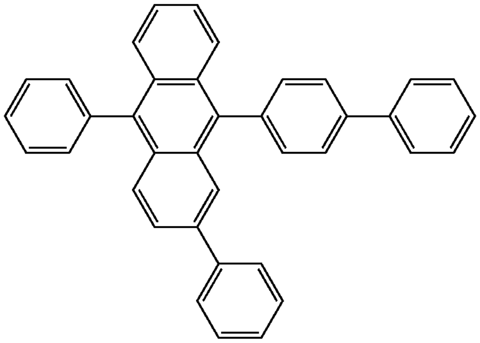
H23
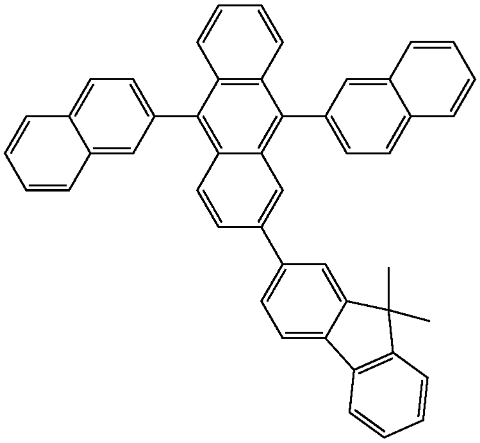
H24
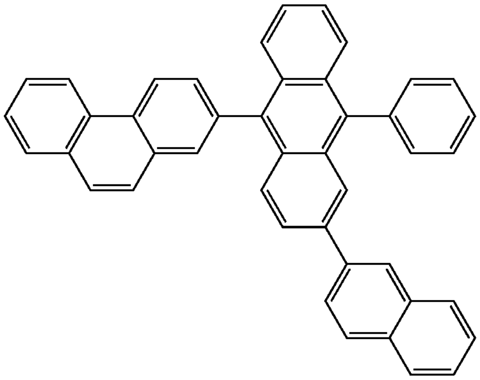
-continued
H25
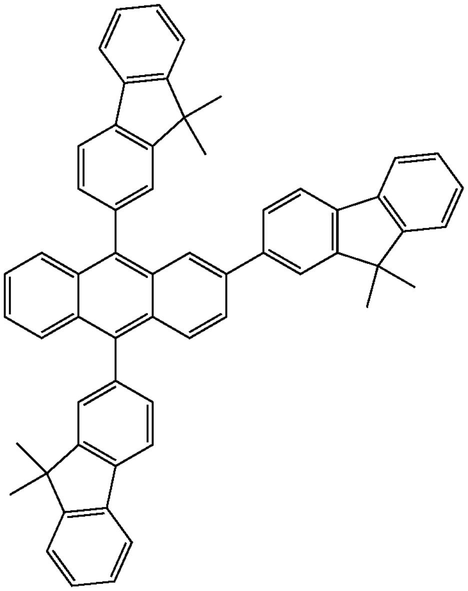
H26
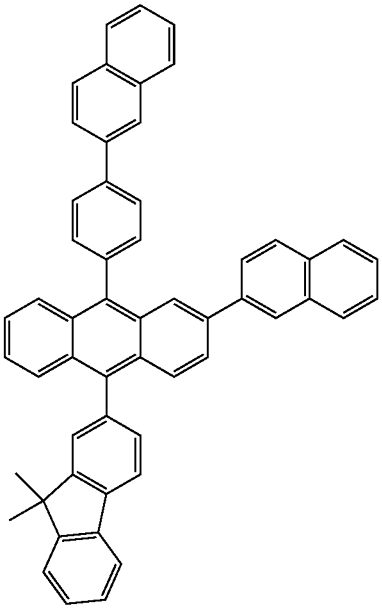

-continued
H27
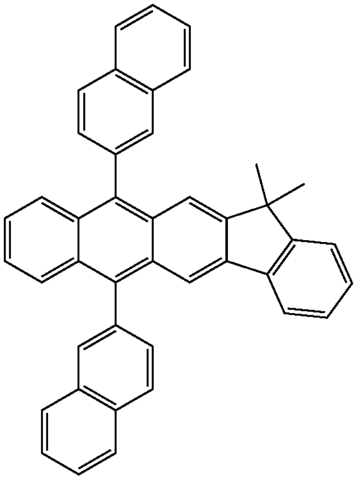
H28
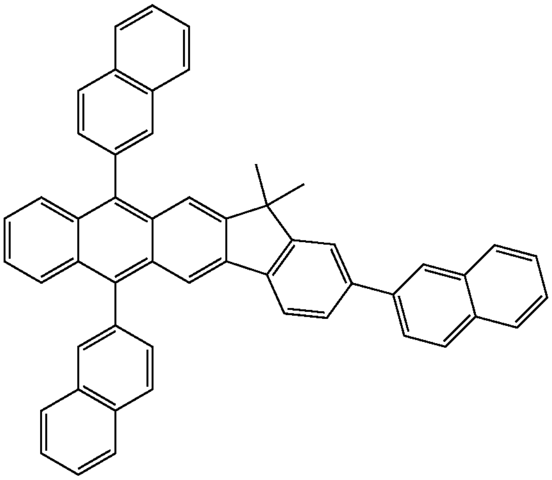
H29
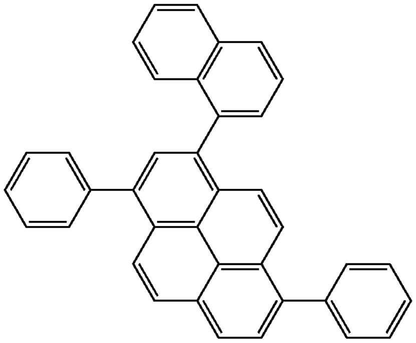
-continued
H30
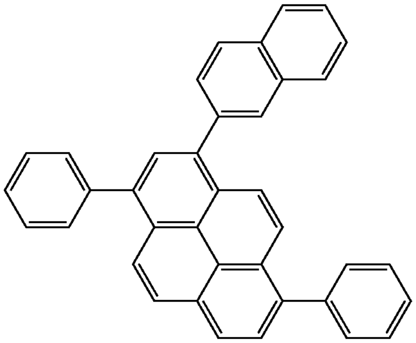
H31
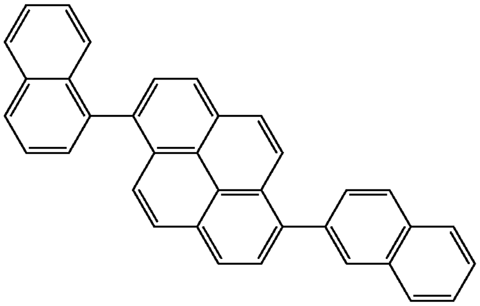
H32
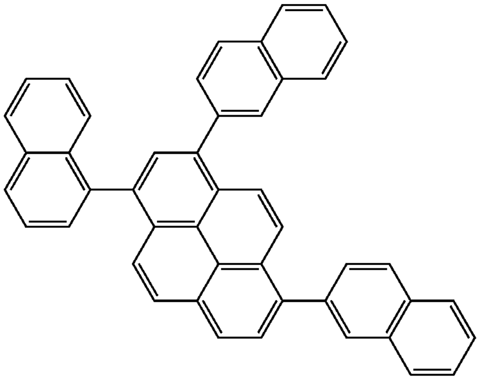
H33
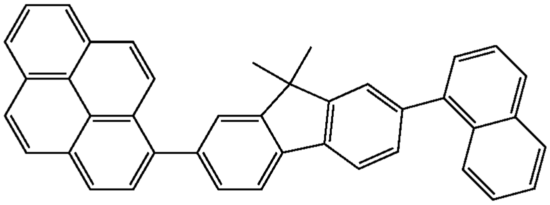
H34
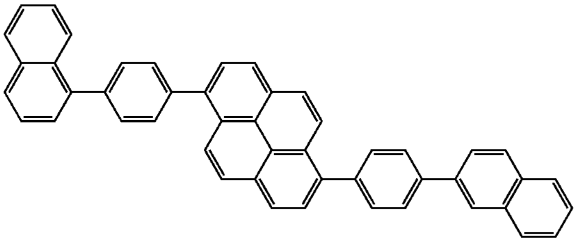

-continued
H35
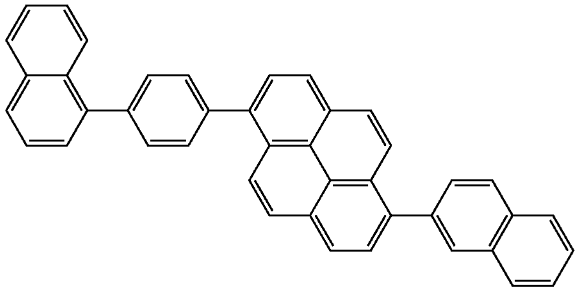
H36
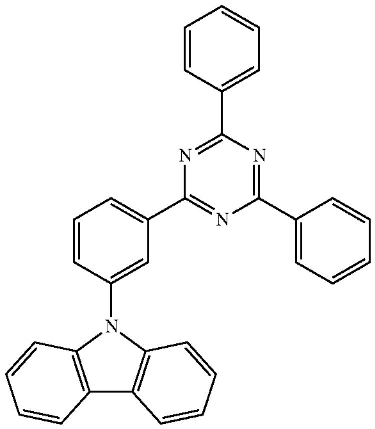
H37
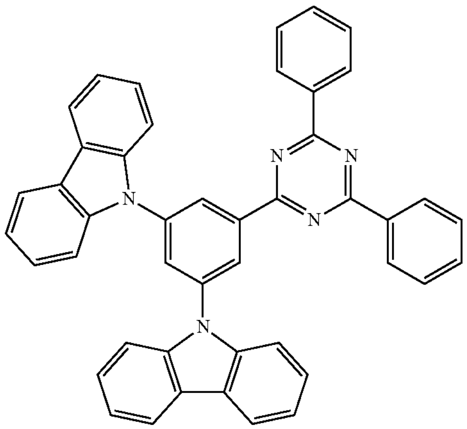
H38
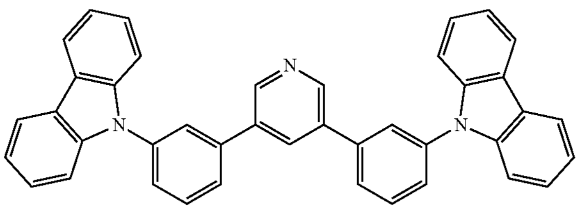
-continued
H39
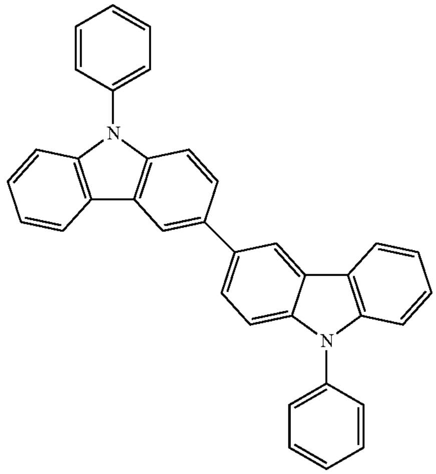
H40
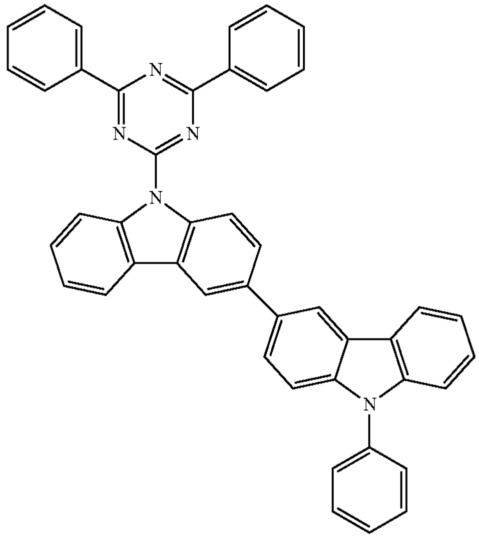
H41
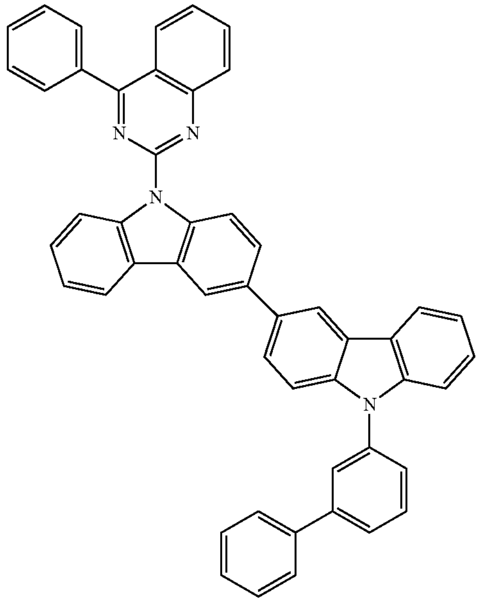

H42
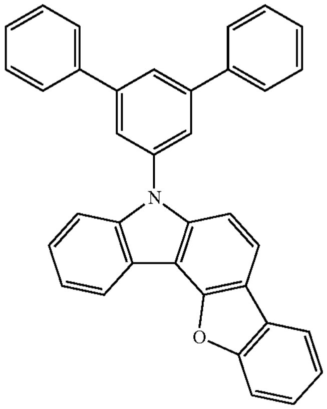
H43
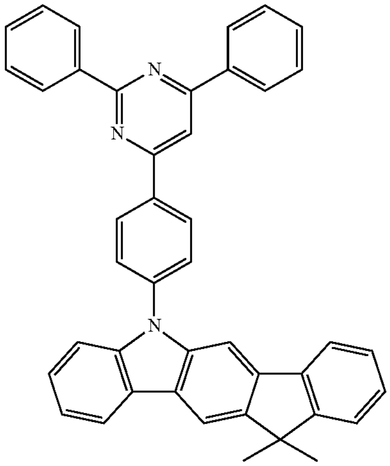
H44
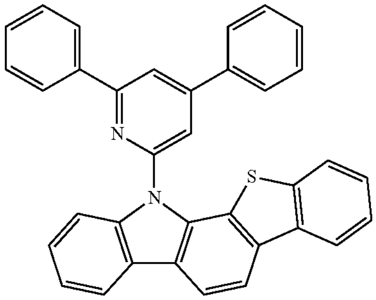
H45
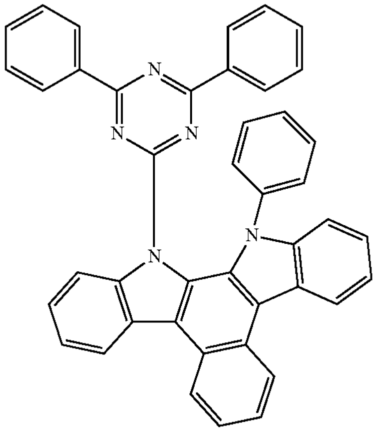
H46
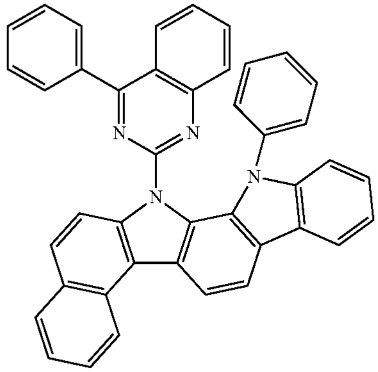
H47
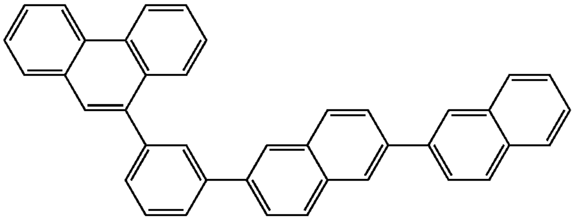
H48
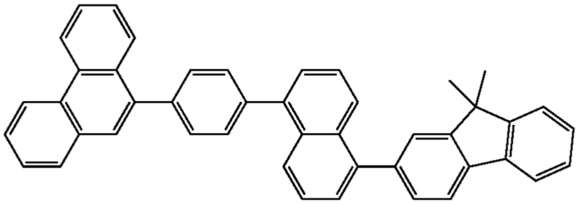
H49
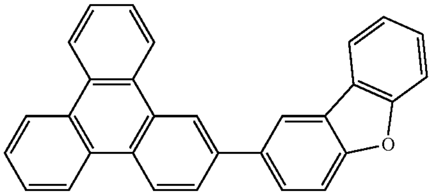
H50
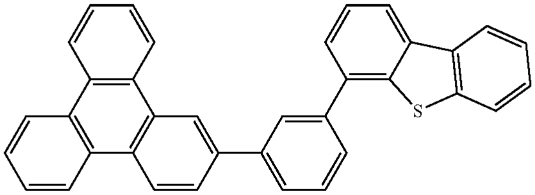
H51
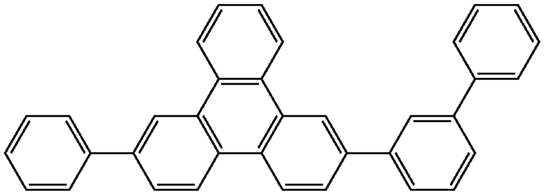

H52
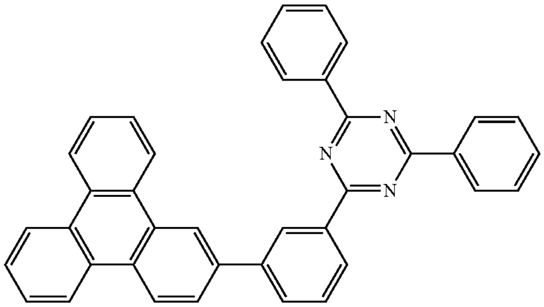
H53
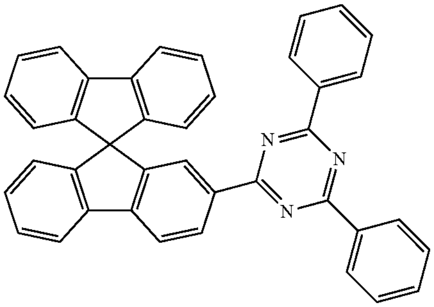
H54
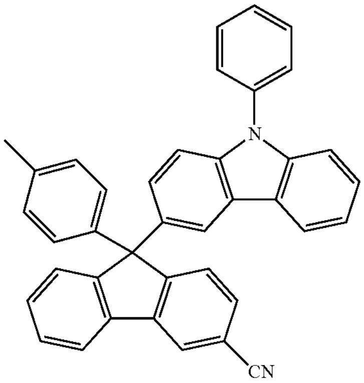
H55
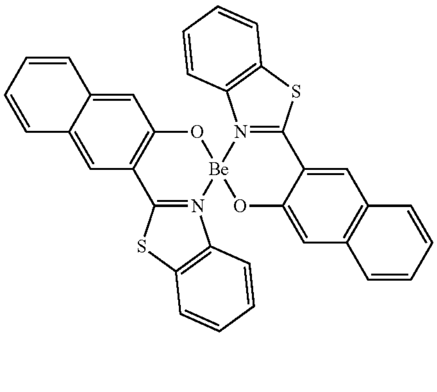
H56
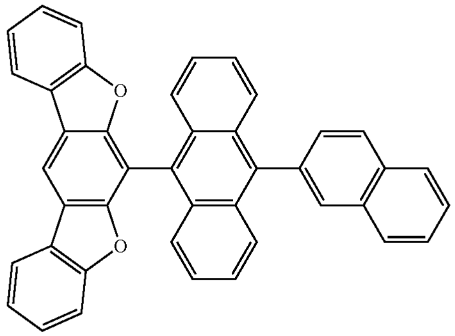
H57
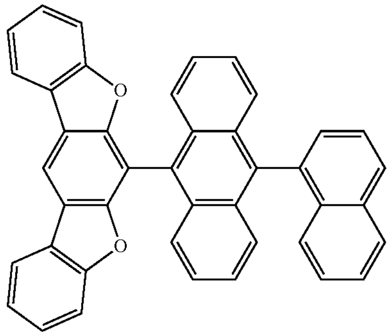
H58
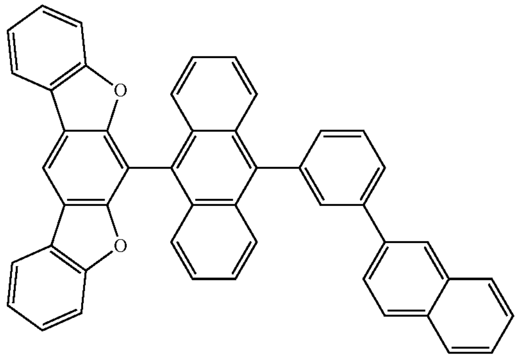
H59
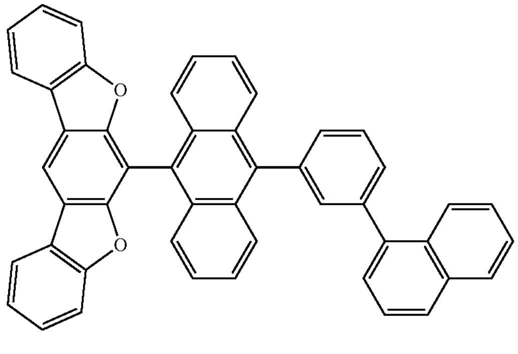

-continued
H60
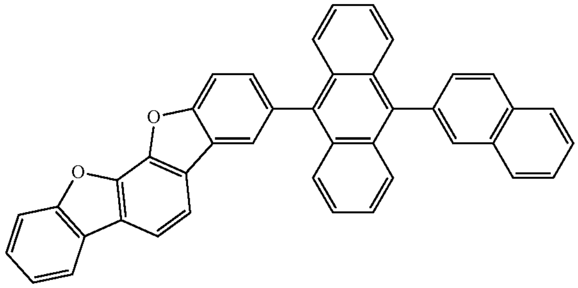
H61
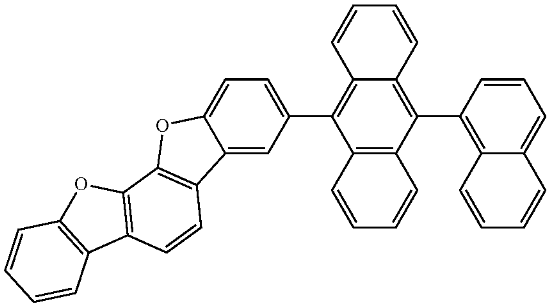
H62
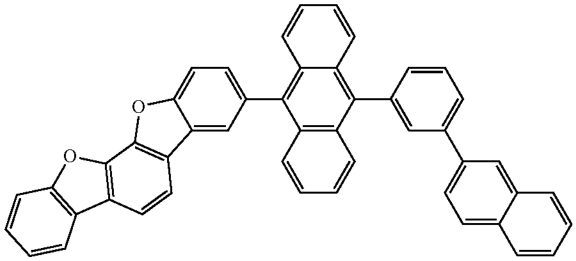
H63
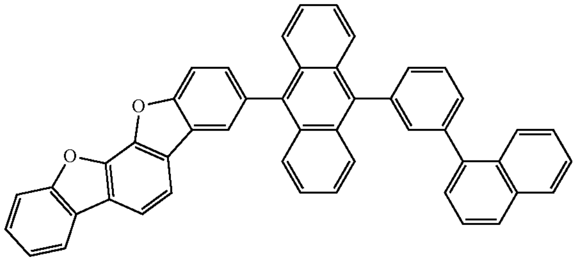
H64
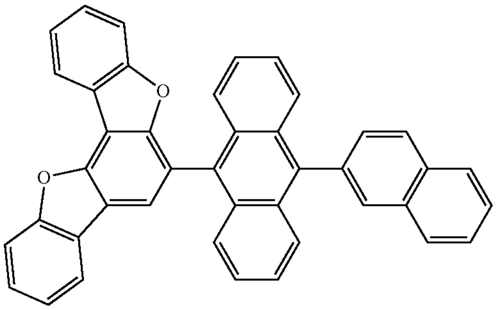
-continued
H65
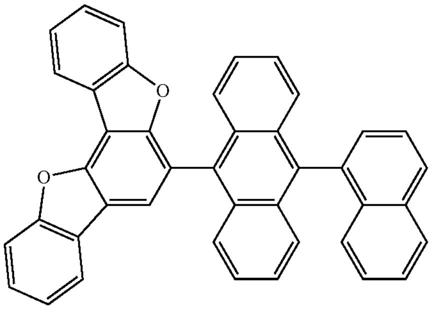
H66
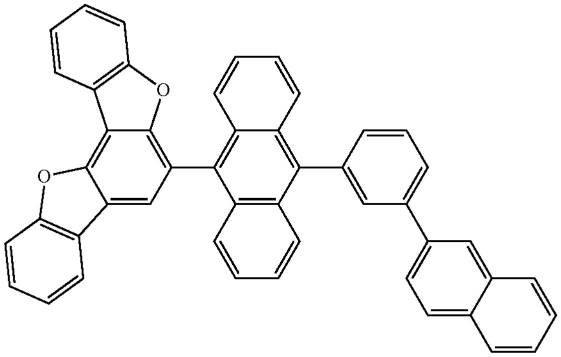
H67
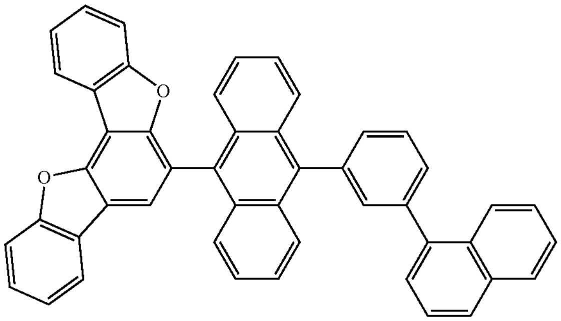
H68
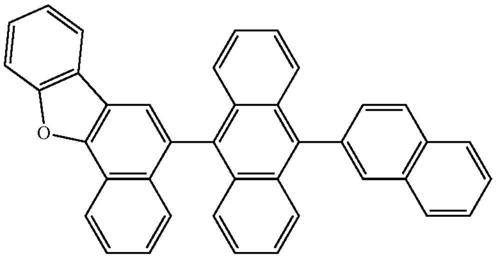
H69
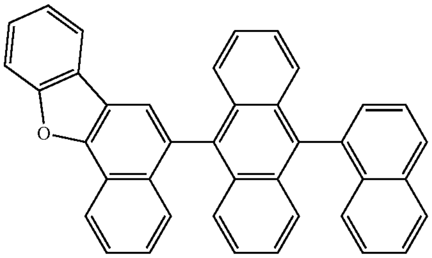

-continued
H70
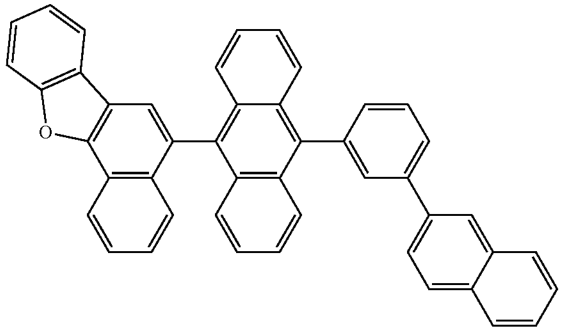
H71
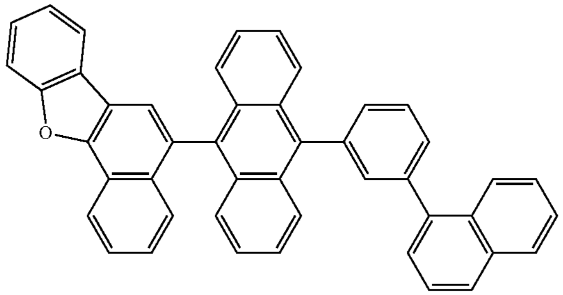
H72
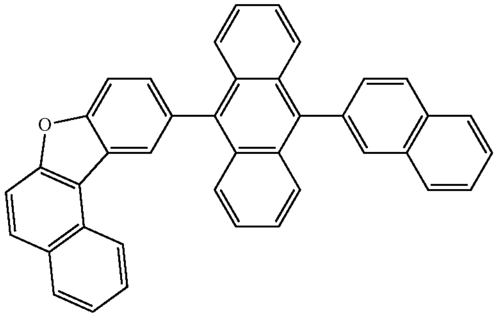
H73
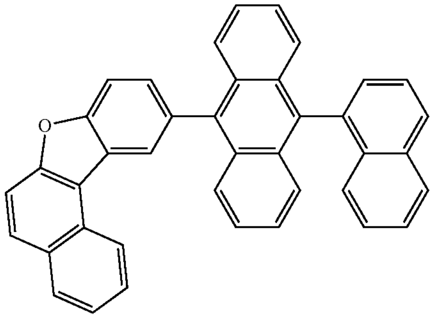
-continued
H74
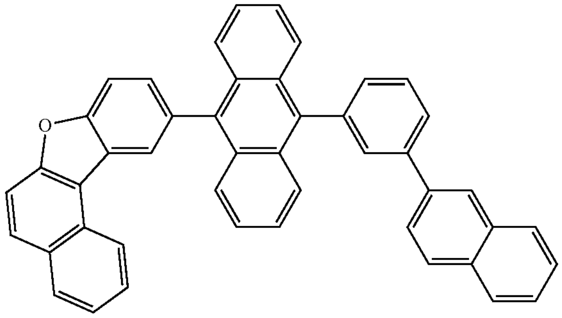
H75
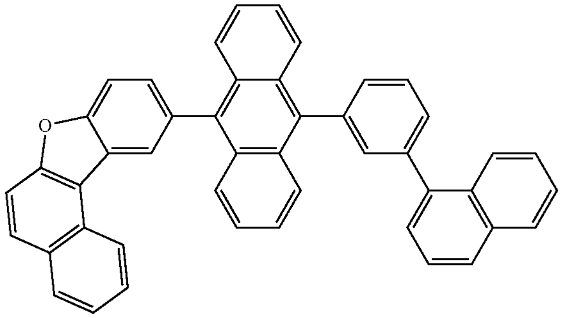
H76
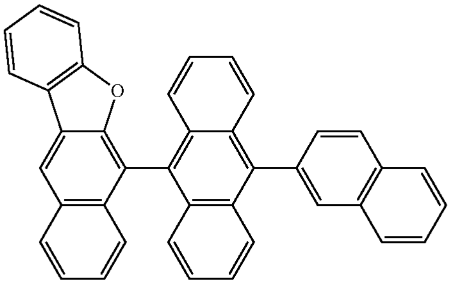
H77
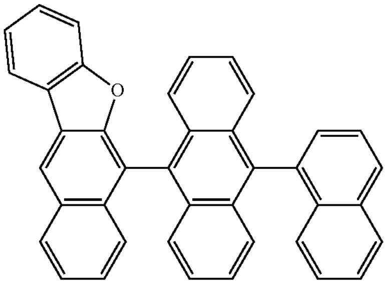
H78
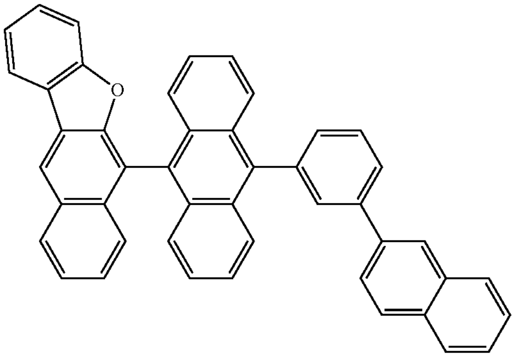

H79
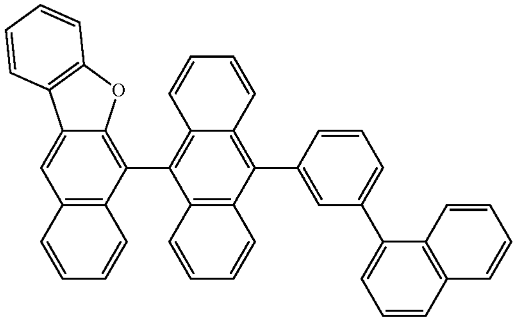
H80
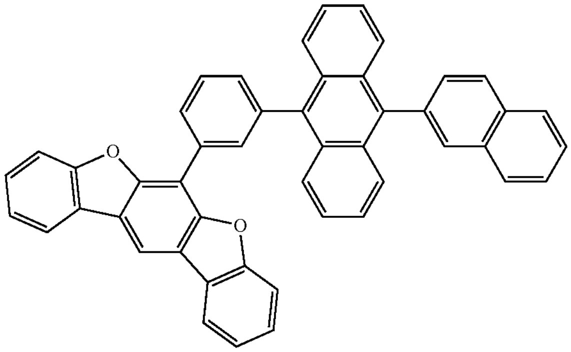
H81
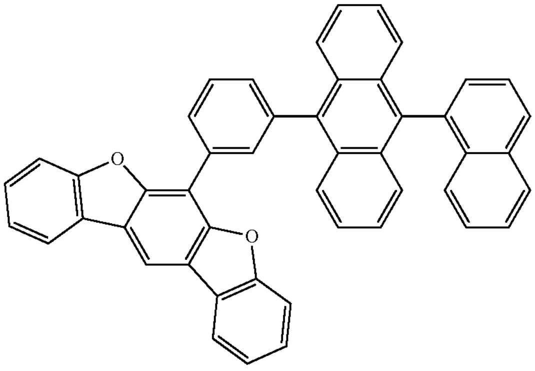
H82
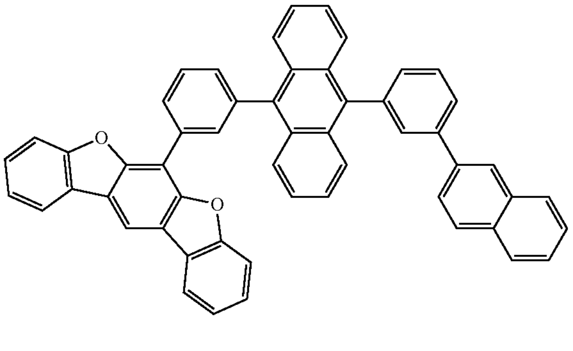
H83
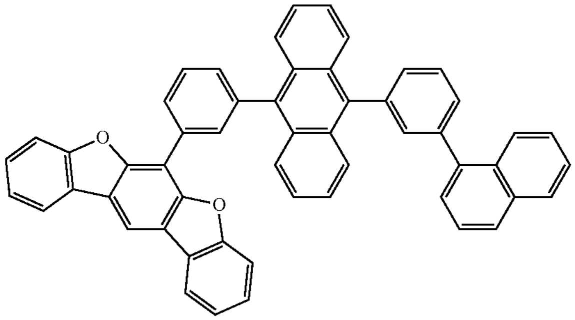
H84
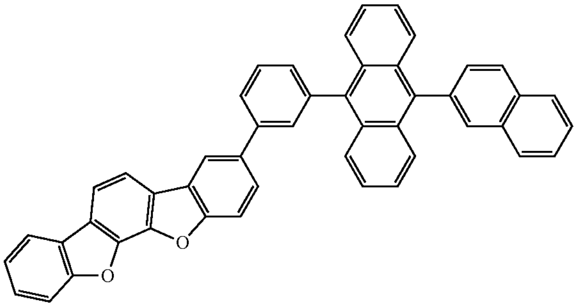
H85
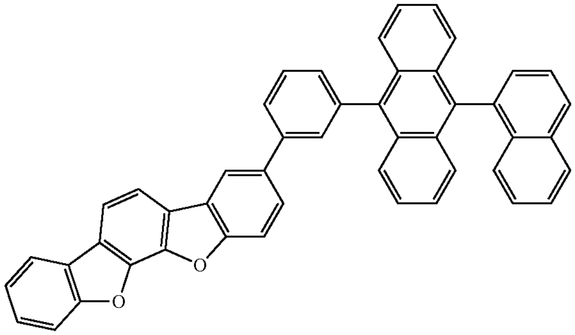
H86
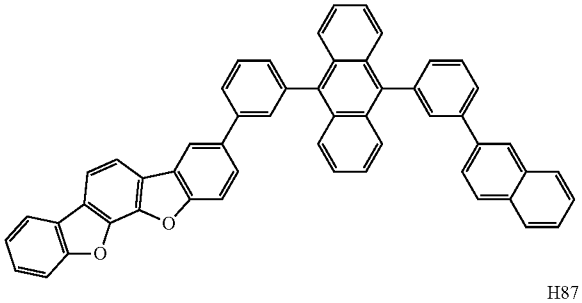
H87
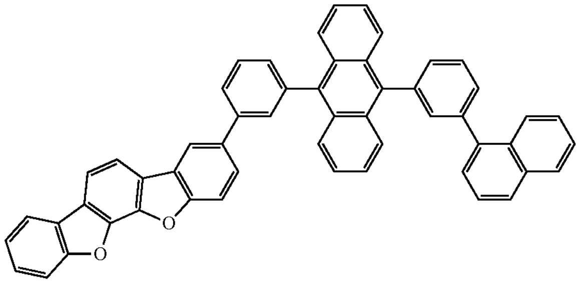

H88
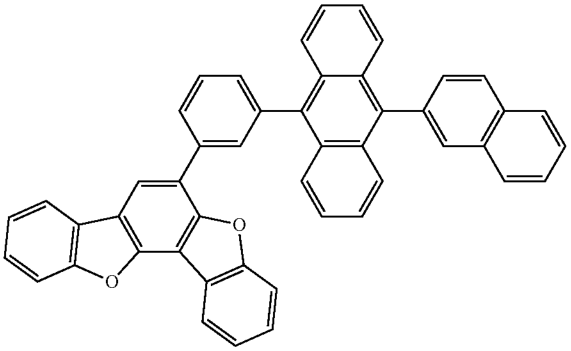
H89
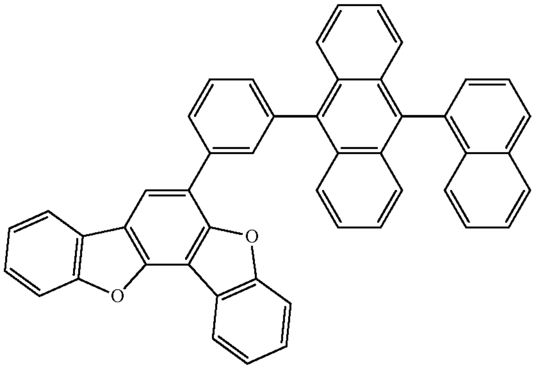
H90
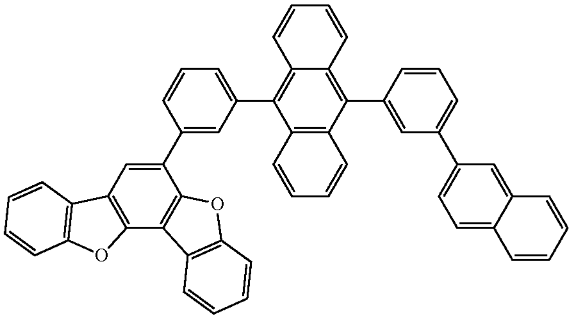
H91
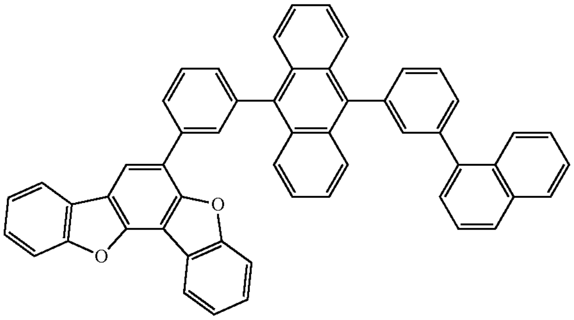
H92
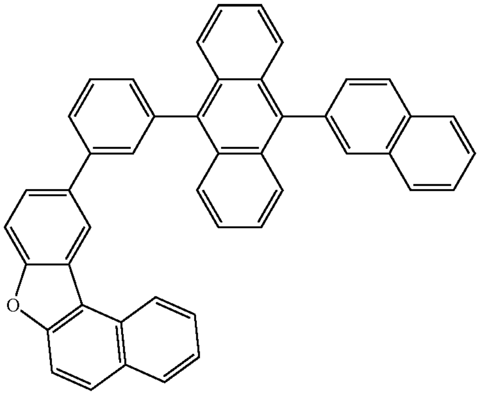
H93
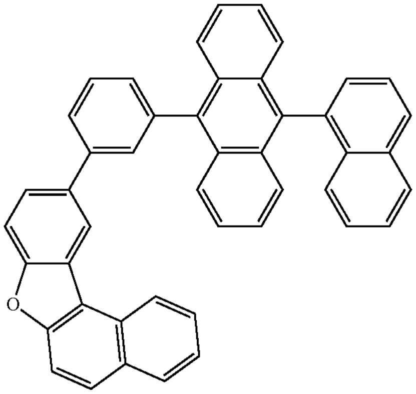
H94
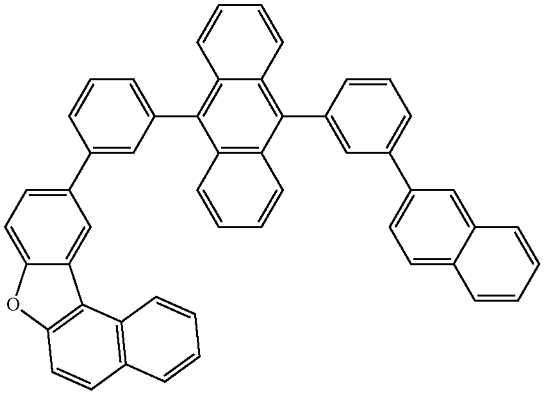
H95
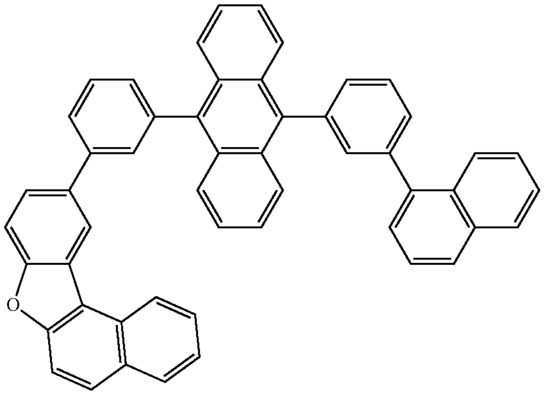

-continued
H96
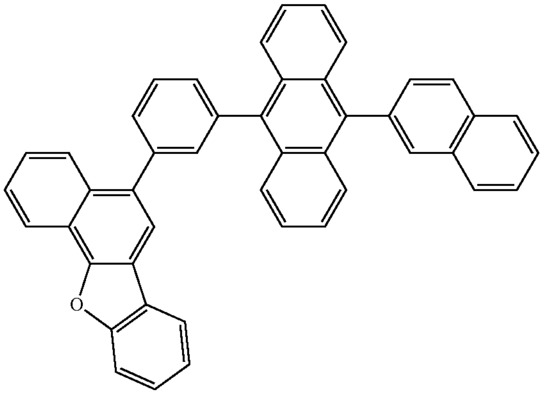
H97
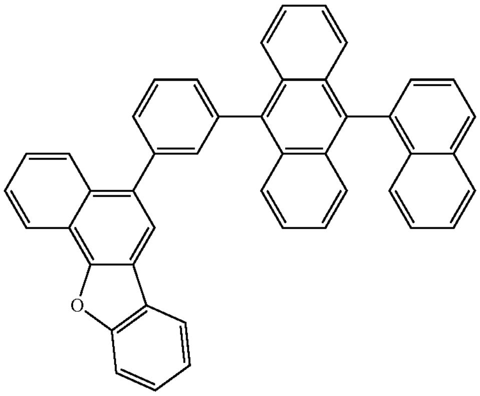
H98
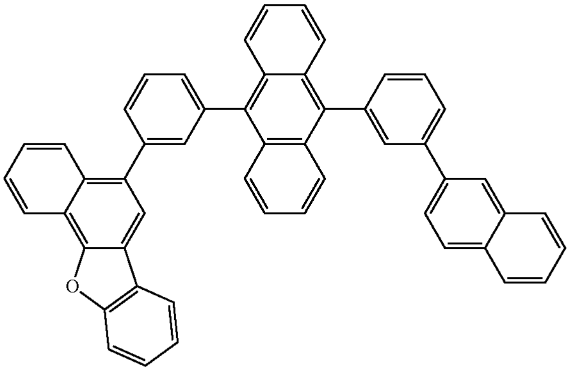
H99
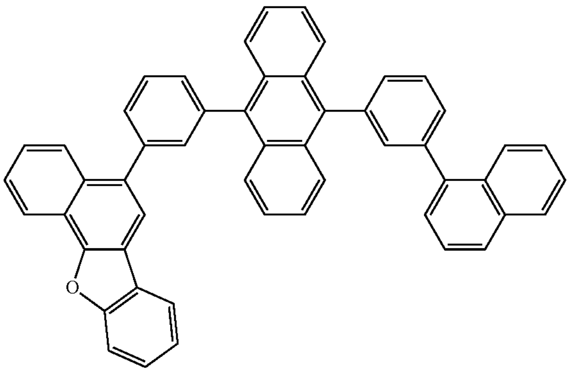
-continued
H100
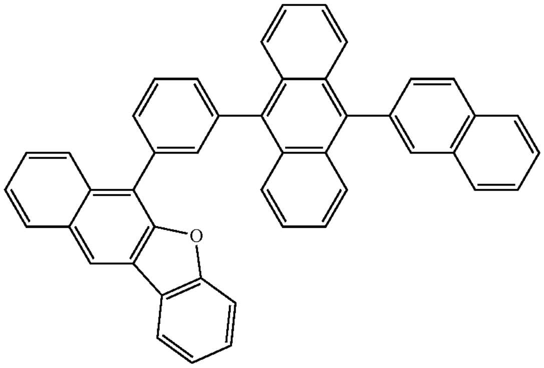
H101
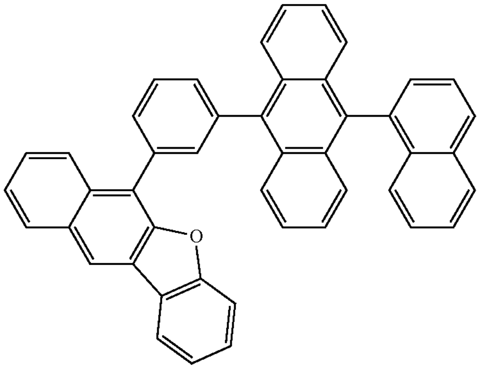
H102
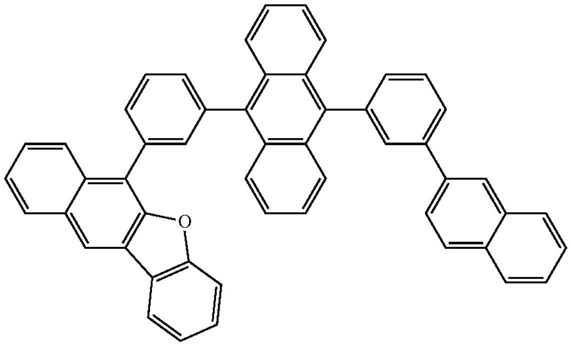
H103
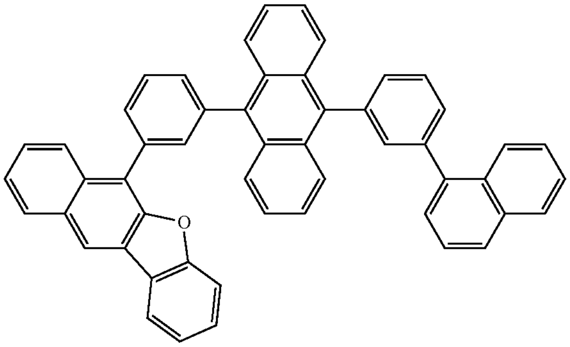

H104
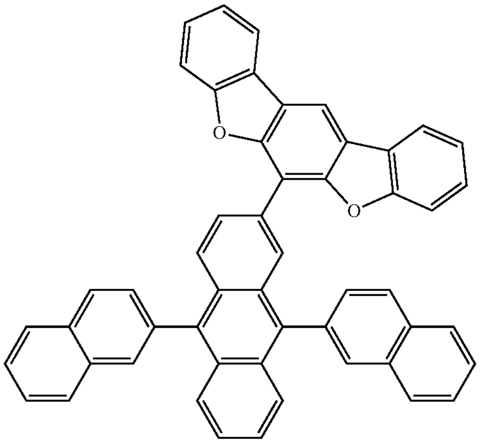
H105
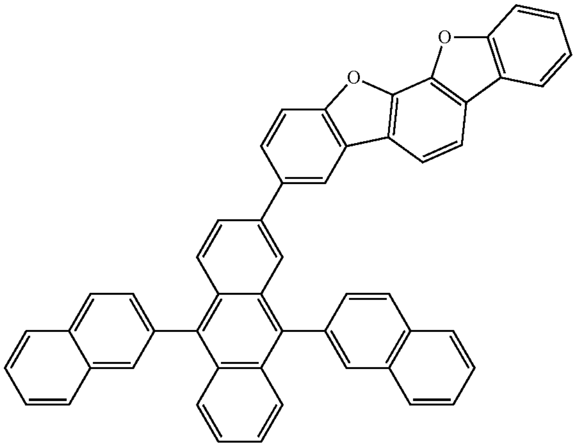
H106
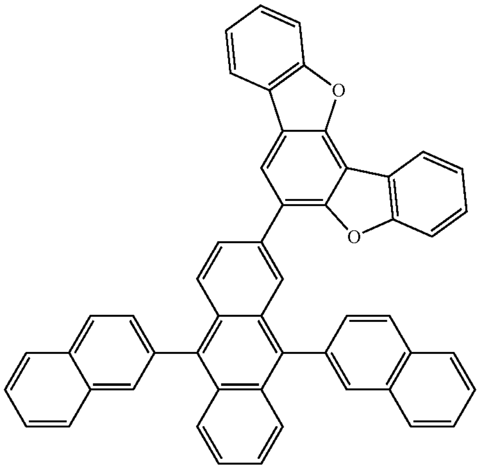
H107
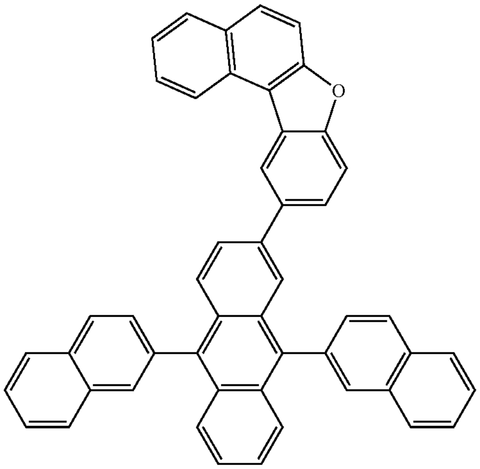
H108
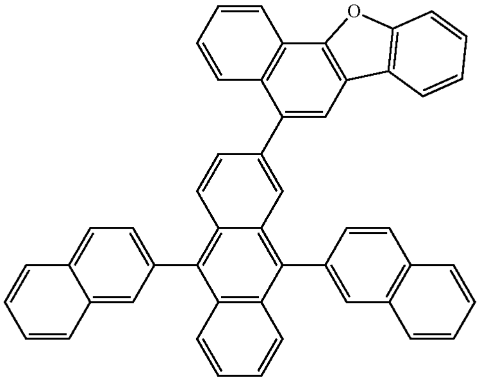
H109
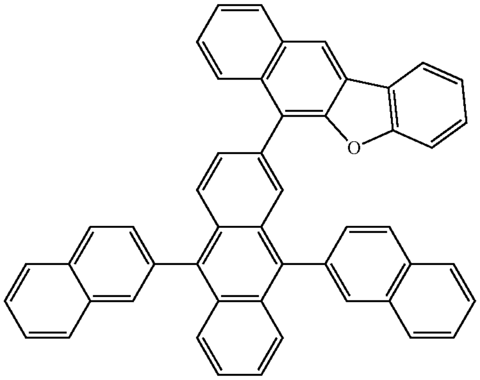
H110
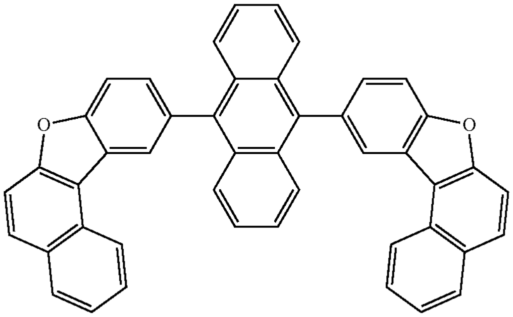

-continued
H111
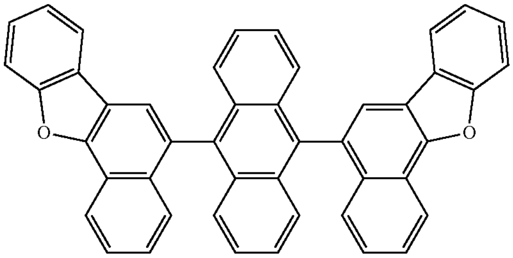
H112
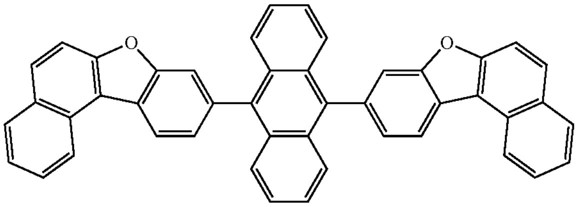
H113
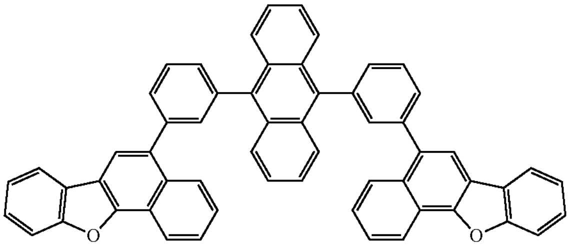
H114
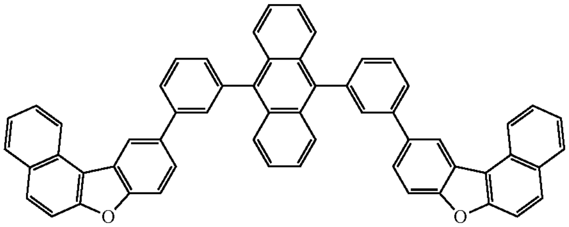
H115
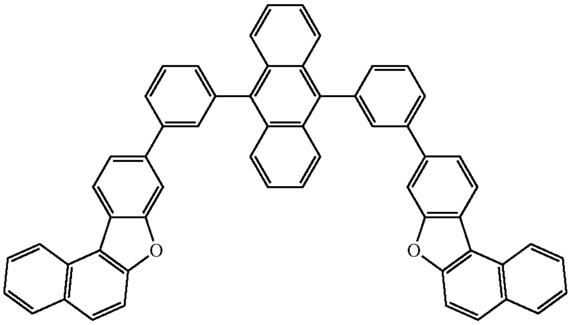
-continued
H116
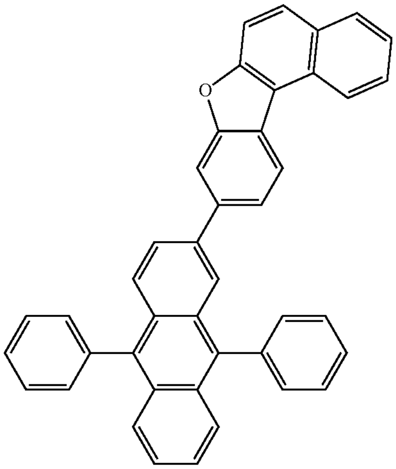
H117
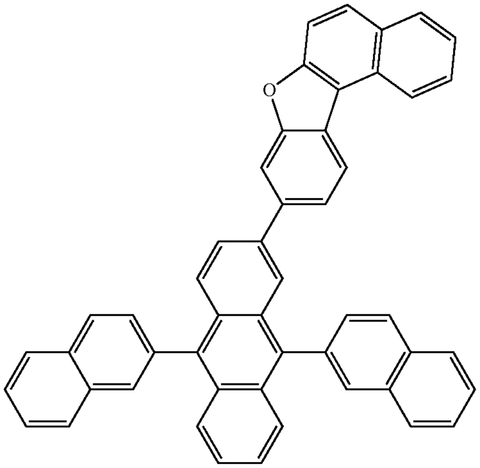
H118
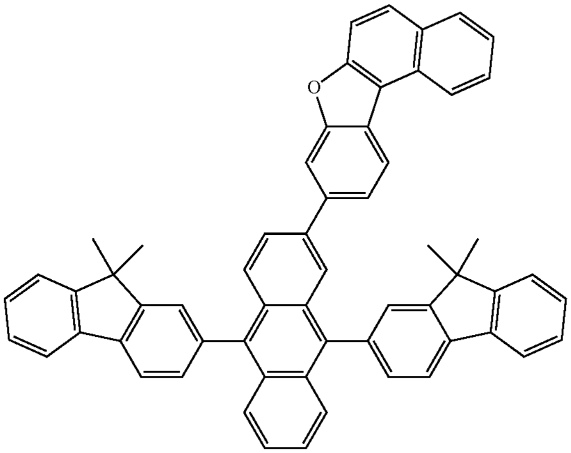

-continued
H119
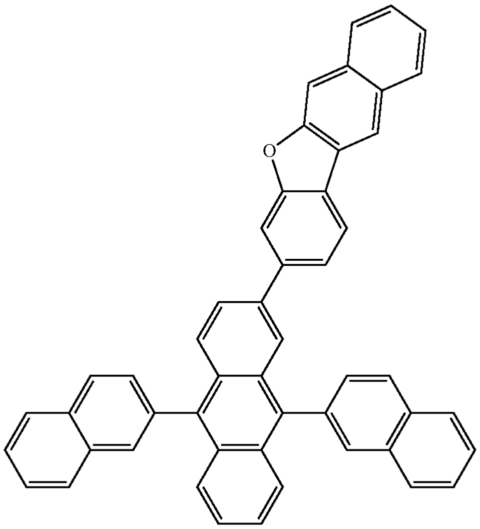
H120
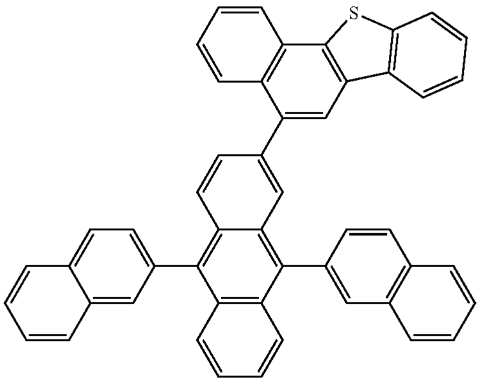
H121
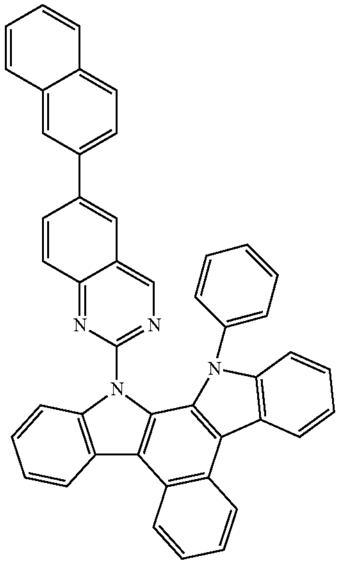
-continued
H122
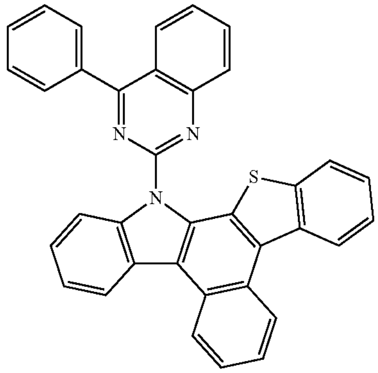
H123
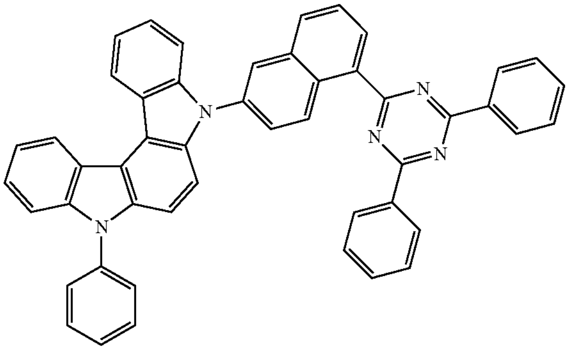
H124
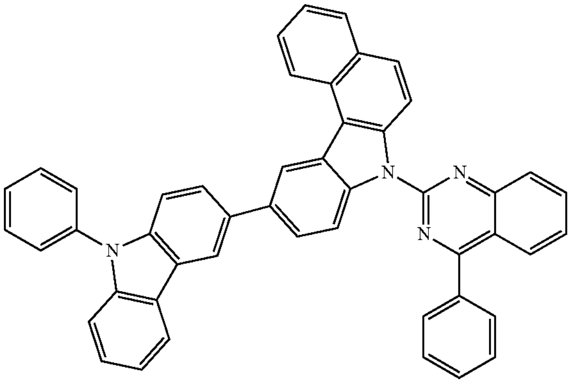

-continued

H125

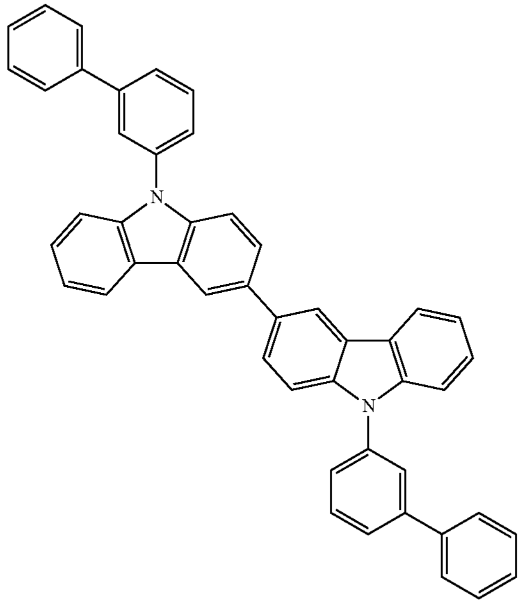

H126

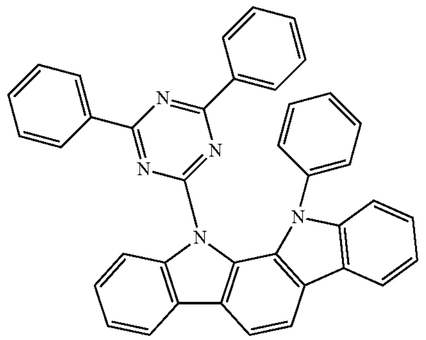

Phosphorescent Dopant

In one or more embodiments, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

In some embodiments, the phosphorescent dopant may be electrically neutral.

For example, in some embodiments, the phosphorescent dopant may include an organometallic compound represented by Formula 401:

$$M(L_{401})_{xc1}(L_{402})_{xc2}$$ Formula 401

Formula 402

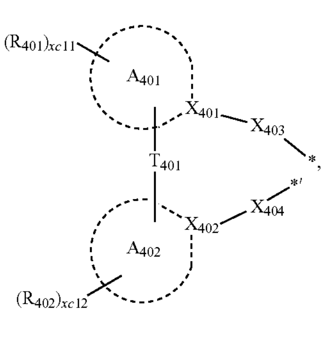

wherein, in Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$(s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be the same as described herein with respect to $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be the same as described herein with respect to $Q_1$, xc11 and xc12 may each independently be an integer from 0 to 10, and

* and *' in Formula 402 each indicate a binding site to M in Formula 401.

For example, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 401 is 2 or more, two ring $A_{401}$(s) among two or more of $L_{401}$ may optionally be bonded to each other via $T_{402}$, which is a linking group, and/or two ring $A_{402}$(s) among two or more of $L_{401}$ may optionally be bonded to each other via $T_{403}$, which is a linking group (see Compounds PD1 to PD4 and PD7). $T_{402}$ and $T_{403}$ may each be the same as described herein with respect to $T_{401}$.

$L_{402}$ in Formula 401 may be an organic ligand. For example, $L_{402}$ may include a halogen, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

In one or more embodiments, the phosphorescent dopant may include, for example, at least one selected from among compounds PD1 to PD39, and/or any combination thereof:

-continued
PD1
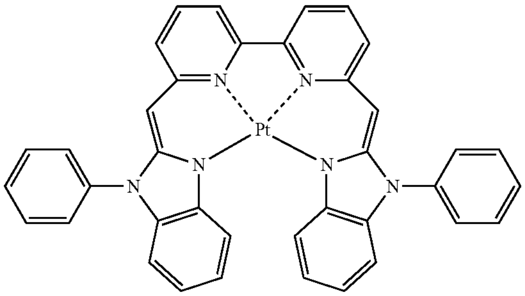
PD2
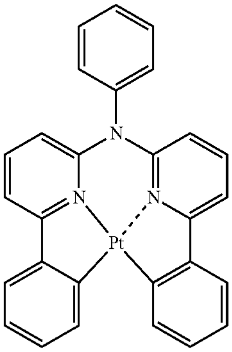
PD3
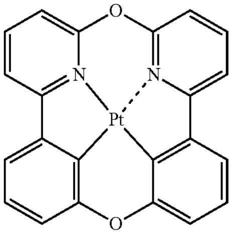
PD4
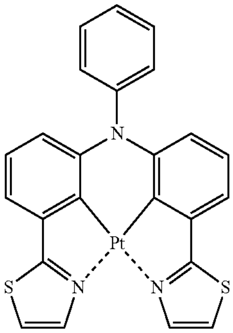
PD5
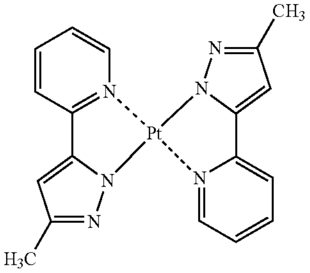
PD6
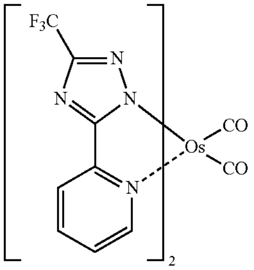
PD7
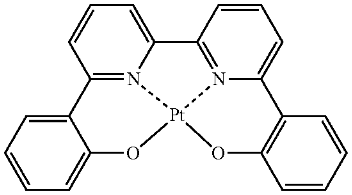
PD8
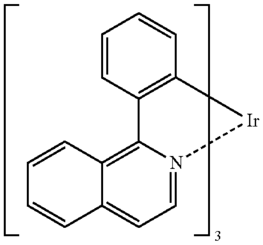
PD9
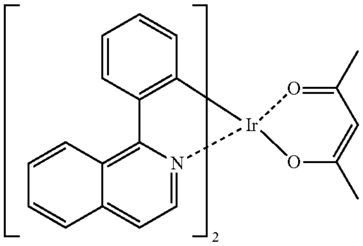
PD10
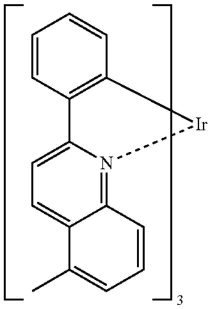
PD11
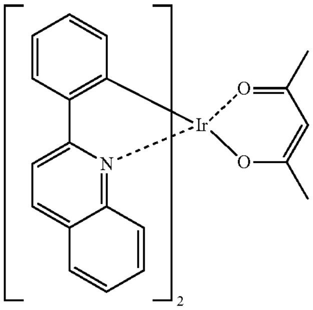

-continued
PD12
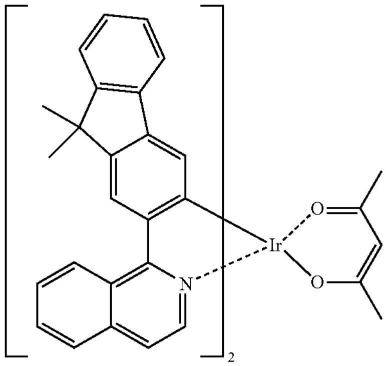
PD13
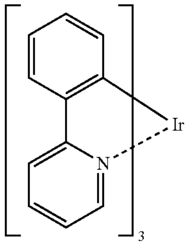
PD14
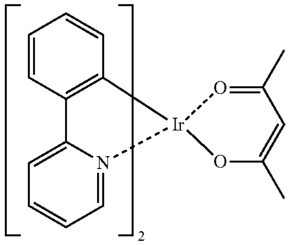
PD15
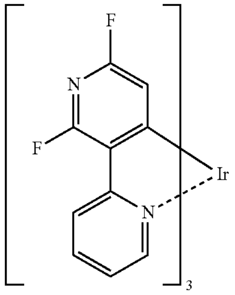
PD16
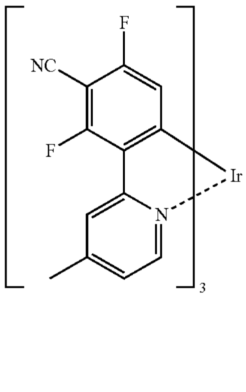
-continued
PD17
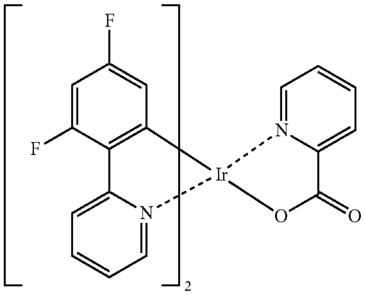
PD18
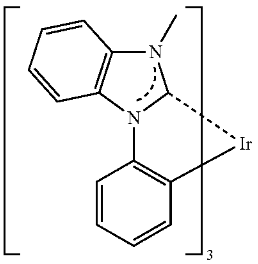
PD19
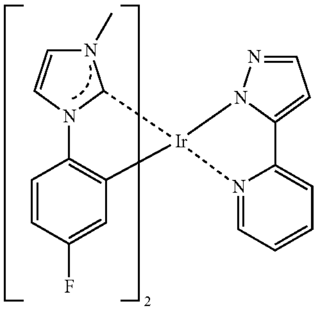
PD20
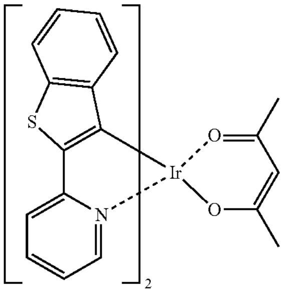
PD21
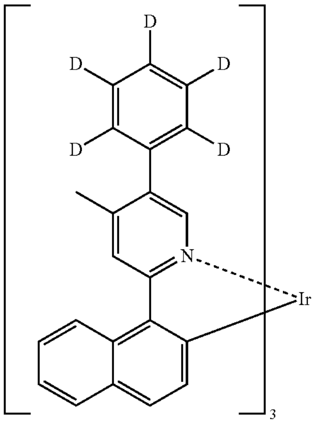

PD22
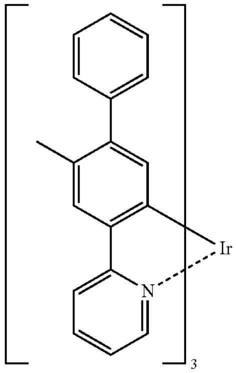
PD23
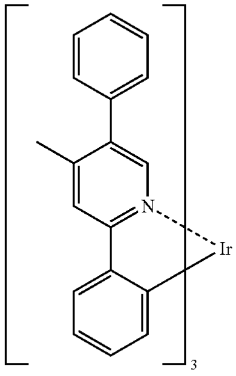
PD24
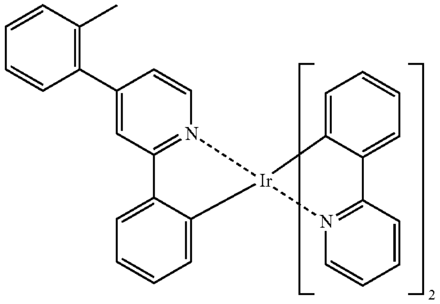
PD25
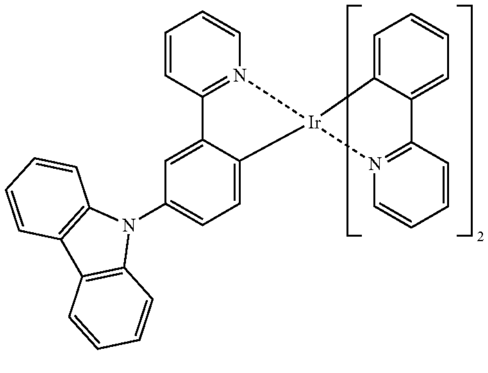
PD26
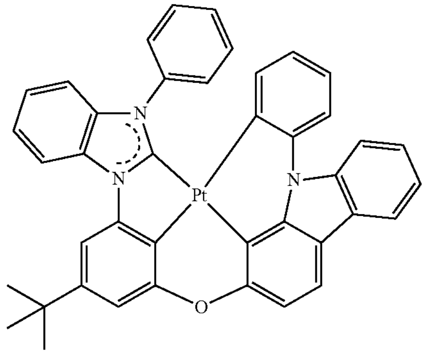
PD27
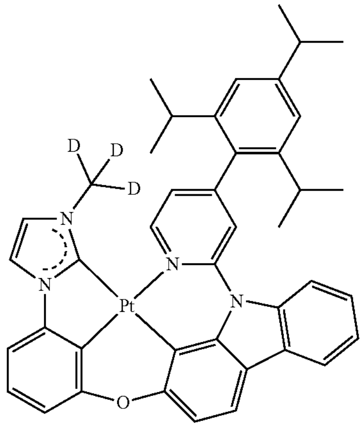
PD28
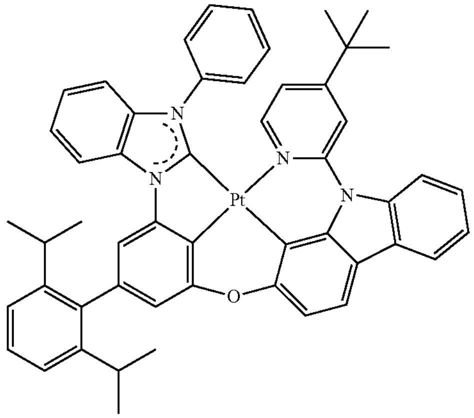
PD29
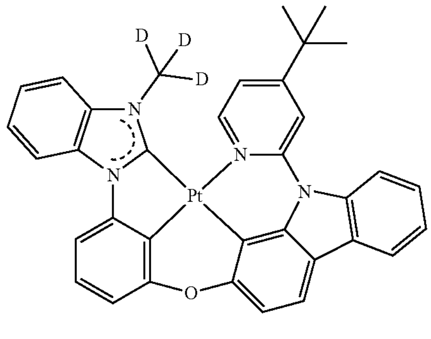

-continued
PD30
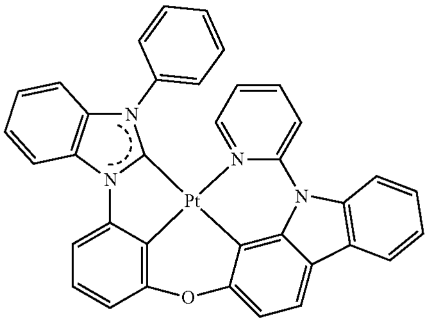
PD31
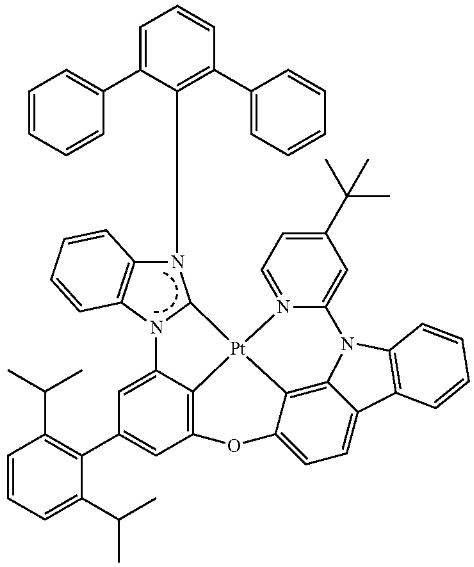
PD32
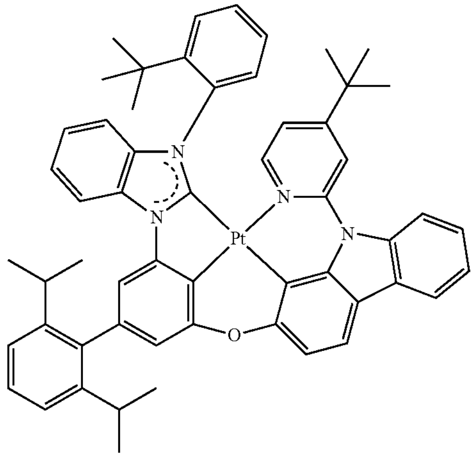
-continued
PD33
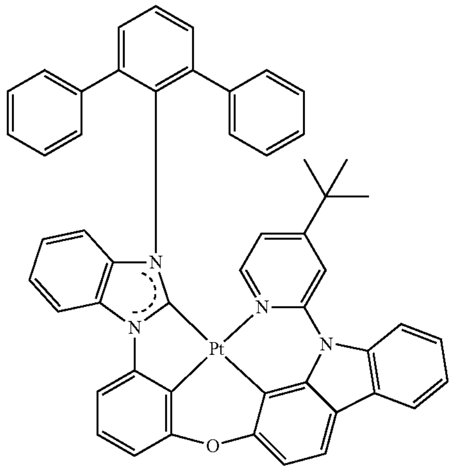
PD34
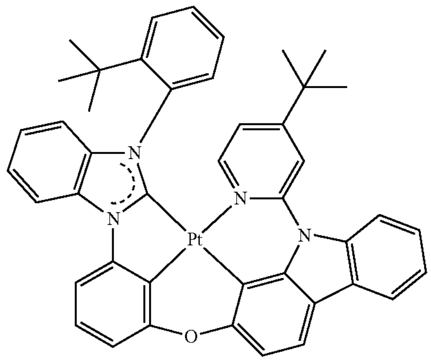
PD35
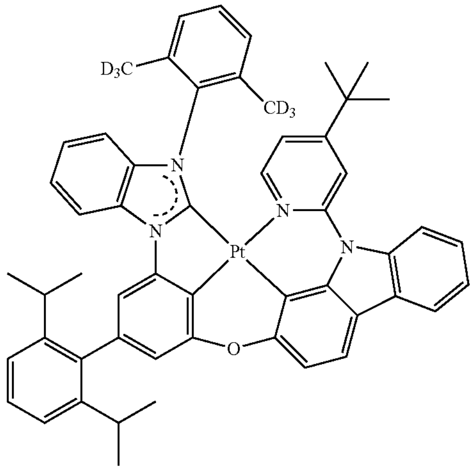

-continued

PD36

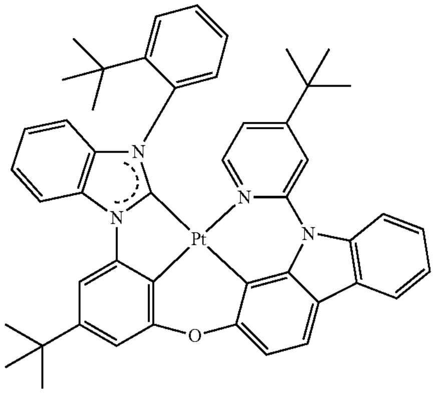

PD37

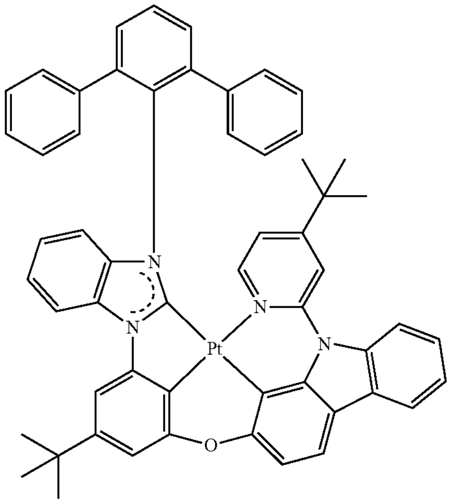

PD38

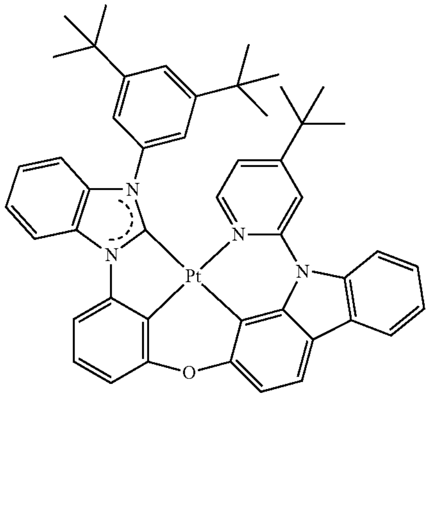

-continued

PD39

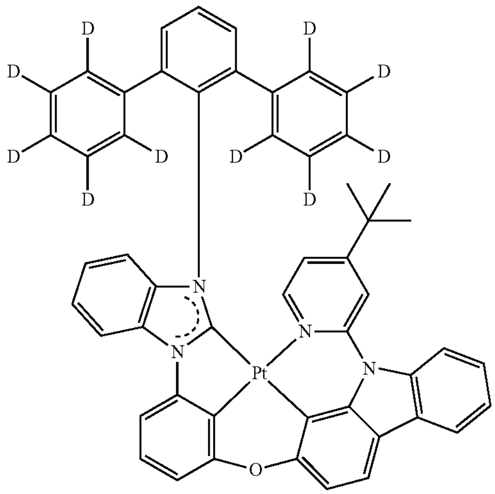

Fluorescent Dopant

In one or more embodiments, the fluorescent dopant may include an amine group-containing compound, a styryl group-containing compound, or any combination thereof.

For example, in some embodiments, the fluorescent dopant may include a compound represented by Formula 501:

Formula 501

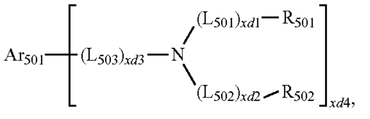

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, in some embodiments, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

For example, in some embodiments, the fluorescent dopant may include: at least one selected from among Compounds FD1 to FD36; 4,4'-bis(2,2-diphenylvinyl)-1,1'-biphenyl (DPVBi); 4,4'-bis[4-(diphenylamino)styryl]biphenyl (DPAVBi); and/or any combination thereof:

FD1
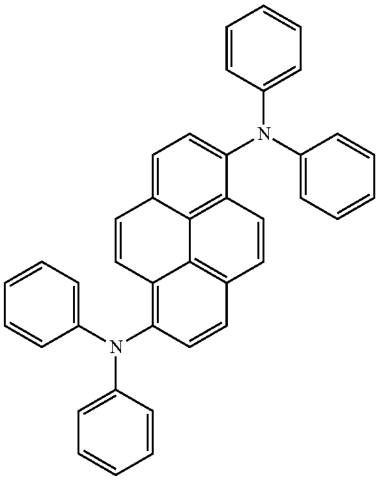
FD2
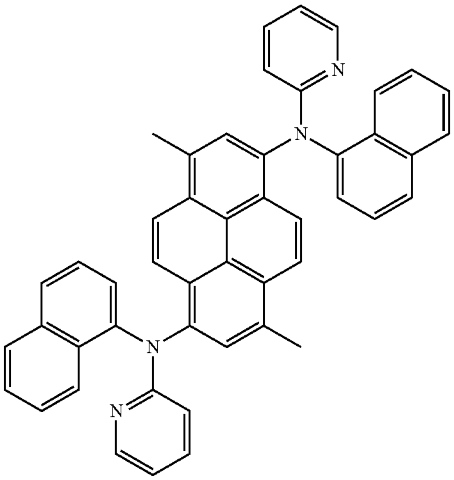
FD3
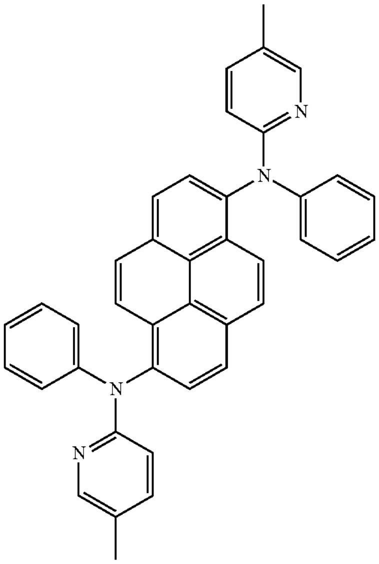
FD4
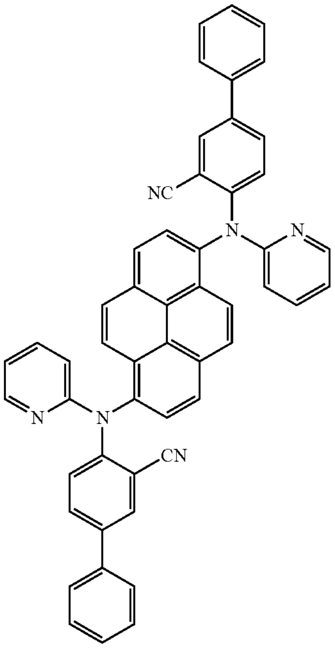
FD5
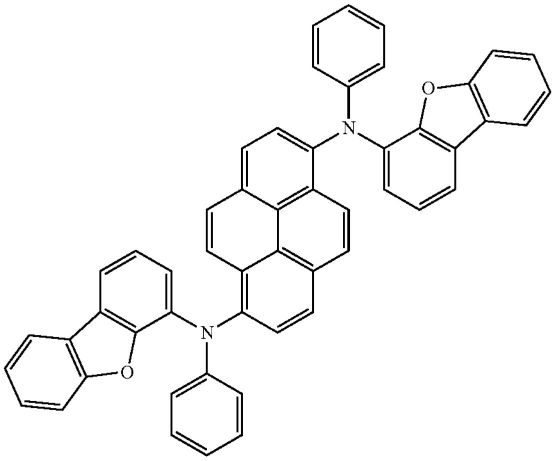
FD6
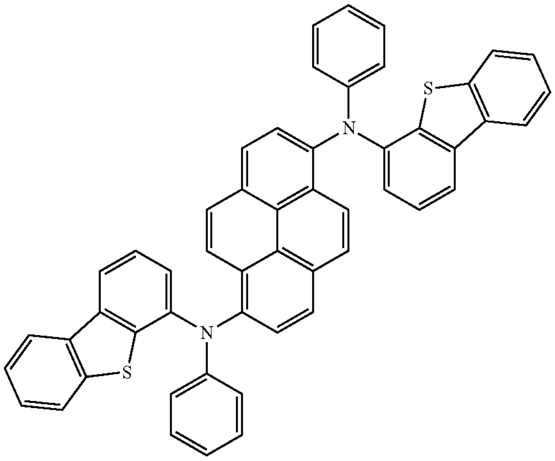

-continued
FD7
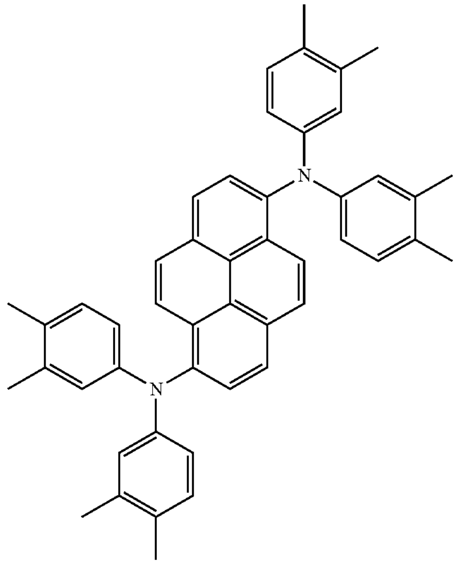
FD8
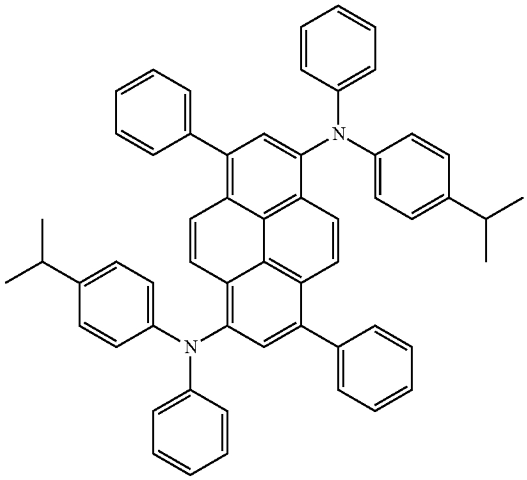
FD9
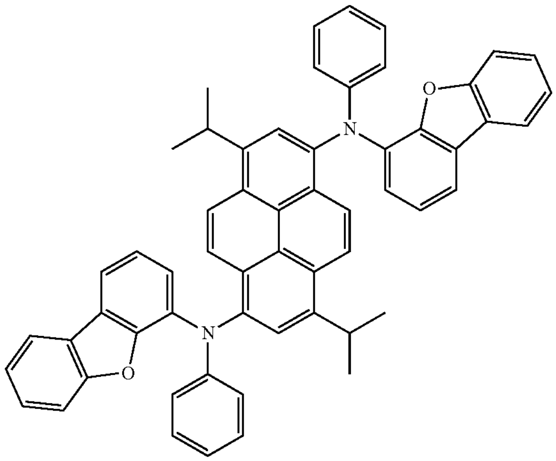
FD10
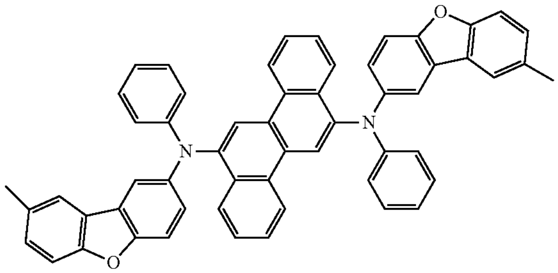
FD11
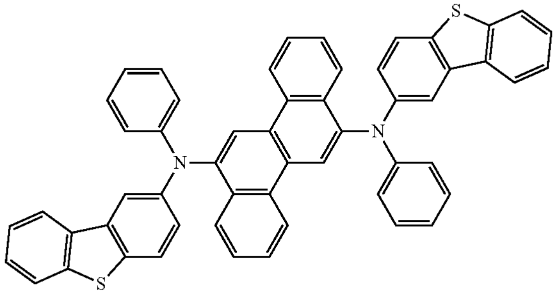
FD12
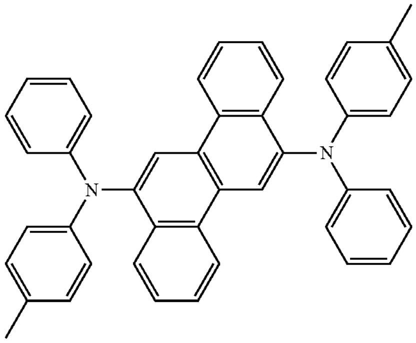

-continued
FD13
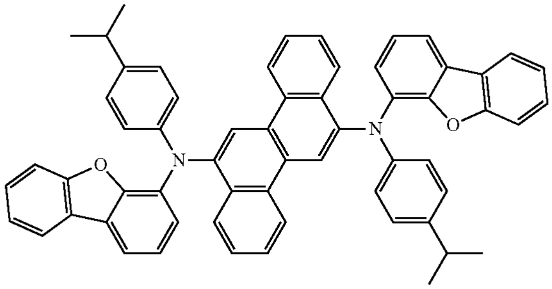
FD14
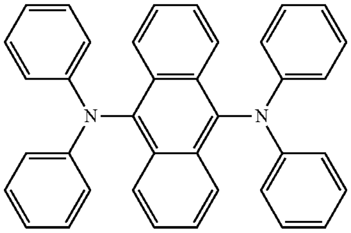
FD15
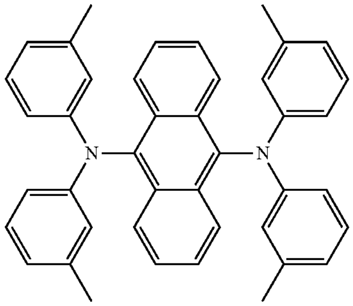
FD16
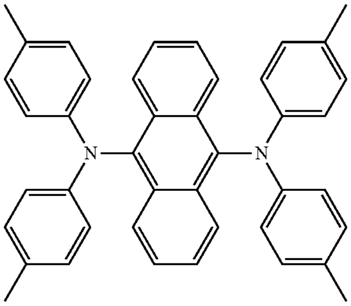
FD17
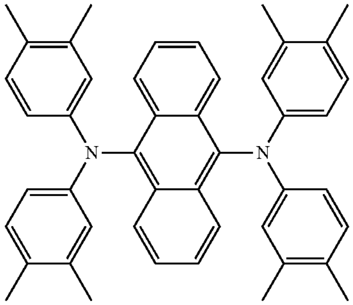
FD18
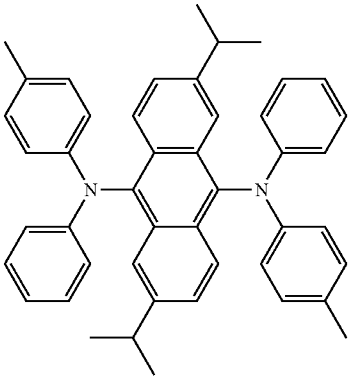
FD19
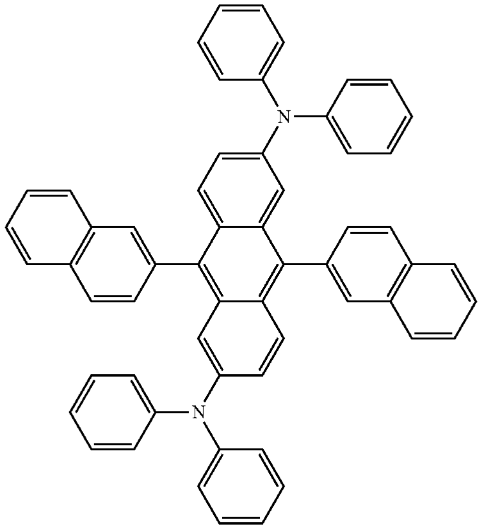
FD20
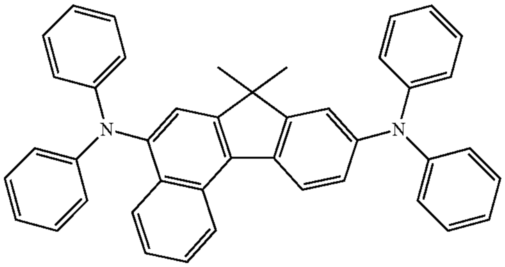

-continued
FD21
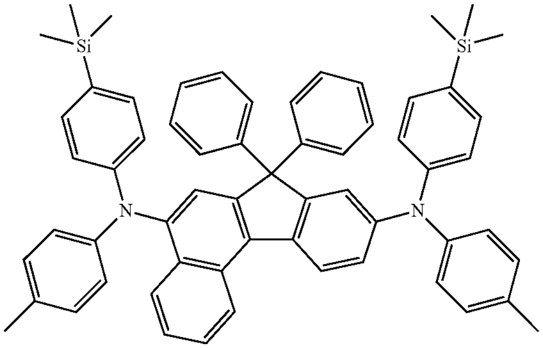
FD22
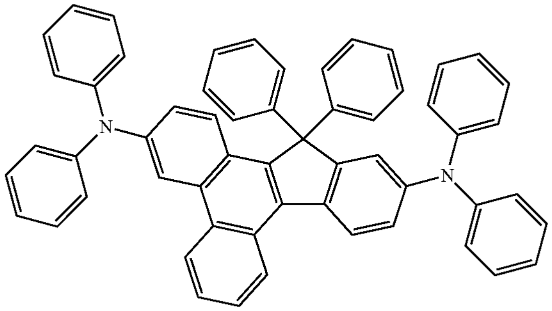
FD23
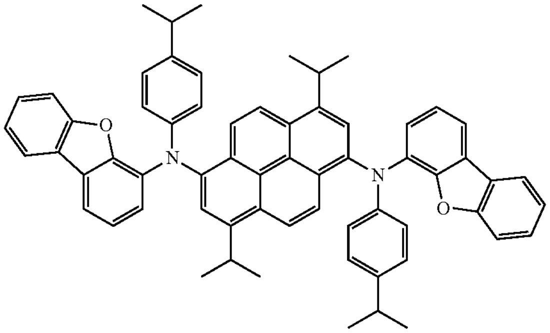
FD24
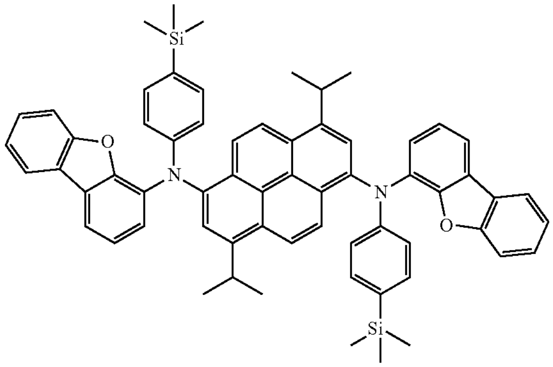
FD25
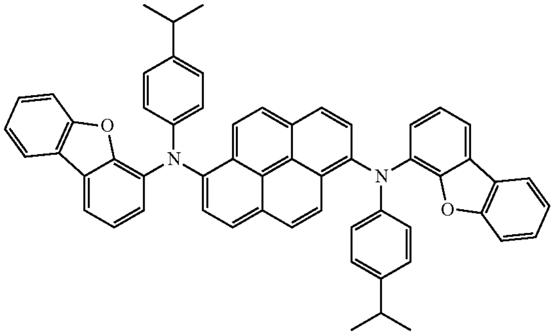
FD26
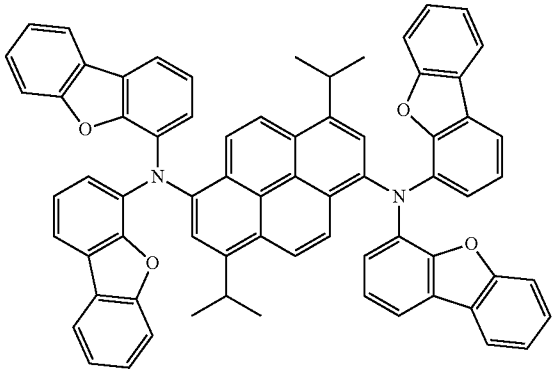
FD27
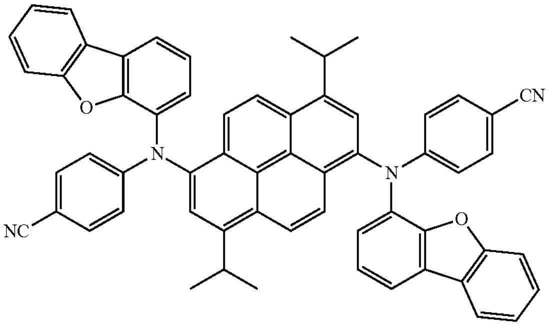
FD28
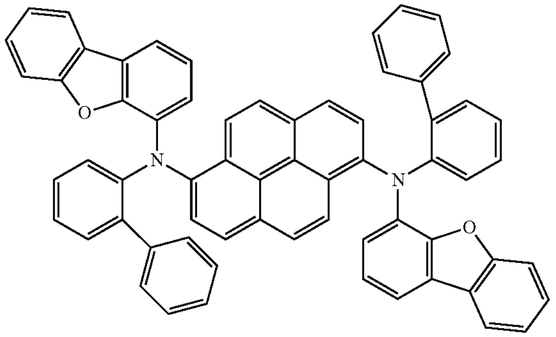

-continued
FD29
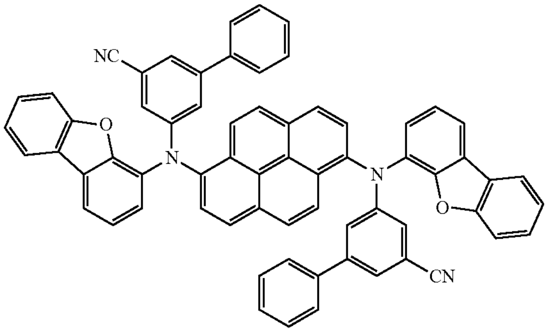
FD30
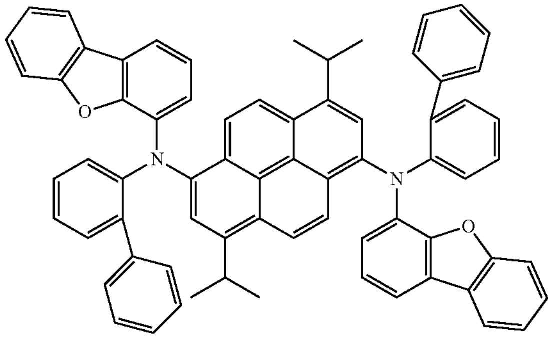
FD31
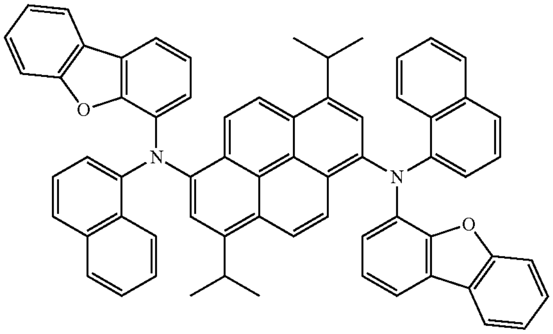
FD32
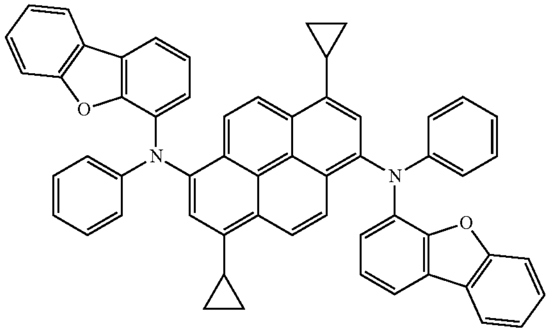
FD33
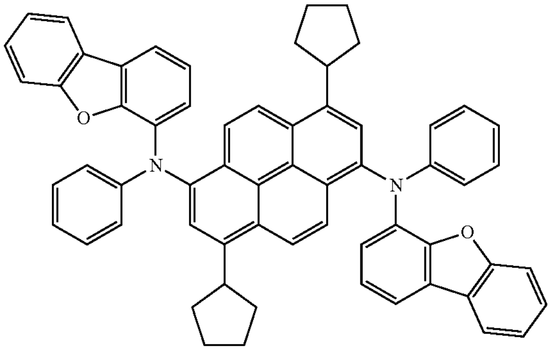
FD34
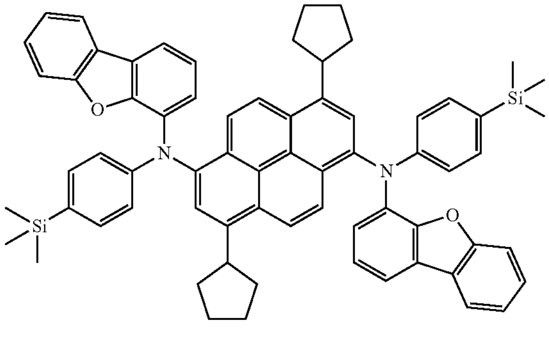
FD35
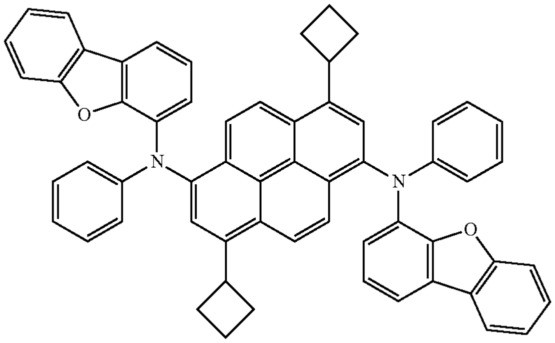
FD36
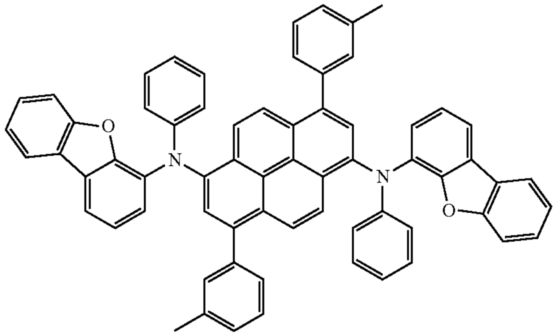

-continued

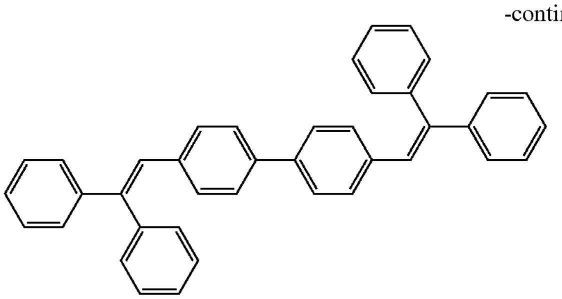

DPVBi

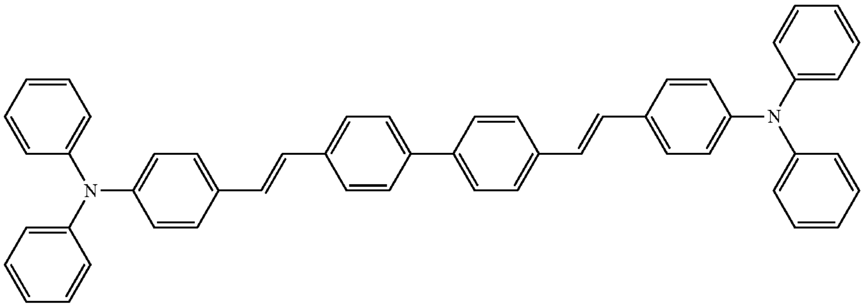

DPAVBi

Delayed Fluorescence Material

In one or more embodiments, the emission layer may include a delayed fluorescence material.

In the present disclosure, the delayed fluorescence material may be selected from compounds capable of emitting delayed fluorescent light based on a delayed fluorescence emission mechanism.

The delayed fluorescence material included in the emission layer may act as a host or a dopant depending on the type or kind of other materials included in the emission layer.

In one or more embodiments, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

For example, in some embodiments, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and/or ii) a material including a $C_8$-$C_{60}$ polycyclic group in which two or more cyclic groups are condensed while sharing boron (B).

Non-limiting examples of the delayed fluorescence material may include at least one selected from among the compounds DF1 to DF9:

DF1

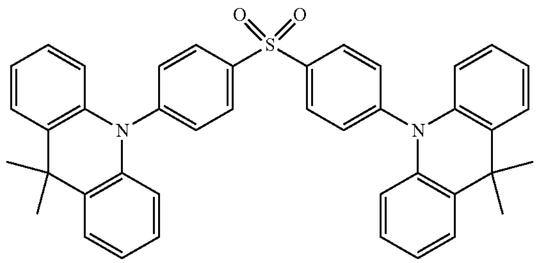

(DMAC-DPS)

DF2

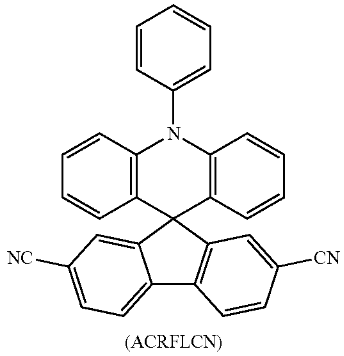

(ACRFLCN)

-continued

DF3

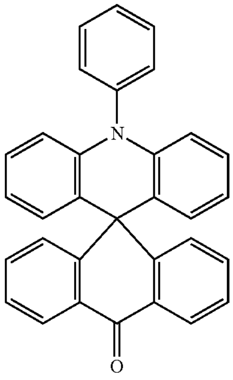

(ACRSA)

DF4

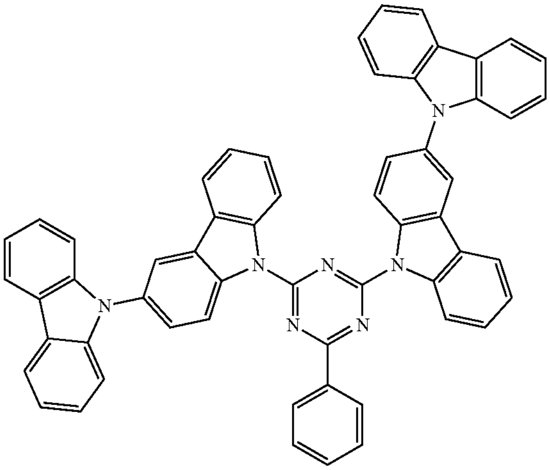

(CC2TA)

DF5

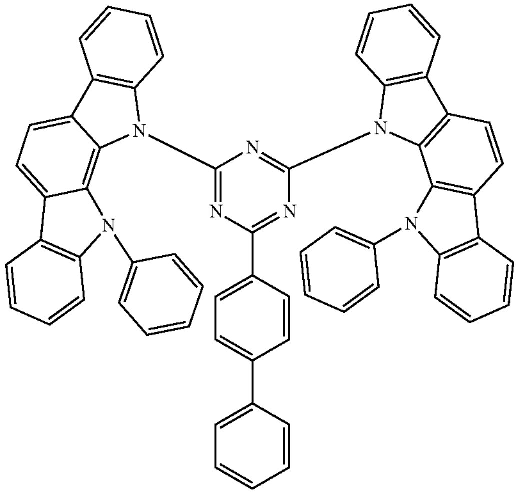

(PIC-TRZ)

-continued

DF6

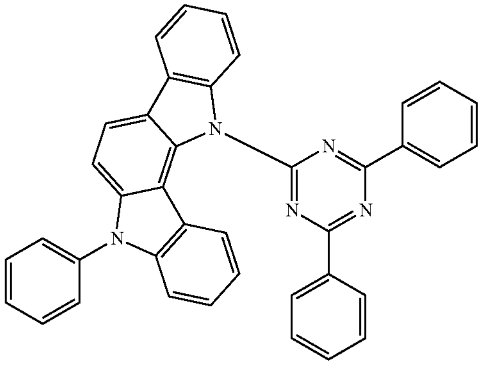

(PIC-TRZ2)

DF7

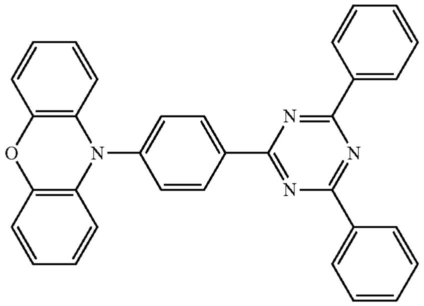

(PXZ-TRZ)

DF8

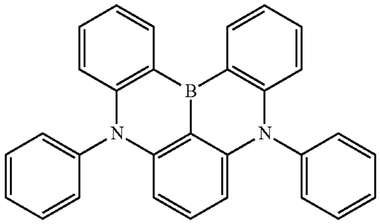

(DABNA-1)

DF9

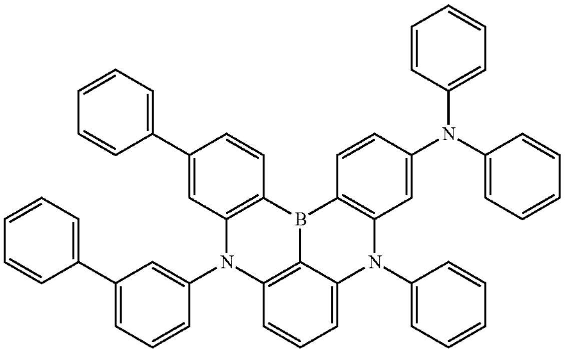

(DABNA-2)

.

Quantum Dot

In one or more embodiments, the emission layer may include a quantum dot.

The term "quantum dot" as utilized herein may refer to a crystal of a semiconductor compound, and may include any material capable of emitting light of one or more suitable emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

The wet chemical process is a method including mixing a precursor material with an organic solvent and then growing a quantum dot particle crystal. When the crystal grows, the organic solvent naturally acts as a dispersant coordinated on the surface of the quantum dot crystal and controls the growth of the crystal so that the growth of quantum dot particles can be controlled or selected through a process which costs lower, and is easier than vapor deposition methods, such as metal organic chemical vapor deposition (MOCVD) or molecular beam epitaxy (MBE), The quantum dot may include Group II-VI semiconductor compounds, Group III-V semiconductor compounds, Group III-VI semiconductor compounds, Group I-III-VI semiconductor compounds, Group IV-VI semiconductor compounds, a Group IV element or compound, or any combination thereof.

Non-limiting examples of the Group II-VI semiconductor compound may be a binary compound, such as CdS, CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Non-limiting examples of the Group III-V semiconductor compound may include: a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In some embodiments, the Group III-V semiconductor compound may further include a Group II element. Non-limiting examples of the Group III-V semiconductor compound further including a Group II element may be InZnP, InGaZnP, InAlZnP, etc.

Non-limiting examples of the Group III-VI semiconductor compound may be: a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; and/or any combination thereof.

Non-limiting examples of the Group I-III-VI semiconductor compound may be: a ternary compound, such as AgInS, $AgInS_2$, CuInS, $CuInS_2$, $CuGaO_2$, $AgGaO_2$, or $AgAlO_2$; or any combination thereof.

Non-limiting examples of the Group IV-VI semiconductor compound may be: a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or any combination thereof.

The Group IV element or compound may include: a single element compound, such as Si or Ge; a binary compound, such as SiC or SiGe; or any combination thereof.

Each element included in a multi-element compound such as the binary compound, the ternary compound, and the quaternary compound may be present at a substantially uniform concentration or non-substantially uniform concentration in a particle.

In some embodiments, the quantum dot may have a single structure in which the concentration of each element in the quantum dot is substantially uniform, or a core-shell dual structure. For example, the material included in the core and the material included in the shell may be different from each other.

The shell of the quantum dot may act as a protective layer that prevents chemical degeneration of the core to maintain semiconductor characteristics, and/or as a charging layer that imparts electrophoretic characteristics to the quantum dot. The shell may be a single layer or a multi-layer. The interface between the core and the shell may have a concentration gradient in which the concentration of an element existing in the shell decreases toward the center of the core.

Non-limiting examples of the shell of the quantum dot may be an oxide of metal, metalloid, or non-metal, a semiconductor compound, or any combination thereof. Non-limiting examples of the oxide of metal, metalloid, or non-metal may be a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $CO_3O_4$, or NiO; a ternary compound, such as $MgAl_2O_4$, $CoFe_2O_4$, $NiFe_2O_4$, or $CoMn_2O_4$; and/or any combination thereof. Non-limiting examples of the semiconductor compound may be, as described herein, a Group II-VI semiconductor compound; a Group III-V semiconductor compound; a Group III-VI semiconductor compound; a Group I-III-VI semiconductor compound; a Group IV-VI semiconductor compound; and/or any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of the emission wavelength spectrum of the quantum dot may be about 45 nm or less, for example, about 40 nm or less, for example, about 30 nm or less, and within these ranges, color purity or color reproducibility may be increased. In some embodiments, because the light emitted through the quantum dot is emitted in all directions, the wide viewing angle may be improved.

In some embodiments, the quantum dot may be in the form of a substantially spherical particle, a pyramidal particle, a multi-arm particle, a cubic nanoparticle, a nanotube particle, a nanowire particle, a nanofiber particle, or a nanoplate particle.

Because the energy band gap may be adjusted by controlling the size of the quantum dot, light having one or more suitable wavelength bands may be obtained from the quantum dot emission layer. Accordingly, by utilizing quantum dots of different sizes, a light-emitting device that emits light of one or more suitable wavelengths may be implemented. In one or more embodiments, the size of the quantum dot may be selected to emit red, green, and/or blue light. In some embodiments, the size of the quantum dot may be configured to emit white light by combination of light of one or more suitable colors.

Electron Transport Region in Interlayer 130

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron-transporting region may include a buffer layer, a hole-blocking layer, an electron control layer, an electron transport layer, an electron injection layer, or any combination thereof.

For example, the electron transport region may include an electron transport layer/electron injection layer structure, a hole-blocking layer/electron transport layer/electron injection layer structure, an electron control layer/electron transport layer/electron injection layer structure, or a buffer layer/electron transport layer/electron injection layer structure, the constituting layers of each structure being sequentially stacked from an emission layer in the stated order.

In one or more embodiments, the electron transport region (for example, the buffer layer, the hole-blocking layer, the electron control layer, or the electron transport layer in the electron transport region) may include a metal-free compound including at least one π electron-deficient nitrogen-containing $C_1$-$C_{60}$ cyclic group.

For example, in some embodiments, the electron transport region may include a compound represented by Formula 601:

$$[Ar_{601}]_{xe11}\text{-}[(L_{601})_{xe1}\text{-}R_{601}]_{xe21}, \quad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each be the same as described herein with respect to $Q_1$, xe21 may be 1, 2, 3, 4, or 5, and at least one selected from among $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked to each other via a single bond.

In some embodiments, $Ar_{601}$ in Formula 601 may be a substituted or unsubstituted anthracene group.

In some embodiments, the electron transport region may include a compound represented by Formula 601-1:

Formula 601-1

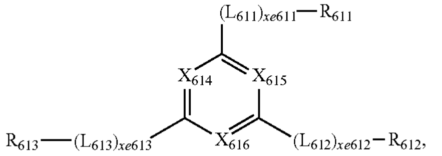

wherein, in Formula 601-1, $X_{614}$ may be N or $C(R_{614})$, $X_{615}$ may be N or $C(R_{615})$, $X_{616}$ may be N or $C(R_{616})$, and at least one selected from among $X_{614}$ to $X_{616}$ may be N, $L_{611}$ to $L_{613}$ may each be the same as described herein with respect to $L_{601}$, xe611 to xe613 may each be the same as described herein with respect to xe1, $R_{611}$ to $R_{613}$ may each be the same as described herein with respect to $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

In one or more embodiments, the electron transport region may include at least one selected from among Compounds ET1 to ET46, 2,9-dimethyl-4,7-diphenyl-1,10-phenanthroline (BCP), 4,7-diphenyl-1,10-phenanthroline (Bphen), Alq3, bis(2-methyl-8-quinolinolato-N1,O8)-(1,1'-biphenyl-4-olato)aluminum (BAlq), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), and/or any combination thereof:

ET1

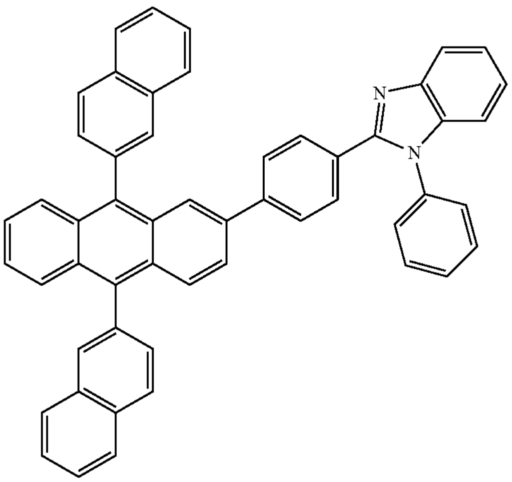

ET2

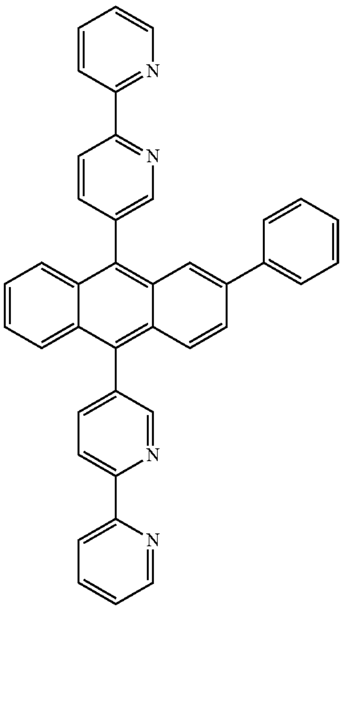

-continued
ET3
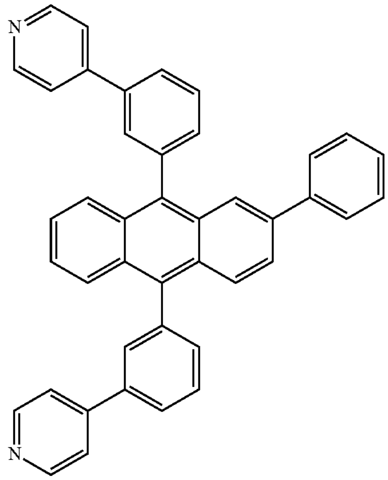
ET4
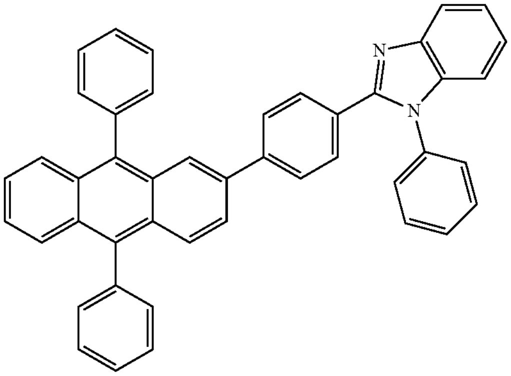
ET5
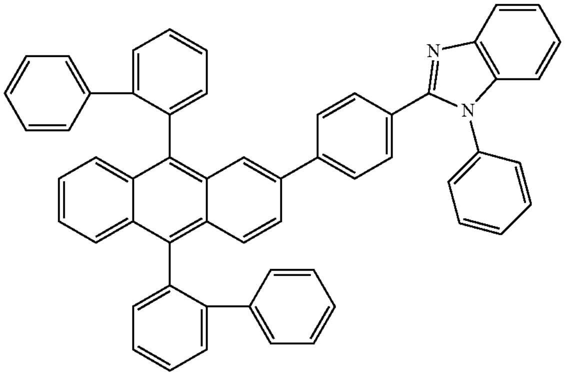
-continued
ET6
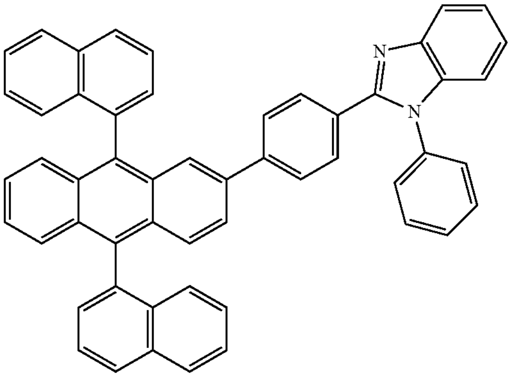
ET7
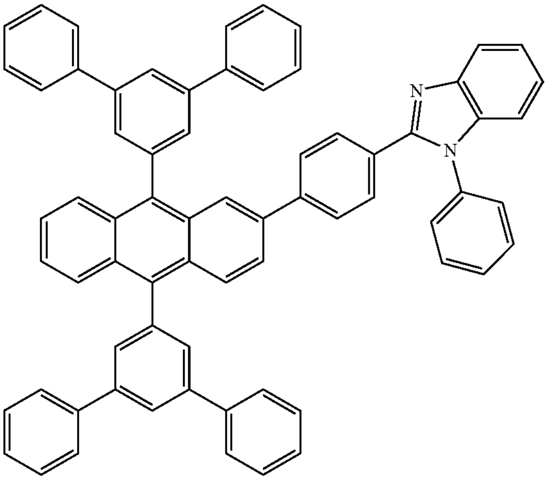
ET8
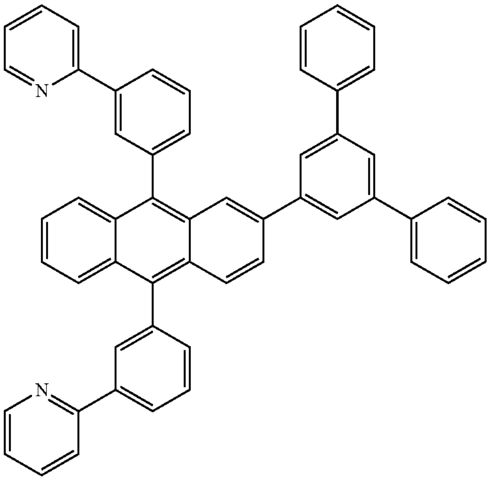

-continued
ET9
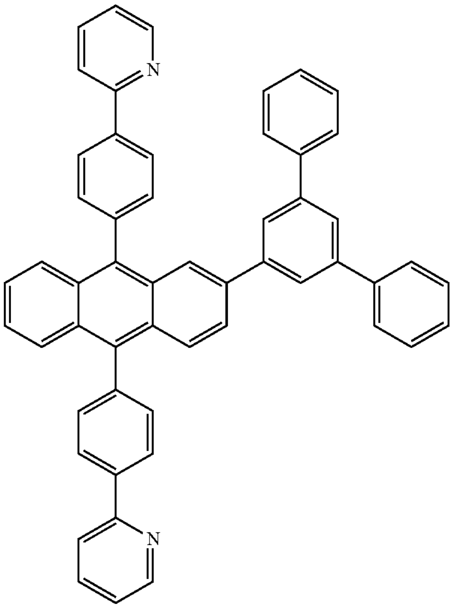
ET10
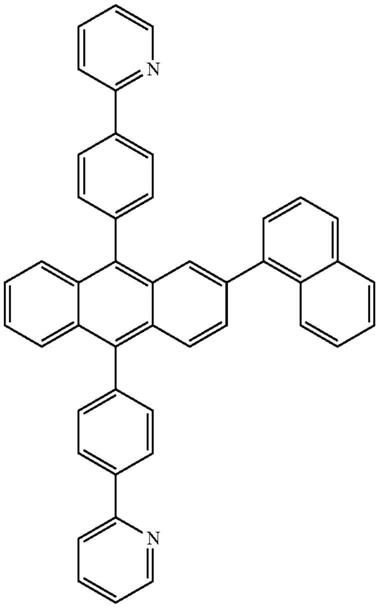
-continued
ET11
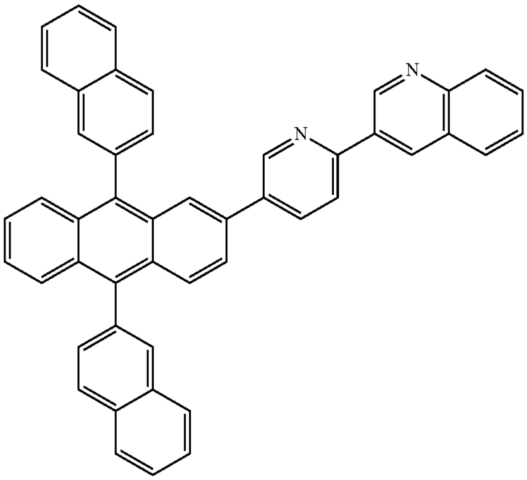
ET12
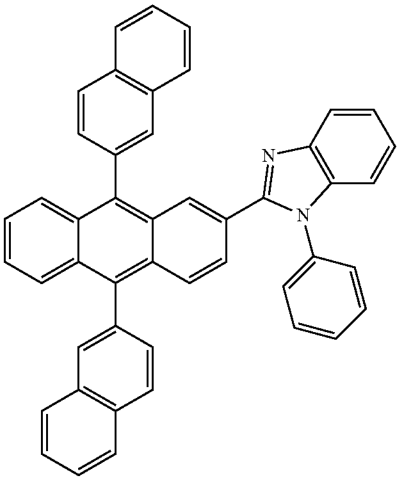
ET13
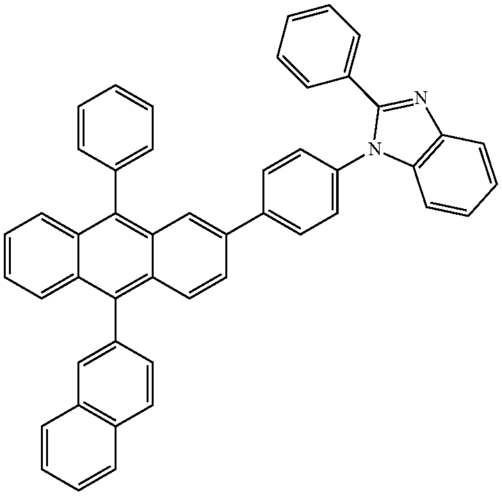

-continued
ET14
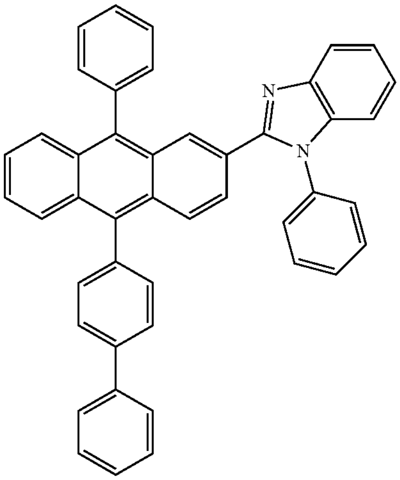
ET15
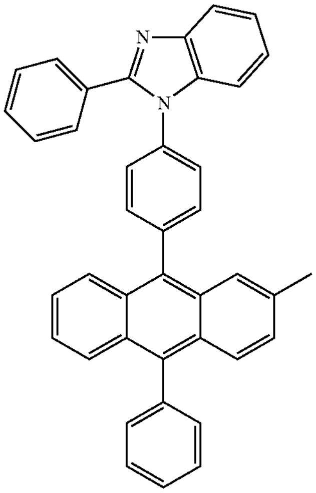
ET16
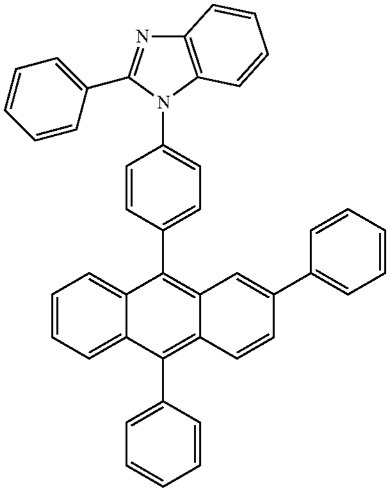
-continued
ET17
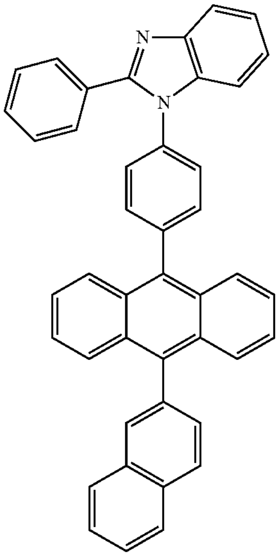
ET18
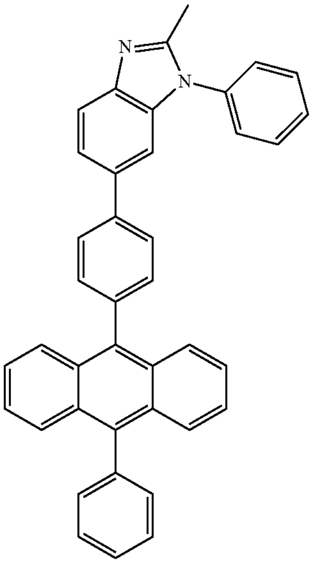
ET19
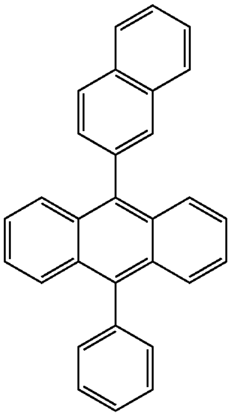

-continued
ET20
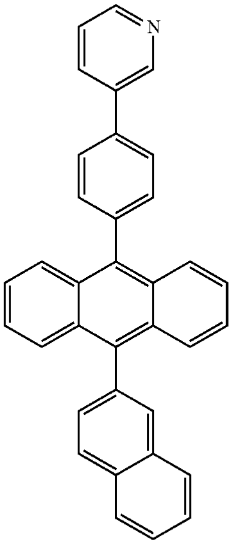
ET21
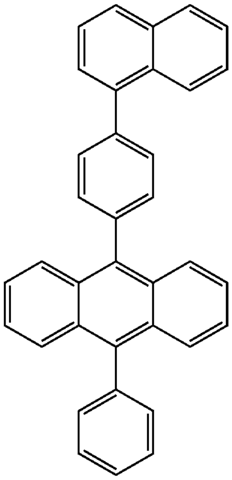
ET22
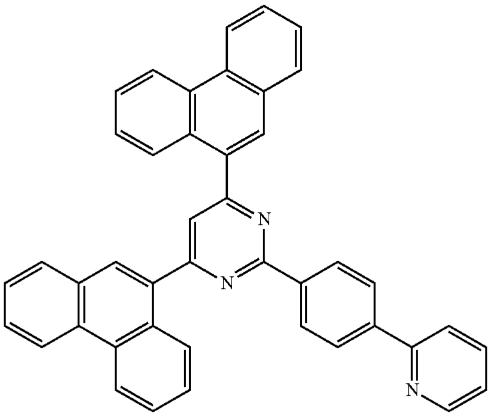
-continued
ET23
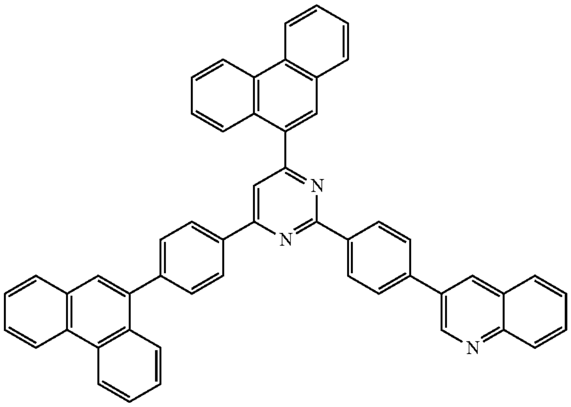
ET24
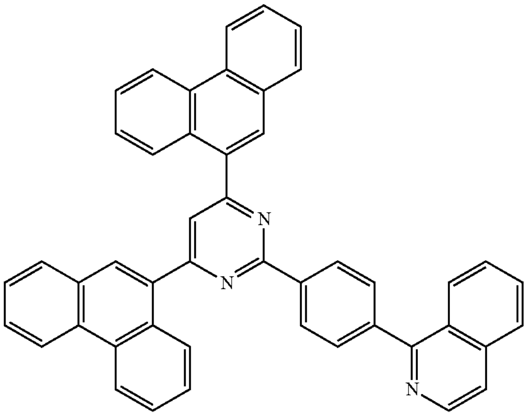
ET25
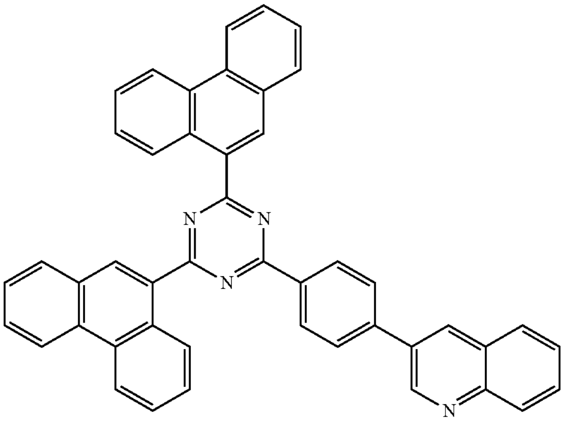

-continued
ET26
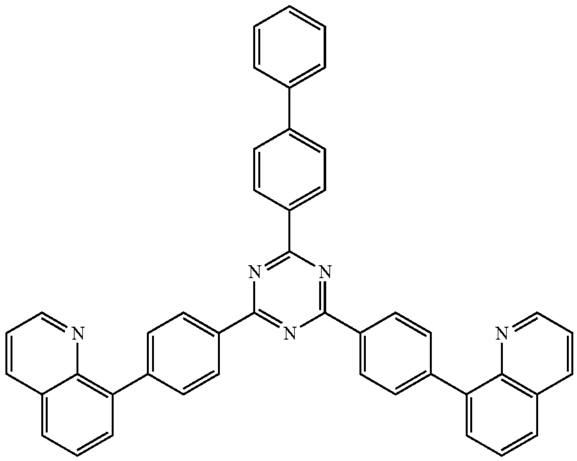
ET27
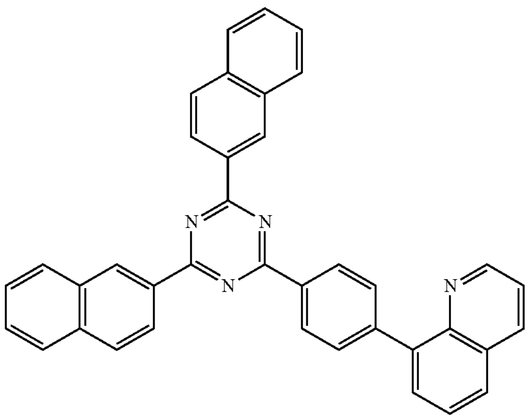
ET28
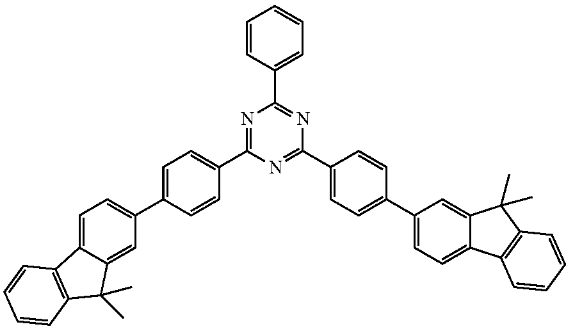
-continued
ET29
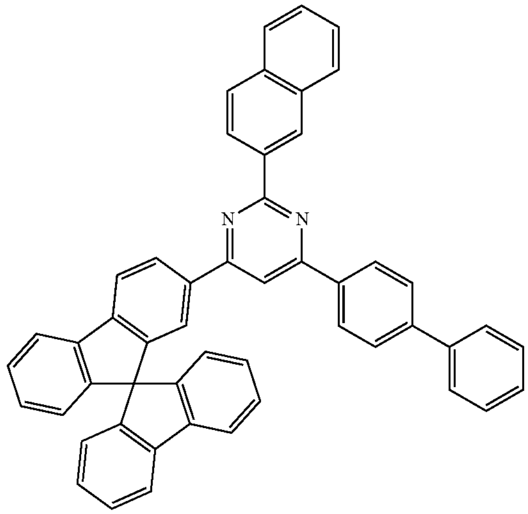
ET30
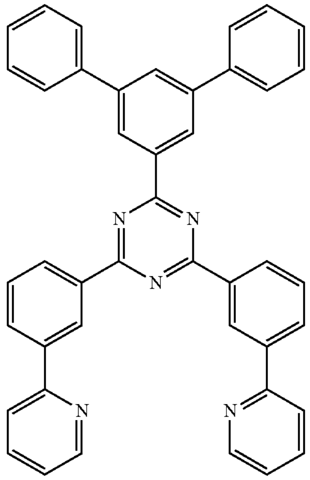
ET31
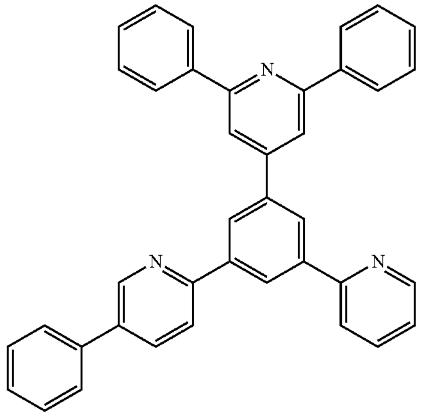

-continued
ET32
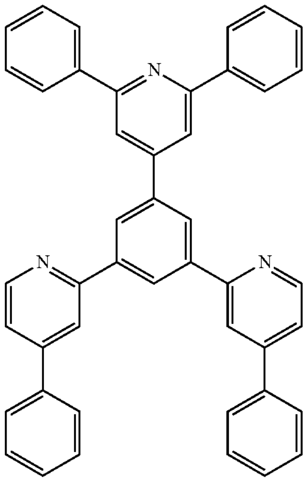
ET33
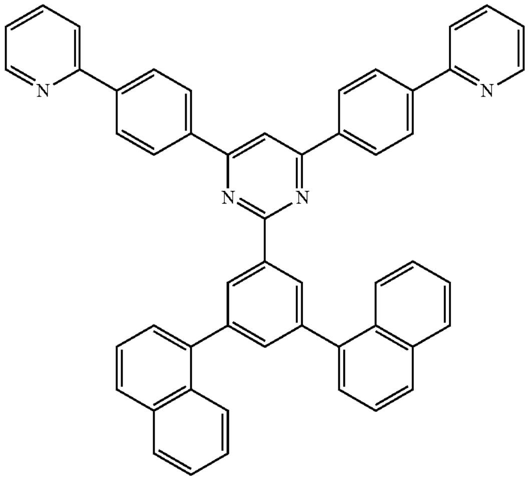
ET34
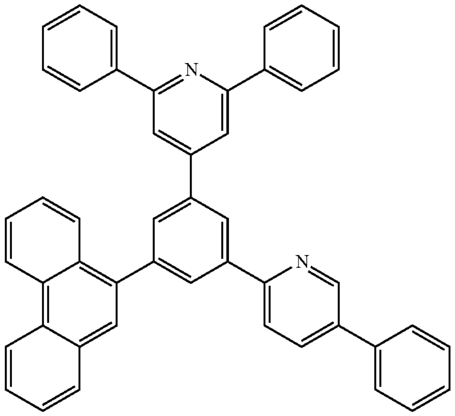
-continued
ET35
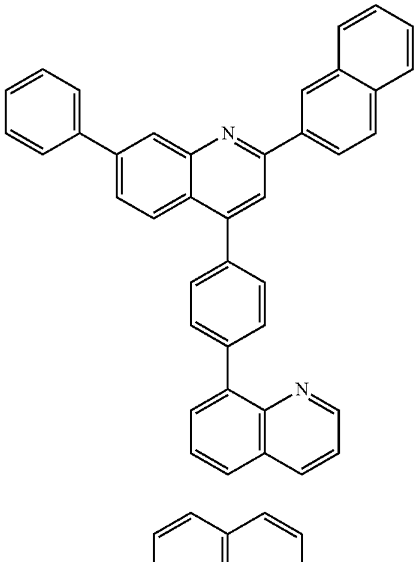
ET36
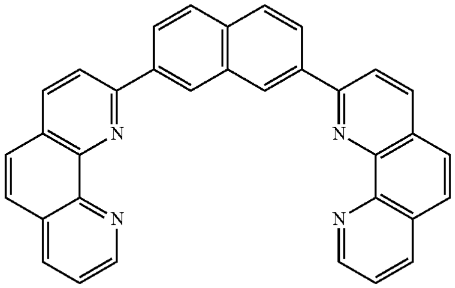
ET37
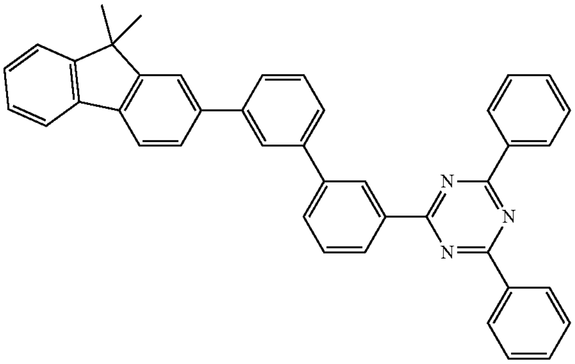
ET38
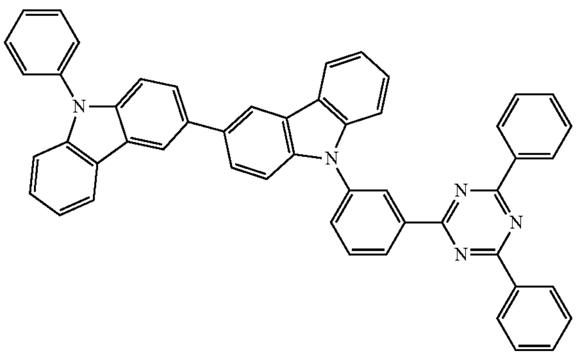

ET39
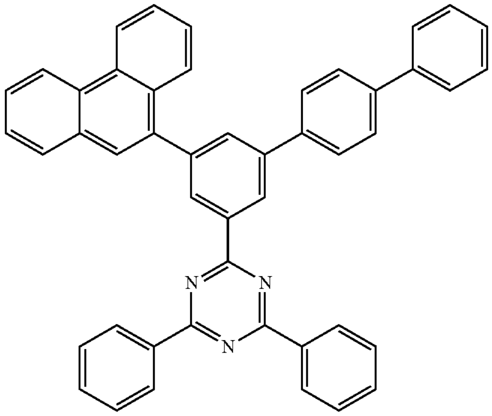
ET40
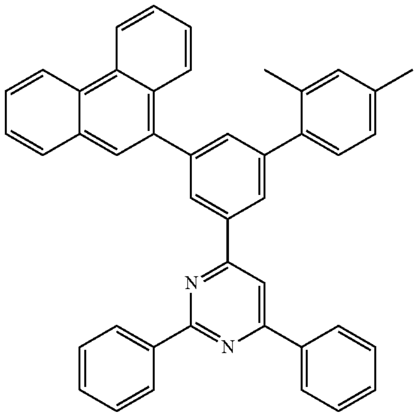
ET41
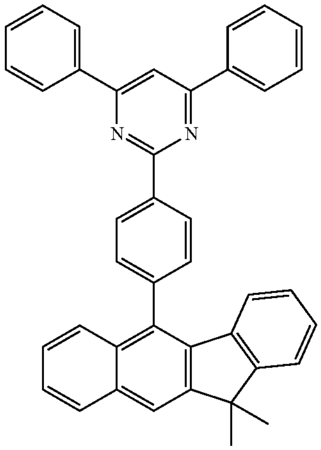
ET42
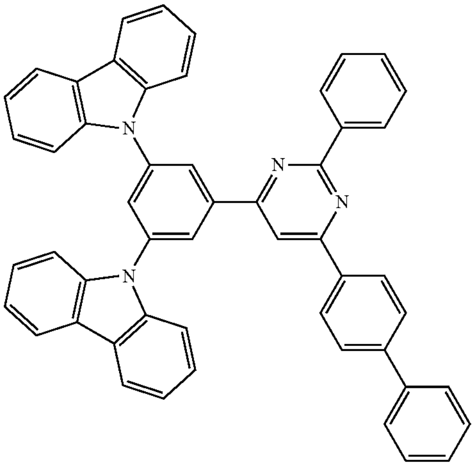
ET43
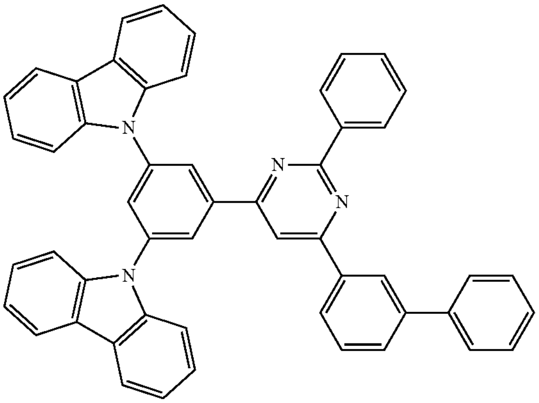
ET44
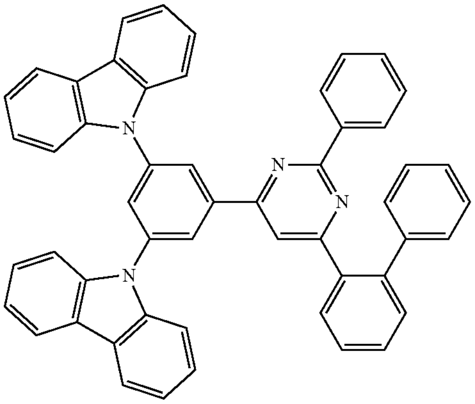
ET45
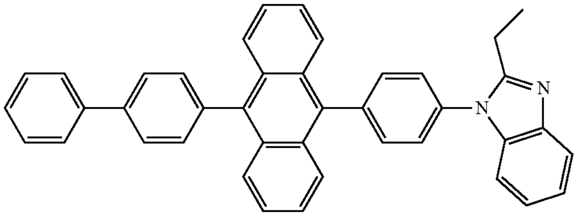

-continued

ET46

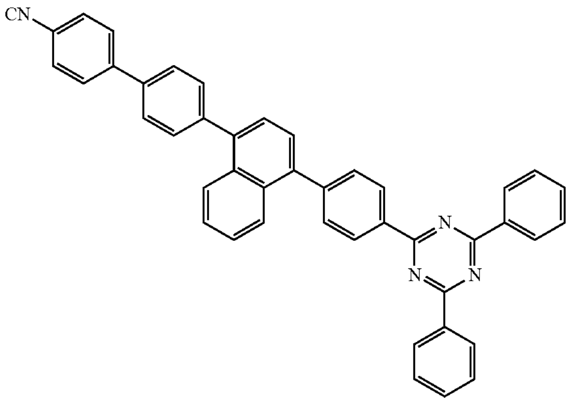

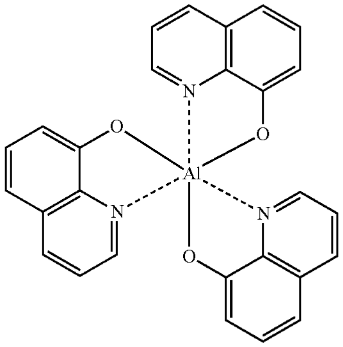

Alq3

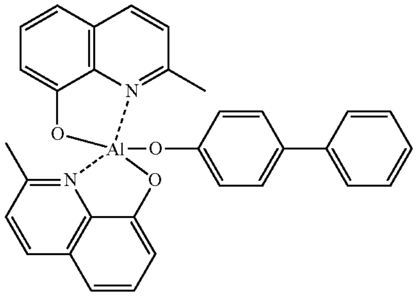

BAlq

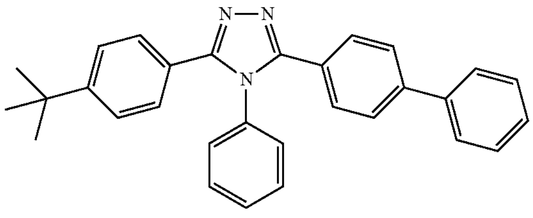

TAZ

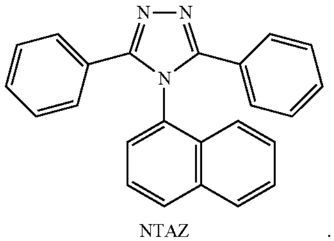

NTAZ .

A thickness of the electron transport region may be from about 100 Å to about 5,000 Å, for example, about 160 Å to about 4,000 Å. When the electron transport region includes a buffer layer, a hole-blocking layer, an electron control layer, an electron transport layer, or any combination thereof, the thickness of the buffer layer, the hole-blocking layer, or the electron control layer may each independently be from about 20 Å to about 1000 Å, for example, about 30 Å to about 300 Å, and the thickness of the electron transport layer may be from about 100 Å to about 1000 Å, for example, about 150 Å to about 500 Å. When the thicknesses of the buffer layer, the hole blocking layer, the electron control layer, the electron transport layer, and/or the electron transport region are within these ranges, satisfactory electron transporting characteristics may be obtained without a substantial increase in driving voltage.

In one or more embodiments, the electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, in some embodiments, the metal-containing material may include a Li complex. The Li complex may include, for example, Compound ET-D1 (LiQ) or ET-D2:

ET-D1

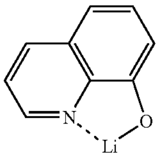

ET-D2

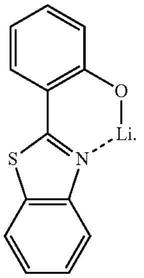

In one or more embodiments, the electron transport region may include an electron injection layer that facilitates the injection of electrons from the second electrode 150. The electron injection layer may directly contact the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, or iodides), or tellurides of the alkali metal, the alkaline earth metal, and the rare earth metal, or any combination thereof.

The alkali metal-containing compound may include: alkali metal oxides, such as $Li_2O$, $Cs_2O$, or $K_2O$; alkali metal halides, such as LiF, NaF, CsF, KF, LiI, NaI, CsI, or KI; or any combination thereof. The alkaline earth metal-containing compound may include an alkaline earth metal compound, such as BaO, SrO, CaO, $Ba_xSr_{1-x}O$ (wherein x is a real number satisfying the condition of $0<x<1$), $Ba_xCa_{1-x}O$ (wherein x is a real number satisfying the condition of $0<x<1$), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Non-limiting examples of the lanthanide metal telluride may include (e.g., may be) LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and/or $Lu_2Te_3$.

The alkali metal complex, the alkaline earth-metal complex, and the rare earth metal complex may include i) one of ions of the alkali metal, the alkaline earth metal, and the rare earth metal, respectively, and ii) a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may include (e.g., consist of): i) an alkali metal-containing compound (for example, an alkali metal halide); or ii) a) an alkali metal-containing compound (for example, an alkali metal halide), and b) an alkali metal, an alkaline earth metal, a rare earth metal, or any combination thereof. For example, the electron injection layer may be a KI:Yb co-deposited layer, an RbI:Yb co-deposited layer, a LiF:Yb co-deposited layer, and/or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

A thickness of the electron injection layer may be in a range of about 1 Å to about 100 Å, and, for example, about 3 Å to about 90 Å. When the thickness of the electron injection layer is within the ranges described above, satisfactory electron injection characteristics may be obtained without a substantial increase in driving voltage.

Second Electrode 150

The second electrode 150 may be on the interlayer 130 having a structure as described above. The second electrode 150 may be a cathode, which is an electron injection electrode, and as the material for the second electrode 150, a metal, an alloy, an electrically conductive compound, or any combination thereof, each having a low-work function, may be utilized.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including a plurality of layers.

Capping Layer

A first capping layer may be located outside the first electrode 110, and/or a second capping layer may be located outside the second electrode 150. In some embodiments, the organic light-emitting device 10 may have a structure in which the first capping layer, the first electrode 110, the interlayer 130, and the second electrode 150 are sequentially stacked in the stated order, a structure in which the first electrode 110, the interlayer 130, the second electrode 150, and the second capping layer are sequentially stacked in the stated order, or a structure in which the first capping layer, the first electrode 110, the interlayer 130, the second electrode 150, and the second capping layer are sequentially stacked in the stated order.

In some embodiments, light generated in an emission layer of the interlayer 130 of the organic light-emitting device 10 may be extracted toward the outside through the first electrode 110, which is a semi-transmissive electrode or a transmissive electrode, and the first capping layer. In some embodiment, light generated in an emission layer of the interlayer 130 of the organic light-emitting device 10 may be extracted toward the outside through the second electrode 150, which is a semi-transmissive electrode or a transmissive electrode, and the second capping layer.

The first capping layer and the second capping layer may increase external emission efficiency according to the principle of constructive interference. Consequently, the light extraction efficiency of the organic light-emitting device 10 is increased, so that the luminescence efficiency of the organic light-emitting device 10 may be improved.

Each of the first capping layer and the second capping layer may include a material having a refractive index of 1.6 or more (at 589 nm).

The first capping layer and the second capping layer may each independently be an organic capping layer including an organic material, an inorganic capping layer including an inorganic material, or an organic-inorganic composite capping layer including an organic material and an inorganic material.

At least one selected from among the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. In some embodiments, the carbocyclic compound, the heterocyclic compound, and the amine group-containing compound may be substituted with a substituent including O, N, S, Se, Si, F, Cl, Br, I, or any combination thereof. In one or more embodiments, at least one selected from among the first capping layer and the second capping layer may each independently include an amine group-containing compound.

For example, in some embodiments, at least one selected from among the first capping layer and the second capping layer may each independently include a compound represented by Formula 201, a compound represented by Formula 202, or any combination thereof.

In one or more embodiments, at least one selected from among the first capping layer and the second capping layer may each independently include at least one selected from Compounds HT28 to HT33, at least one selected from Compounds CP1 to CP6, β-NPB, and/or any combination thereof:

CP1

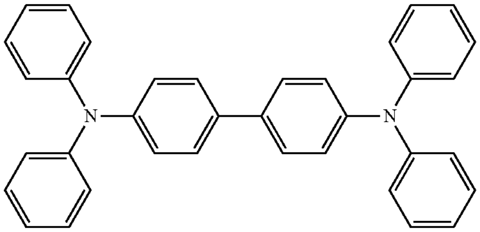

CP2

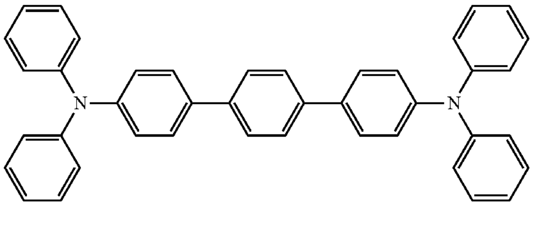

-continued

CP3

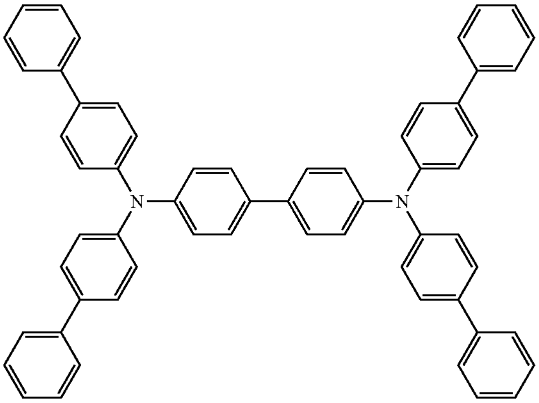

CP4

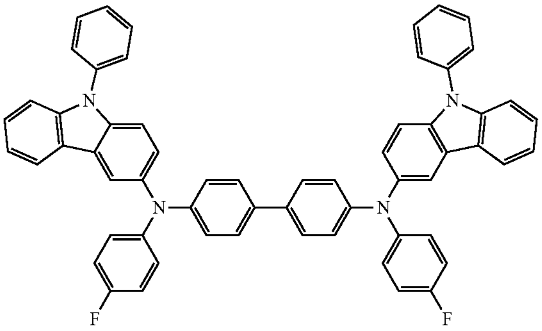

CP5

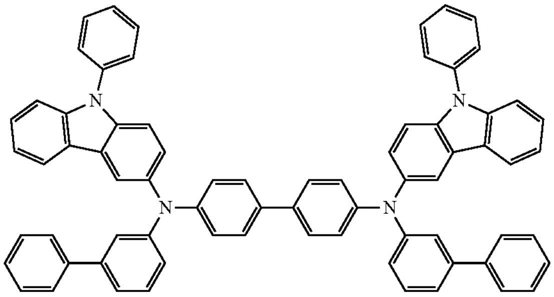

CP6

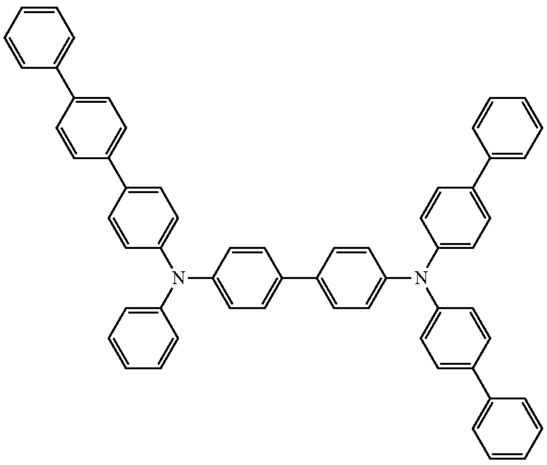

-continued

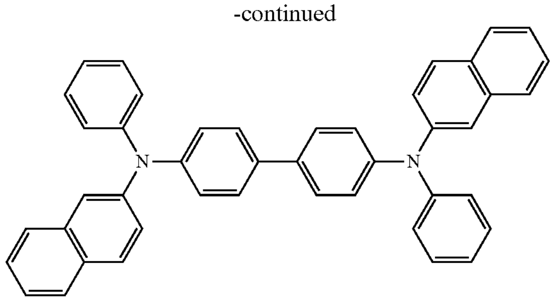

β-NPB

Film

The organometallic compound represented by Formula 1 may be included in one or more suitable films. Accordingly, according to one or more aspects of embodiments of the present disclosure, a film including the organometallic compound represented by Formula 1 may be provided. The film may be, for example, an optical member (or a light control means) (for example, a color filter, a color conversion member, a capping layer, a light extraction efficiency enhancement layer, a selective light absorbing layer, a polarizing layer, a quantum dot-containing layer, or like), a light-blocking member (for example, a light reflective layer, a light absorbing layer, and/or the like), or a protective member (for example, an insulating layer, a dielectric layer, and/or the like).

Electronic Apparatus

The organic light-emitting device may be included in one or more suitable electronic apparatuses. In one or more embodiments, the electronic apparatus including the organic light-emitting device may be a light-emitting apparatus, an authentication apparatus, and/or the like.

In one or more embodiments, the electronic apparatus (for example, a light-emitting apparatus) may further include, in addition to the light-emitting device, i) a color filter, ii) a color conversion layer, or iii) a color filter and a color conversion layer. The color filter and/or the color conversion layer may be located in at least one direction in which light emitted from the light-emitting device travels. For example, in one or more embodiments, the light emitted from the light-emitting device may be blue light or white light (e.g., combined white light). For details on the light-emitting device, related description provided above may be referred to. In one or more embodiments, the color conversion layer may include a quantum dot. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among the subpixel areas to define each of the subpixel areas.

The color filter may further include a plurality of color filter areas and light-shielding patterns located among the color filter areas, and the color conversion layer may further include a plurality of color conversion areas and light-shielding patterns located among the color conversion areas.

The plurality of color filter areas (or the plurality of color conversion areas) may include a first area emitting first color light, a second area emitting second color light, and/or a third area emitting third color light, wherein the first color light, the second color light, and/or the third color light may have different maximum emission wavelengths from one another. For example, in some embodiments, the first color light may be red light, the second color light may be green light, and the third color light may be blue light. For example, in one or more embodiments, the plurality of color filter areas (or the plurality of color conversion areas) may include quantum dots. In some embodiments, the first area may include a red quantum dot to emit red light, the second area may include a green quantum dot to emit green light, and the third area may not include (e.g., may exclude) a quantum dot. For details on the quantum dot, related descriptions provided herein may be referred to. The first area, the second area, and/or the third area may each include a scatter.

For example, in one or more embodiments, the light-emitting device may be to emit first light, the first area may be to absorb the first light to emit first-first color light, the second area may be to absorb the first light to emit second-first color light, and the third area may be to absorb the first light to emit third-first color light. In this regard, the first-first color light, the second-first color light, and the third-first color light may have different maximum emission wavelengths. In some embodiments, the first light may be blue light, the first-first color light may be red light, the second-first color light may be green light, and the third-first color light may be blue light.

In one or more embodiments, the electronic apparatus may further include a thin-film transistor in addition to the organic light-emitting device as described above. The thin-film transistor may include a source electrode, a drain electrode, and an activation layer, wherein one of the source electrode or the drain electrode may be electrically connected to the first electrode or the second electrode of the light-emitting device.

The thin-film transistor may further include a gate electrode, a gate insulating film, and/or the like.

The activation layer may include crystalline silicon, amorphous silicon, an organic semiconductor, an oxide semiconductor, and/or the like.

The electronic apparatus may further include a sealing portion for sealing the organic light-emitting device. The sealing portion may be located between the color filter and/or the color conversion layer and the light-emitting device. The sealing portion may allow light from the organic light-emitting device to be extracted to the outside, while concurrently (e.g., simultaneously) preventing or reducing ambient air and moisture from penetrating into the organic light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the utilization of the electronic apparatus. The functional layers may include a touch screen layer, a polarizing layer, and/or the like. The touch screen layer may be a pressure-sensitive touch screen layer, a capacitive touch screen layer, or an infrared touch screen layer.

The authentication apparatus may further include, in addition to the organic light-emitting device, a biometric information collector. The authentication apparatus may be, for example, a biometric authentication apparatus that authenticates an individual by utilizing biometric information of a living body (for example, fingertips, pupils, etc.).

The electronic apparatus may be applied to one or more suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, one or more suitable measuring instruments, meters (for example, meters for a vehicle, an aircraft, and a vessel), projectors, and/or the like.

DESCRIPTION OF FIGS. 2 AND 3

Figure 2:
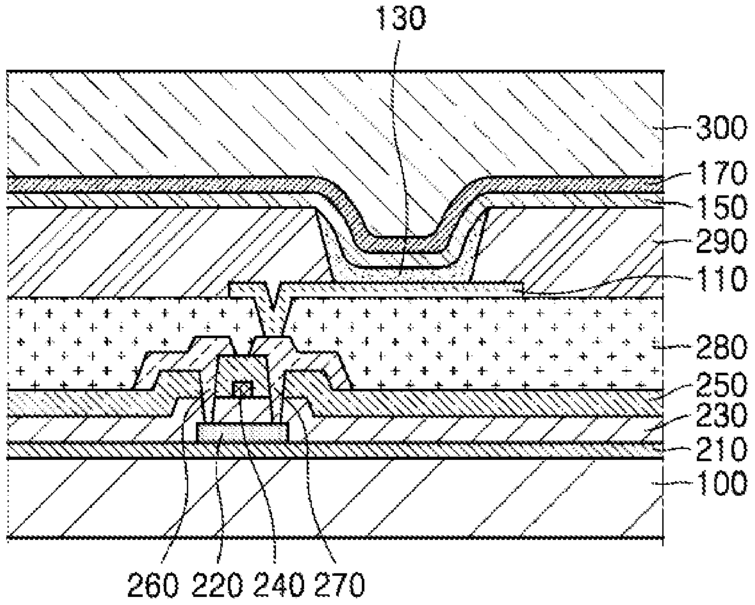
FIG. 2 is a schematic diagram of a structure of an electronic apparatus according to one or more embodiments of the present disclosure.

FIG. 2 is a cross-sectional view showing a light-emitting apparatus according to one or more embodiments of the present disclosure.

The light-emitting apparatus of FIG. 2 may include a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 may prevent or reduce penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, or an oxide semiconductor, and may include a source region, a drain region, and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 may be located between the gate electrode 240 and the source electrode 260 and between the gate electrode 240 and the drain electrode 270, to insulate from one another.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be located in contact with the exposed portions of the source region and the drain region of the activation layer 220, respectively.

The TFT may be electrically connected to a light-emitting device to drive the light-emitting device, and may be covered and protected by a passivation layer 280. The passivation layer 280 may include an inorganic insulating film, an organic insulating film, or any combination thereof. A light-emitting device may be provided on the passivation layer 280. The light-emitting device may include a first electrode 110, an interlayer 130, and a second electrode 150.

The first electrode 110 may be located on the passivation layer 280. The passivation layer 280 may be located to expose a portion of the drain electrode 270, not fully covering the drain electrode 270, and the first electrode 110 may be located to be connected to the exposed portion of the drain electrode 270.

A pixel defining layer 290 including an insulating material may be located on the first electrode 110. The pixel defining layer 290 may expose a certain region of the first electrode 110, and the interlayer 130 may be formed in the exposed region of the first electrode 110. The pixel defining layer 290 may be a polyimide or polyacrylic organic film. In some embodiments, at least some layers of the interlayer 130 may extend beyond the upper portion of the pixel defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or any combination thereof; or any combination of the inorganic films and the organic films.

Figure 3:
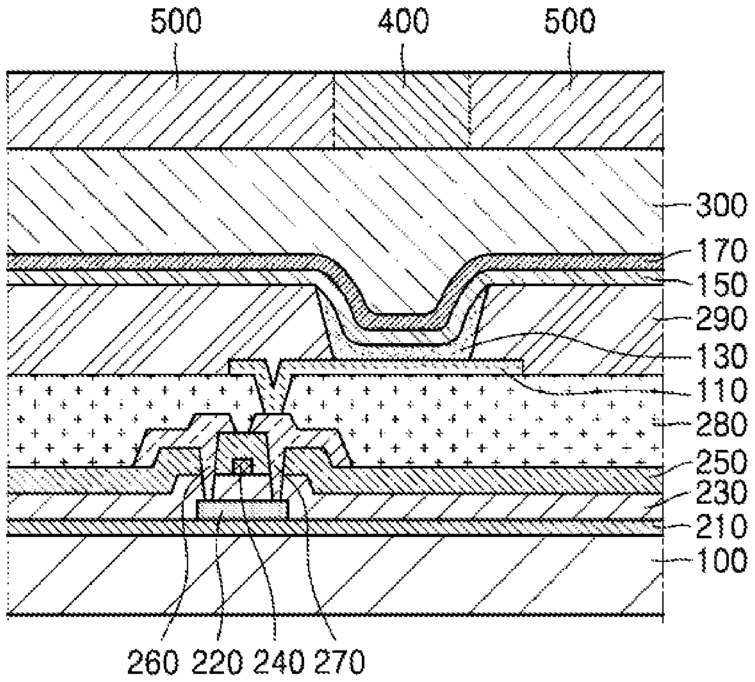
FIG. 3 is a schematic diagram of an electronic apparatus according to one or more embodiments of the present disclosure.

FIG. 3 shows a cross-sectional view showing a light-emitting apparatus according to one or more embodiments of the present disclosure.

The light-emitting apparatus of FIG. 3 is substantially the same as the light-emitting apparatus of FIG. 2, except that a light-shielding pattern 500 and a functional region 400 are additionally located on the encapsulation portion 300. The functional region 400 may be i) a color filter area, ii) a color conversion area, or iii) a combination of the color filter area and the color conversion area. In one or more embodiments, the light-emitting device included in the light-emitting apparatus of FIG. 3 may be a tandem light-emitting device.

DESCRIPTION OF FIG. 4

Figure 4:
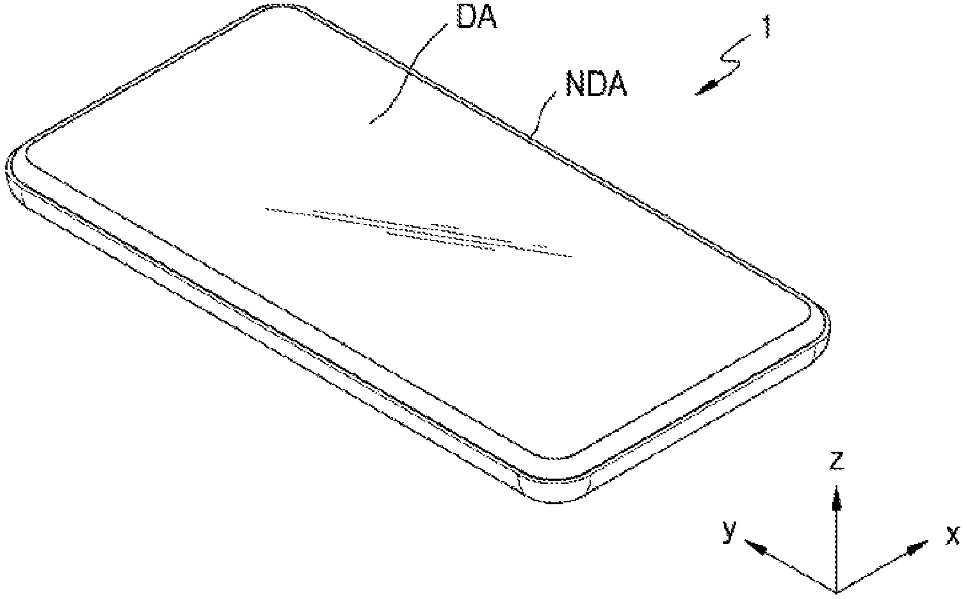
FIG. 4 is a schematic perspective view of electronic equipment including a light-emitting device according to one or more embodiments of the present disclosure.

FIG. 4 is a schematic perspective view of electronic equipment 1 including a light-emitting device according to one or more embodiments of the present disclosure. The electronic equipment 1 may be, as a device apparatus that displays a moving image or still image, portable electronic equipment, such as a mobile phone, a smart phone, a tablet personal computer (PC), a mobile communication terminal, an electronic notebook, an electronic book, a portable multimedia player (PMP), a navigation, or a ultra mobile PC (UMPC), as well as one or more suitable products, such as a television, a laptop, a monitor, a billboard or an Internet of things (IOT). The electronic equipment 1 may be such a product above or a part thereof. In some embodiments, the electronic equipment 1 may be a wearable device, such as a smart watch, a watch phone, a glasses-type or kind display, or a head mounted display (HMD), or a part of the wearable device. However, embodiments of the present disclosure are not limited thereto. For example, in some embodiments, the electron equipment 1 may include a dashboard of a vehicle, a center fascia of a vehicle, a center information display arranged on a dashboard of a vehicle, a room mirror display replacing a side mirror of a vehicle, an entertainment display for the rear seat of a vehicle or a display arranged on the back of the front seat, or a head up display (HUD) installed in the front of a vehicle or projected on a front window glass, or a computer-generated hologram augmented-reality head up display (CGH AR HUD). FIG. 4 illustrates an embodiment in which the electronic equipment 1 is a smartphone for convenience of explanation.

The electronic equipment 1 may include a display area DA and a non-display area NDA outside the display area DA. A display device of the electronic equipment 1 may implement an image through an array of a plurality of pixels that are two-dimensionally arranged in the display area DA.

The non-display area NDA is an area that does not display an image, and may entirely surround the display area DA. On the non-display area NDA, a driver for providing electrical signals or power to display devices arranged on the display area DA may be arranged. On the non-display area NDA, a pad, which is an area to which an electronic element or a printing circuit board may be electrically connected, may be arranged.

In the electronic equipment 1, a length in the x-axis direction and a length in the y-axis direction may be different from each other. For example, as shown in FIG. 4, the length in the x-axis direction may be shorter than the length in the y-axis direction. In one or more embodiments, the length in the x-axis direction may be the same as the length in the y-axis direction. In one or more embodiments, the length in the x-axis direction may be longer than the length in the y-axis direction.

DESCRIPTIONS OF FIGS. 5 AND 6A TO 6C

Figure 5:
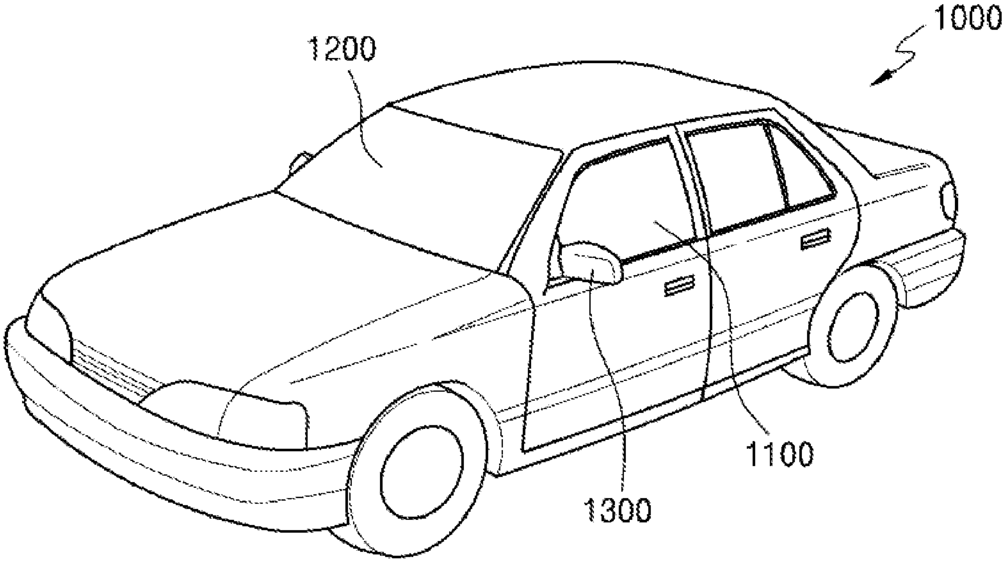
FIG. 5 is a schematic diagram of an exterior of a vehicle as electronic equipment including a light-emitting device according to one or more embodiments of the present disclosure.
Figure 6A:
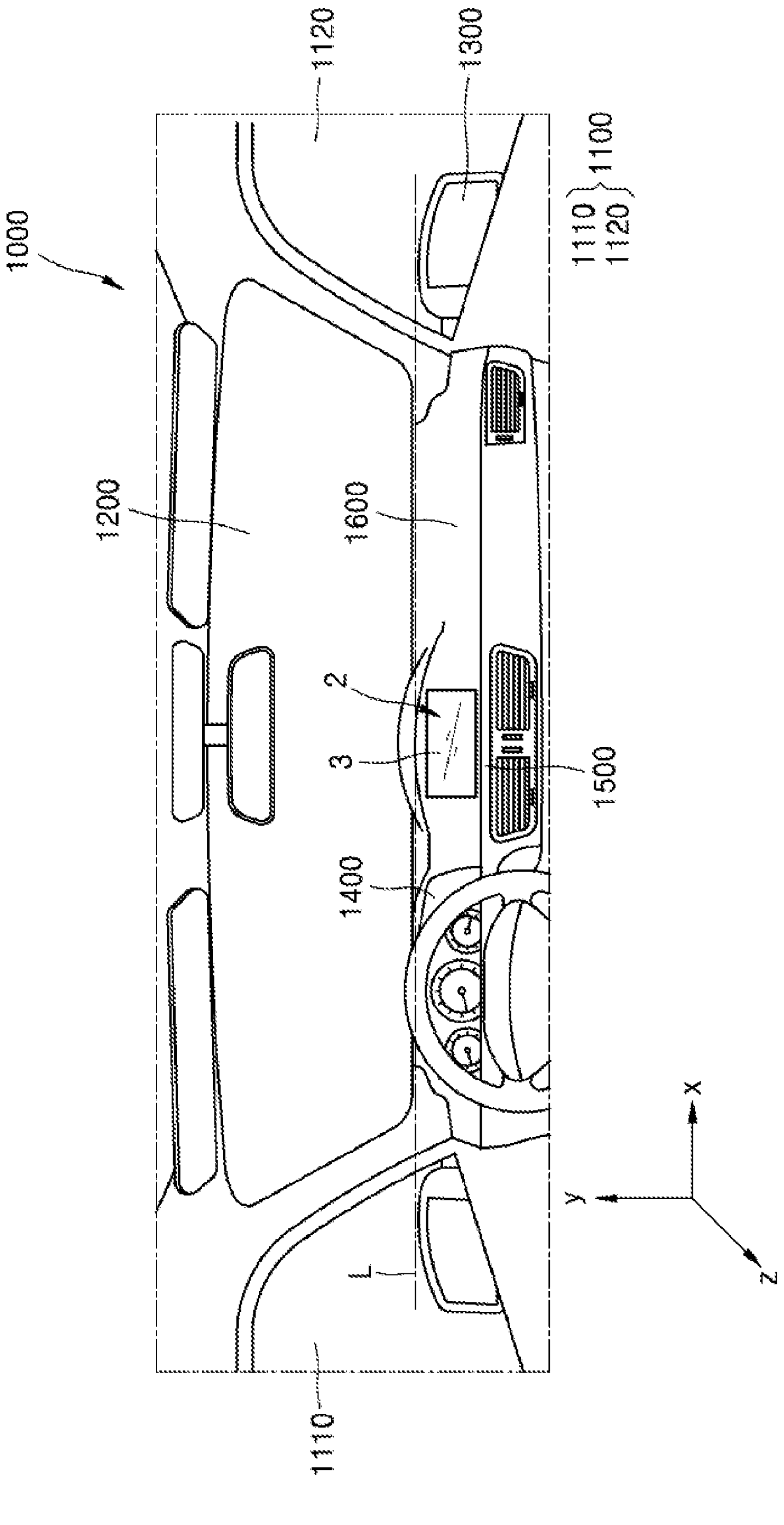
FIGS. 6A-6C are schematic diagrams of an interior of a vehicle according to one or more embodiments of the present disclosure.
Figure 6B:
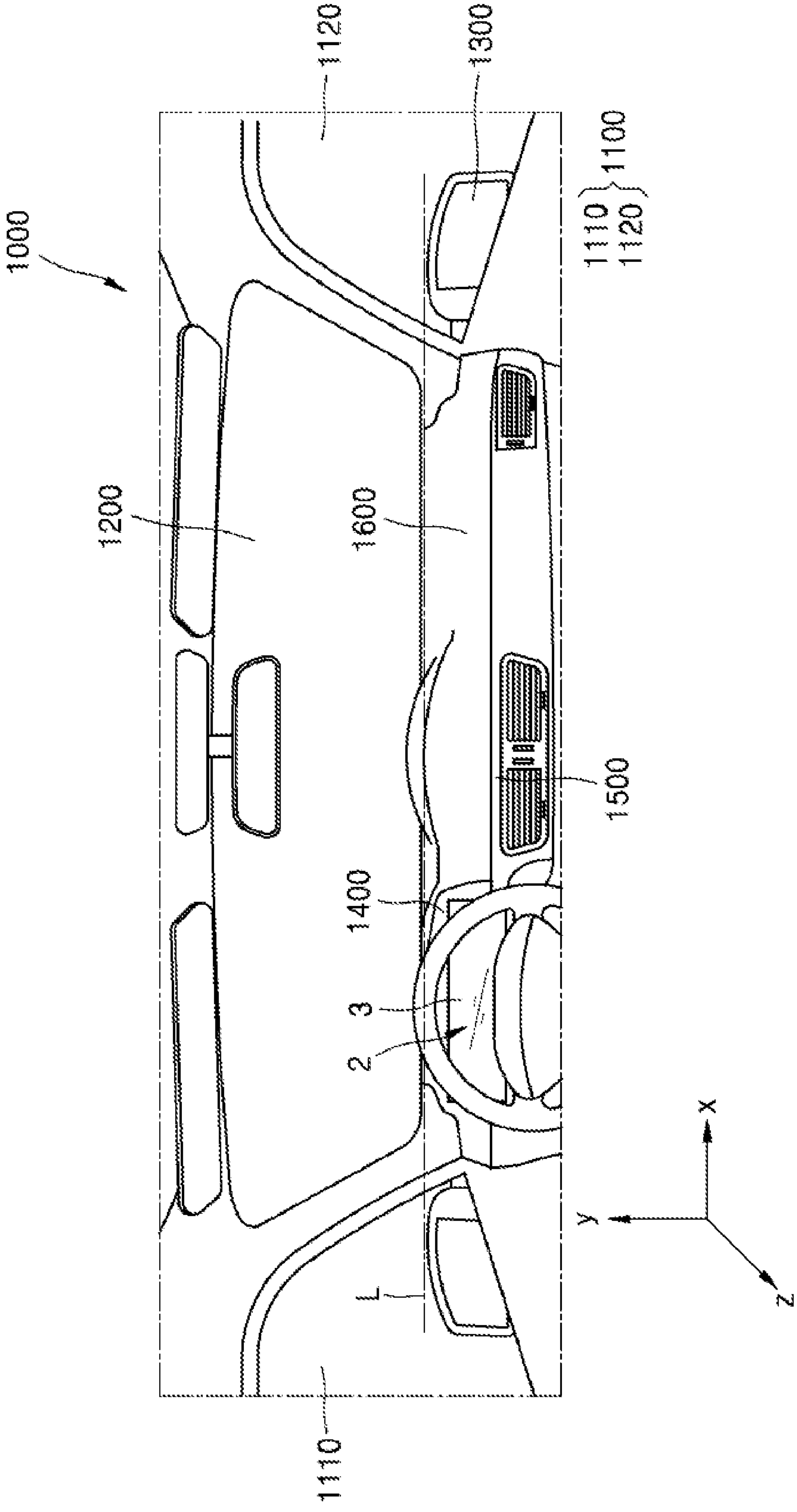
Figure 6C:
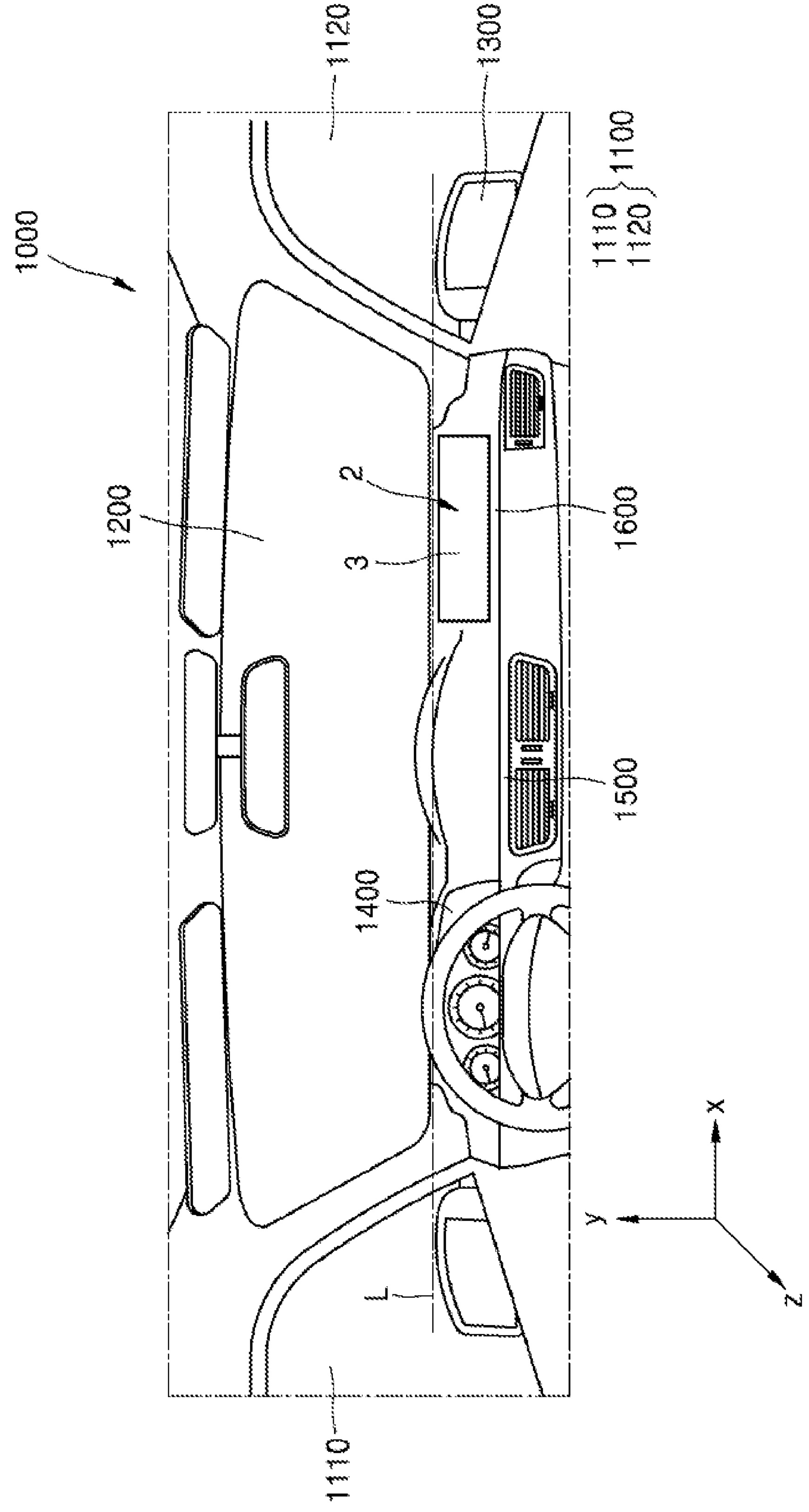

FIG. 5 is a diagram illustrating an exterior of a vehicle 1000 as electronic equipment including a light-emitting device according to one or more embodiments of the present disclosure. FIGS. 6A to 6C are each a diagram schematically illustrating an interior of a vehicle 1000 according to one or more suitable embodiments of the present disclosure.

Referring to FIGS. 5, 6A, 6B, and 6C, the vehicle 1000 may refer to one or more suitable apparatuses for moving an object to be transported, such as a human, an object, or an animal, from a departure point to a destination. The vehicle 1000 may include a vehicle traveling on a road or a track, a vessel moving over a sea or a river, an airplane flying in the sky utilizing the action of air, and/or the like.

In one or more embodiments, the vehicle 1000 may travel on a road or a track. The vehicle 1000 may move in a set or predetermined direction according to the rotation of at least one wheel. For example, the vehicle 1000 may include a three-wheeled or four-wheeled vehicle, a construction machine, a two-wheeled vehicle, a prime mover device, a bicycle, or a train running on a track.

The vehicle 1000 may include a body having an interior and an exterior, and a chassis in which mechanical apparatuses necessary for driving are installed as other parts except for the body. The exterior of the vehicle body may include a front panel, a bonnet, a roof panel, a rear panel, a trunk, a filler/pillar provided at a boundary between doors, and/or the like. The chassis of the vehicle 1000 may include a power generating device, a power transmitting device, a driving device, a steering device, a braking device, a suspension device, a transmission device, a fuel device, front and rear wheels, left and right wheels, and/or the like.

The vehicle 1000 may include a side window glass 1100, a front window glass 1200, a side mirror 1300, a cluster 1400, a center fascia 1500, a passenger seat dashboard 1600, and a display device 2.

The side window glass 1100 and the front window glass 1200 may be partitioned by a filler/pillar arranged between the side window glass 1100 and the front window glass 1200.

The side window glass 1100 may be installed on the side of the vehicle 1000. In one or more embodiments, the side window glass 1100 may be installed on a door of the vehicle 1000. A plurality of side window glasses 1100 may be provided and may face each other. In one or more embodiments, the side window glass 1100 may include a first side window glass 1110 and a second side window glass 1120. In one or more embodiments, the first side window glass 1110 may be arranged adjacent to the cluster 1400. The second side window glass 1120 may be arranged adjacent to the passenger seat dashboard 1600.

In one or more embodiments, the side window glasses 1100 may be spaced apart from each other in the x-direction or the −x-direction. For example, the first side window glass 1110 and the second side window glass 1120 may be spaced apart from each other in the x direction or the −x direction. In other words, an imaginary straight line L connecting the side window glasses 1100 may extend in the x-direction or the −x-direction. For example, an imaginary straight line L connecting the first side window glass 1110 and the second side window glass 1120 to each other may extend in the x direction or the −x direction.

The front window glass 1200 may be installed in the front of the vehicle 1000. The front window glass 1200 may be arranged between the side window glasses 1100 facing each other.

The side mirror 1300 may provide a rear view of the vehicle 1000. The side mirror 1300 may be installed on the exterior of the vehicle body. In one embodiment, a plurality of side mirrors 1300 may be provided. Any one of the plurality of side mirrors 1300 may be arranged outside the first side window glass 1110. The other one of the plurality of side mirrors 1300 may be arranged outside the second side window glass 1120.

The cluster 1400 may be arranged in front of the steering wheel. The cluster 1400 may include a tachometer, a speedometer, a coolant thermometer, a fuel gauge turn indicator, a high beam indicator, a warning lamp, a seat belt warning lamp, an odometer, a hodometer, an automatic shift selector indicator lamp, a door open warning lamp, an engine oil warning lamp, and/or a low fuel warning light.

The center fascia 1500 may include a control panel on which a plurality of buttons for adjusting an audio device, an air conditioning device, and/or a heater of a seat are disposed. The center fascia 1500 may be arranged on one side of the cluster 1400.

A passenger seat dashboard 1600 may be spaced apart from the cluster 1400 with the center fascia 1500 arranged therebetween. In one or more embodiments, the cluster 1400 may be arranged to correspond to a driver seat, and the passenger seat dashboard 1600 may be disposed to correspond to a passenger seat. In one or more embodiments, the cluster 1400 may be adjacent to the first side window glass 1110, and the passenger seat dashboard 1600 may be adjacent to the second side window glass 1120.

In one or more embodiments, the display device 2 may include a display panel 3, and the display panel 3 may display an image. The display device 2 may be arranged inside the vehicle 1000. In one or more embodiments, the display device 2 may be arranged between the side window glasses 1100 facing each other. The display device 2 may be arranged on at least one selected from among the cluster 1400, the center fascia 1500, and the passenger seat dashboard 1600.

The display device 2 may include an organic light-emitting display device, an inorganic electroluminescent (EL) display device, a quantum dot display device, and/or the like. Hereinafter, as the display device 2 according to one or more embodiments of the present disclosure, an organic light-emitting display device including the light-emitting device according to the present disclosure will be described as an example, but one or more suitable types (kinds) of display devices as described above may be utilized in embodiments of the present disclosure.

Referring to FIG. 6A, the display device 2 may be arranged on the center fascia 1500. In one embodiment, the display device 2 may display navigation information. In another embodiment, the display device 2 may display audio, video, or information regarding vehicle settings.

Referring to FIG. 6B, the display device 2 may be arranged on the cluster 1400. When the display device 2 is arranged on the cluster 1400, the cluster 1400 may display driving information and/or the like through the display device 2. For example, in some embodiments, the cluster 1400 may be implemented digitally. The digital cluster 1400 may display vehicle information and driving information as images. For example, a needle and a gauge of a tachometer and/or one or more suitable warning light icons may be displayed by a digital signal.

Referring to FIG. 6C, the display device 2 may be arranged on the dashboard 1600 of the passenger seat. The display device 2 may be embedded in the passenger seat dashboard 1600 or arranged on the passenger seat dashboard 1600. In one or more embodiments, the display device 2 arranged on the dashboard 1600 of the passenger seat may display an image related to information displayed on the cluster 1400 and/or information displayed on the center fascia 1500. In one or more embodiments, the display device 2 arranged on the passenger seat dashboard 1600 may display information different from information displayed on the cluster 1400 and/or information displayed on the center fascia 1500.

Manufacturing Method

Respective layers included in the hole transport region, the emission layer, and respective layers included in the electron transport region may be formed in a certain region by utilizing one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

The term "$C_3$-$C_{60}$ carbocyclic group" as utilized herein refers to a cyclic group consisting of carbon only as a ring-forming atom and having three to sixty carbon atoms, and the term "$C_1$-$C_{60}$ heterocyclic group" as utilized herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group has 3 to 61 ring-forming atoms.

The "cyclic group" as utilized herein may include the $C_3$-$C_{60}$ carbocyclic group, and the $C_1$-$C_{60}$ heterocyclic group.

The term "π electron-rich $C_3$-$C_{60}$ cyclic group" as utilized herein refers to a cyclic group that has three to sixty carbon atoms and does not include *—N═*' as a ring-forming moiety, and the term "π electron-deficient nitrogen-containing $C_1$-$C_{60}$ cyclic group" as utilized herein refers to a heterocyclic group that has one to sixty carbon atoms and includes *—N═*' as a ring-forming moiety.

For example, the $C_3$-$C_{60}$ carbocyclic group may be i) group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which two or more groups T1 are condensed with each other, iii) group T3, iv) a condensed cyclic group in which two or more groups T3 are condensed with each other, or v) a condensed cyclic group in which at least one group T3 and at least one group T1 are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as utilized herein refer to a group condensed to any cyclic group, a monovalent group, or a polyvalent group (for example, a divalent group, a trivalent group, a tetravalent group, etc.) according to the structure of a formula for which the corresponding term is utilized. For example, the "benzene group" may be a benzo group, a phenyl group, a phenylene group, and/or the like, which may be easily understood by one of ordinary skill in the art according to the structure of a formula including the "benzene group."

In some embodiments, non-limiting examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and non-limiting examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl" as utilized herein refers to a linear or branched aliphatic hydrocarbon monovalent group that has one to sixty carbon atoms, and non-limiting examples thereof may include (e.g., may be) a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as utilized herein refers to a divalent group having the same structure as the $C_1$-$C_{60}$ alkyl group.

The term "$C_2$-$C_{60}$ alkenyl group" as utilized herein refers to a monovalent hydrocarbon group having at least one carbon-carbon double bond in the middle or at the terminus of the $C_2$-$C_{60}$ alkyl group, and non-limiting examples thereof may include (e.g., may be) an ethenyl group, a propenyl group, and a butenyl group. The term "$C_2$-$C_{60}$ alkenylene group" as utilized herein refers to a divalent group having the same structure as the $C_2$-$C_{60}$ alkenyl group.

The term "$C_2$-$C_{60}$ alkynyl group" as utilized herein refers to a monovalent hydrocarbon group having at least one carbon-carbon triple bond in the middle or at the terminus of the $C_2$-$C_{60}$ alkyl group, and non-limiting examples thereof may include an ethynyl group and a propynyl group. The term "$C_2$-$C_{60}$ alkynylene group" as utilized herein refers to a divalent group having the same structure as the $C_2$-$C_{60}$ alkynyl group.

The term "$C_1$-$C_{60}$ alkoxy group" as utilized herein refers to a monovalent group represented by $—OA_{101}$ (wherein $A_{101}$ is the $C_1$-$C_{60}$ alkyl), and non-limiting examples thereof may include a methoxy group, an ethoxy group, and an isopropyloxy group.

The term "$C_3$-$C_{10}$ cycloalkyl group" as utilized herein refers to a monovalent saturated hydrocarbon cyclic group having 3 to 10 carbon atoms, and non-limiting examples thereof may include (e.g., may be) a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as utilized herein refers to a divalent group having the same structure as the $C_3$-$C_{10}$ cycloalkyl group.

The term "$C_1$-$C_{10}$ heterocycloalkyl group" as utilized herein refers to a monovalent cyclic group of 1 to 10 carbon atoms, further including, in addition to carbon atoms, at least one heteroatom, as ring-forming atoms, and non-limiting examples may include (e.g., may be) a 1,2,3,4-oxatriazolidinyl group, a tetrahydrofuranyl group, and a tetrahydrothiophenyl group. The term "$C_1$-$C_{10}$ heterocycloalkylene group" as utilized herein refers to a divalent group having the same structure as the $C_1$-$C_{10}$ heterocycloalkyl group.

The term $C_3$-$C_{10}$ cycloalkenyl group utilized herein refers to a monovalent cyclic group that has three to ten carbon atoms and at least one carbon-carbon double bond in the ring thereof and no aromaticity, and non-limiting examples thereof may include (e.g., may be) a cyclopentenyl group, a cyclohexenyl group, and a cycloheptenyl group. The term "$C_3$-$C_{10}$ cycloalkenylene group" as utilized herein refers to a divalent group having the same structure as the $C_3$-$C_{10}$ cycloalkenyl group.

The term "$C_1$-$C_{10}$ heterocycloalkenyl group" as utilized herein refers to a monovalent cyclic group of 1 to 10 carbon atoms, further including, in addition to carbon atoms, at least one heteroatom, as ring-forming atoms, and having at least one double bond in the cyclic structure thereof. Non-limiting examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as utilized herein refers to a divalent group having the same structure as the $C_1$-$C_{10}$ heterocycloalkenyl group.

The term "$C_6$-$C_{60}$ aryl group" as utilized herein refers to a monovalent group having a carbocyclic aromatic system of 6 to 60 carbon atoms, and the term "$C_6$-$C_{60}$ arylene group" as utilized herein refers to a divalent group having a carbocyclic aromatic system of 6 to 60 carbon atoms. Non-limiting examples of the $C_6$-$C_{60}$ aryl group may include (e.g., may be) a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as utilized herein refers to a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as utilized herein refers to a divalent group having a heterocyclic aromatic system of 1 to 60 carbon atoms, further including, in addition to carbon atoms, at least one heteroatom, as ring-forming atoms. Non-limiting examples of the $C_1$-$C_{60}$ heteroaryl group may include (e.g., may be) a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as utilized herein refers to a monovalent group (for example, having 8 to 60 carbon atoms) having two or more rings condensed to each other, only carbon atoms as ring-forming atoms, and no aromaticity in its entire molecular structure as a whole. Non-limiting examples of the monovalent non-aromatic condensed polycyclic group may include (e.g., may be) an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as utilized herein refers to a divalent group having the same structure as the monovalent non-aromatic condensed polycyclic group described above.

The term "monovalent non-aromatic condensed heteropolycyclic group" as utilized herein refers to a monovalent group (for example, having 1 to 60 carbon atoms) having two or more rings condensed to each other, further including, in addition to carbon atoms, at least one heteroatom, as ring-forming atoms, and having non-aromaticity in its entire molecular structure as a whole. Non-limiting examples of the monovalent non-aromatic condensed heteropolycyclic group may include (e.g., may be) a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphtho silolyl group, a benzofurodibenzofuranyl group, a benzofurodibenzothiophenyl group, and a benzothienodibenzothiophenyl group. The term "divalent non-aromatic condensed heteropolycyclic group" as utilized herein refers to a divalent group having the same structure as the monovalent non-aromatic condensed heteropolycyclic group described above.

The term "$C_6$-$C_{60}$ aryloxy group" as utilized herein indicates —$OA_{102}$ (wherein $A_{102}$ is a $C_6$-$C_{60}$ aryl group), and the term "$C_6$-$C_{60}$ arylthio group" as utilized herein indicates —$SA_{103}$ (wherein $A_{103}$ is a $C_6$-$C_{60}$ aryl group).

The term "$C_7$-$C_{60}$ arylalkyl group" utilized herein refers to -$A_{104}A_{105}$ (where $A_{104}$ may be a $C_1$-$C_{54}$ alkylene group, and $A_{105}$ may be a $C_6$-$C_{59}$ aryl group), and the term $C_2$-$C_{60}$ heteroarylalkyl group" utilized herein refers to -$A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as utilized herein refers to:

deuterium, —F, —Cl, —Br, —I, a hydroxyl group, a cyano group, or a nitro group;

a $C_1$-$C_{60}$ alkyl, a $C_2$-$C_{60}$ alkenyl group, a $C_2$-$C_{60}$ group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$ and $Q_{31}$ to $Q_{33}$ utilized herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

The term "heteroatom" as utilized herein refers to any atom other than a carbon atom. Non-limiting examples of the heteroatom may include (e.g., may be) O, S, N, P, Si, B, Ge, Se, and any combinations thereof.

"Ph" as utilized herein refers to a phenyl group, "Me" as utilized herein refers to a methyl group, "Et" as utilized herein refers to an ethyl group, "tert-Bu" or "$Bu^t$" as utilized herein refers to a tert-butyl group, and "OMe" as utilized herein refers to a methoxy group.

The term "biphenyl group" as utilized herein refers to "a phenyl group substituted with a phenyl group." In other words, the "biphenyl group" is a substituted phenyl group having a $C_6$-$C_{60}$ aryl group as a substituent.

The term "terphenyl group" as utilized herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

In the present disclosure, the x-axis, y-axis, and z-axis are not limited to three axes in an orthogonal coordinate system, and may be interpreted in a broad sense including these axes. For example, the x-axis, y-axis, and z-axis may refer to those orthogonal to each other, or may refer to those in different directions that are not orthogonal to each other.

* and *' as utilized herein, unless defined otherwise, each refer to a binding site to a neighboring atom in a corresponding formula or moiety.

Hereinafter, compounds according to embodiments and light-emitting devices according to embodiments will be described in more detail with reference to the following synthesis examples and examples. The wording "B was utilized instead of A" utilized in describing Synthesis Examples refers to that an identical molar equivalent of B was utilized in place of A.

EXAMPLES

Synthesis Example 1: Synthesis of Compound 3

Synthesis Example 1-1: Synthesis of Compound C1

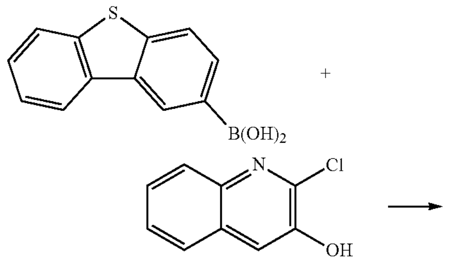

-continued

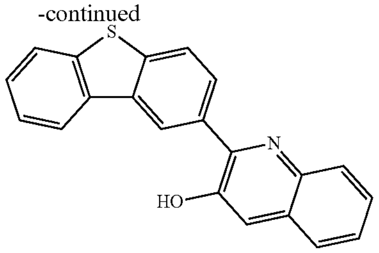

C1

2-chloroquinolin-3-ol (5.50 g, 30.6 mmol), dibenzo[b,d]thiophen-2-ylboronic acid (8.37 g, 36.7 mmol), Pd(II) acetate (0.17 g, 0.76 mmol), and triphenylphosphine (0.80 g, 3.06 mmol) were dissolved in dimethyl ether (100 mL). $K_2CO_3$ (11.4 g, dissolved in 41 mL of $H_2O$) was added to the solution, and the mixture was stirred in the nitrogen atmosphere for 18 hours. After dissolving the mixture and removing water therefrom, the resultant was concentrated utilizing 150 mL of ethyl acetate, extracted three times utilizing brine, dried utilizing anhydrous sodium sulfate, and then filtered, followed by evaporation of a solvent. The obtained material was purified by silica gel column chromatography utilizing 20% ethyl acetate/hexane as developing solvents to obtain 9.49 g of Compound C1 (yield: 95%).

Synthesis Example 1-2: Synthesis of Compound C2

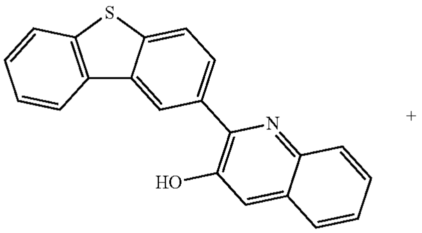

C1

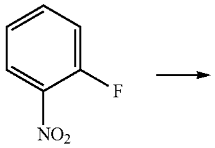

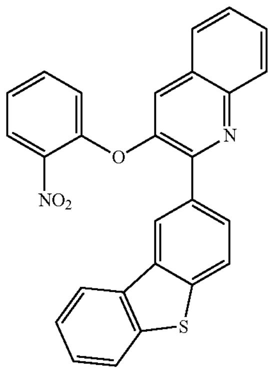

C2

After dissolving Compound C1 (1.68 g, 5.12 mmol) and 1-fluoro-2-nitrobenzene (732 mg, 5.12 mmol) in N,N-dimethylformamide (10 mL), cesium carbonate (1.10 g, 5.63 mmol) was added thereto, and the resultant was stirred at room temperature for 5 days. The mixture was diluted in 500 mL of water, and after 4 hours, the precipitate was filtered and dried at 40° C. under vacuum to obtain 1.79 g of Compound C2 (yield: 78%).

Synthesis Example 1-3: Synthesis of Compound C3

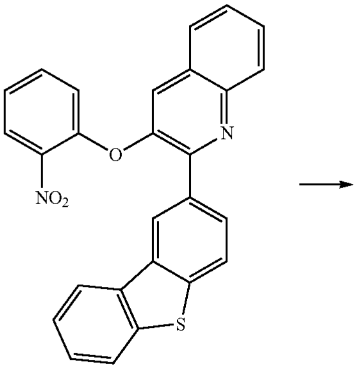

C2

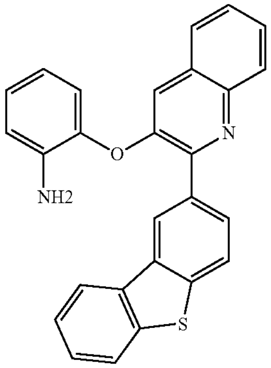

C3

0.05 M of a Compound C2 solution prepared by dissolving Compound C2 (1.77 g, 3.95 mmol) in ethyl acetate was reduced on a cartridge of 10% Pd/C in the H-Cube® substantially continuous hydrogenation reactor at a speed of 1 mL/min, and a solvent was evaporated to obtain 1.57 g of Compound C3 (yield: 95%).

Synthesis Example 1-4: Synthesis of Compound C4

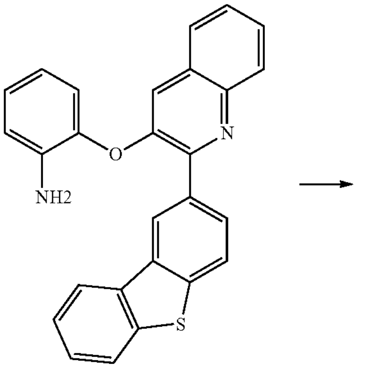

C3

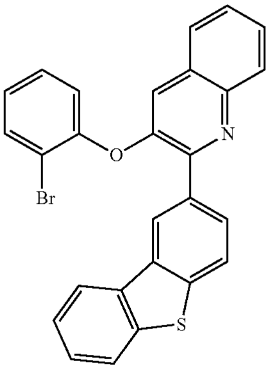

C4

A solution obtained by dissolving Compound C3 (1.53 g, 3.66 mmol) in dry acetonitrile (20 mL) was added dropwise to a suspension obtained by dissolving copper (I) bromide (630 mg, 4.40 mmol), lithium bromide (955 mg, 11 mmol), and tert-butyl nitrite (0.63 mL, 4.76 mmol) in dry acetonitrile (20 mL) at 60° C. After stirring the mixture for 30 minutes, a cooled mixture was diluted in ethyl acetate, and filtered utilizing diatomaceous earth. An organic layer was concentrated under vacuum, and a residue was purified by silica gel column chromatography (n-heptane/ethyl acetate) to obtain 1.24 g of Compound C4 (yield: 70%).

Synthesis Example 1-5: Synthesis of Compound C5

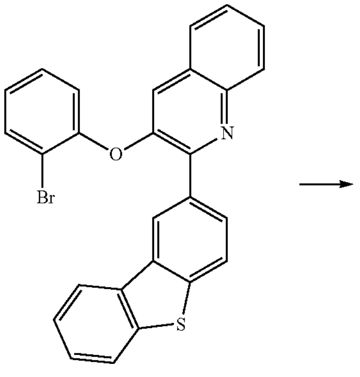

C4

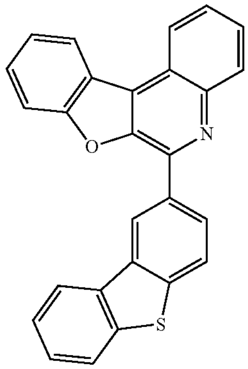

C5

Compound C4 (1.20 g, 2.49 mmol), $Pd(OAc)_2$ (2 mol %), and anhydrous cesium carbonate (1.62 g, 4.98 mmol) were dissolved in anhydrous N-methylpyrrolidone (1.5 mL/mmol), and the solution was stirred at 135° C. A cooled reaction mixture was diluted in dichloromethane (DCM), filtered by utilizing a short plug of celite, and then concentrated under vacuum. The obtained mixture was purified by silica gel column chromatography utilizing DCM/EtOAc as an eluent to obtain 0.72 g of Compound C5 (yield: 72%).

Synthesis Example 1-6: Synthesis of Compound 3

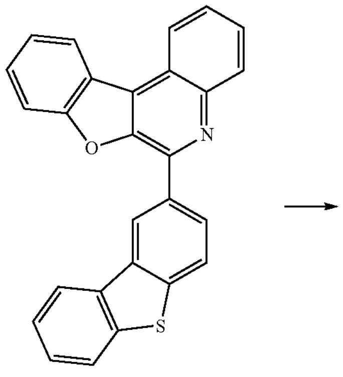

C5

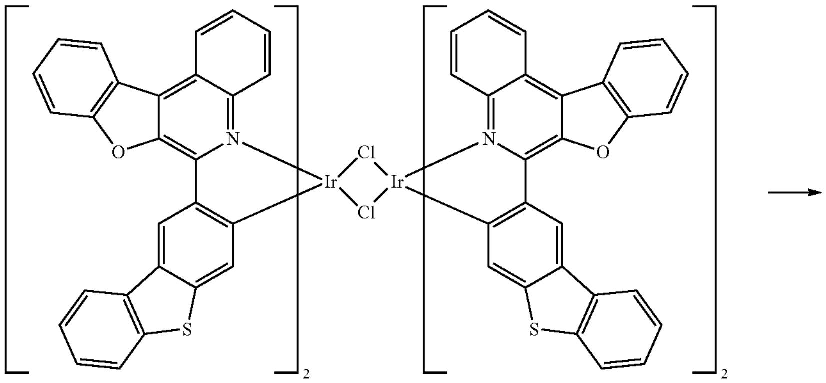

-continued

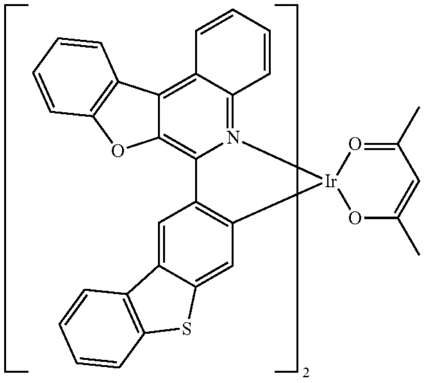

3

After dissolving Compound C5 (1.78 mmol) in 2-ethoxyethanol (7.2 mL) in a round-bottom flask, $IrCl_3 \cdot 3H_2O$ (0.80 mmol) and water (2.4 mL) were added into the flask, and the mixture was stirred at 120° C. in the nitrogen atmosphere for 24 hours and then cooled to room temperature. The precipitate was collected from the mixture, washed utilizing methanol and hexane, and then dried under vacuum to obtain Ir(III) chloro-bridged dimer. Ir(III) chloro-bridged dimer, acetylacetone (1.21 mmol), and $Na_2CO_3$ (2.41 mmol) were mixed with 2-ethoxyethanol (8 mL), and the mixture was heated at a temperature of 100° C. for 6 hours. After cooling the mixture to room temperature, the precipitated solid was filtered and collected, and then washed utilizing ethanol and hexane, and the residue was dissolved in dichloromethane to filter the solid. The solution was concentrated under vacuum, and the residue was purified by silica gel column chromatography and recrystallized to obtain Compound 3 (yield: 32%).

The measurement results of $^1$H NMR and HR-MS(High-Resolution Mass) of compounds including the compounds synthesized in Synthesis Examples are shown in Table 1. Synthesis methods of compounds other than the compounds of Synthesis Examples may be easily recognized by those skilled in the art by referring to the synthesis paths and source materials.

TABLE 1

| Compound No. | $^1$H NMR ($CDCl_3$, 500 MHz) | HR-MS (m/z) [$M^+$] found | HR-MS (m/z) [$M^+$] calc. |
|---|---|---|---|
| 1 | δ ppm 8.55 (2H, s), 8.49 (2H, dd, J = 7.5, 1.5 Hz), 8.19 (2H, dd, J = 7.6, 1.6 Hz), 7.50 (2H, dd, J = 7.6, 1.6 Hz), 7.82 (2H, dd, J = 7.6, 1.6 Hz), 7.92 (2H, td, J = 7.6, 1.5 Hz), 7.78 (2H, td, J = 7.5, 1.6 Hz), 7.58 (2H, td, J = 7.6, 1.5 Hz), 7.42 (2H, td, J = 7.6, 1.6 Hz), 7.4-7.3 (4H, m), 6.9-6.8 (2H, m), 4.66 (1H, s), 2.33 (2H, quint, J = 6.9 Hz), 2.20 (6H, s), 0.68 (12H, t, J = 6.8 Hz) | 1212.3 | 1212.2 |
| 2 | δ ppm 8.66 (2H, dd, J = 7.6, 1.5 Hz), 8.69 (2H, s), 8.50 (2H, dd, J = 7.6, 1.6 Hz), 8.27 (2H, dd, J = 7.5, 1.5 Hz), 8.25 (2H, dd, J = 7.6, 1.6 Hz), 8.1-8.0 (4H, m), 7.83 (2H, td, J = 7.6, 1.6 Hz), 7.8-7.65 (8H, m), 7.45 (2H, d, J = 1.5 Hz), 7.33 (2H, d, J = 1.6 Hz), 7.36 (2H, t, J = 7.6 Hz), 4.74 (1H, s), 1.55 (6H, s) | 1194.2 | 1194.2 |
| 3 | δ ppm 8.62 (2H, s), 8.50 (2H, dd, J = 7.6, 1.6 Hz), 8.20 (2H, dd, J = 7.6, 1.6 Hz), 8.03 (2H, dd, J = 7.6, 1.5 Hz), 7.92 (2H, dd, J = 7.5, 1.6 Hz), 7.95 (2H, dd, J = 7.5, 1.6 Hz), 7.90 (2H, td, J = 7.5, 1.5 Hz), 7.8-7.65 (4H, m), 7.6-7.45 (6H, m), 7.44 (2H, td, J = 7.6, 1.6 Hz), 7.19 (2H, td, J = 7.5, 1.6 Hz), 4.66 (1H, s), 1.50 (6H, s) | 1092.1 | 1092.2 |
| 4 | δ ppm 8.69 (2H, dd, J = 7.5, 1.6 Hz), 8.54, (4H, m), 7.92 (2H, dd, J = 7.6, 1.6 Hz), 7.55-7.48 (4H, m), 7.4-7.25 (8H, m), 4.67 (1H, s), 2.22 (6H, s), 2.04 (4H, q, J = 8.1 Hz), 0.87 (6H, q, J = 8.1 Hz) | 1222.2 | 1222.2 |
| 5 | δ ppm 8.41 (4H, td, J = 7.5, 1.5 Hz), 8.11 (2H, dd, J = 7.6, 1.6 Hz), 8.01 (2H, dd, J = 7.5, 1.5 Hz), 7.92 (2H, dd, J = 7.6, 1.5 Hz), 7.87 (2H, td, J = 7.5, 1.6 Hz), 7.8-7.65 (6H, m), 7.6-7.45 (6H, m), 7.34 (2H, td, J = 7.5, 1.6 Hz), 7.32 | 1120.2 | 1120.2 |

TABLE 1-continued

| Compound No. | $^1H$ NMR ($CDCl_3$, 500 MHz) | HR-MS (m/z) [M+] found | calc. |
|---|---|---|---|
| | (2H, td, J = 7.5, 1.5 Hz), 4.73 (1H, s), 2.04 (4H, q, J = 8.1 Hz), 0.80 (6H, q, J = 8.0 Hz) | | |
| 6 | δ ppm 8.69 (2H, s), 8.22-8.16 (4H, m), 8.1-7.9 (4H, m), 7.85 (2H, td, J = 7.5, 1.5 Hz), 7.77-7.57 (8H, m), 7.41 (2H, td, J = 7.6, 1.6 Hz), 7.27 (2H, td, J = 7.6, 1.6 Hz), 7.17 (2H, td, J = 8.0, 1.5 Hz), 4.60 (1H, s), 1.51 (6H, s) | 1128.3 | 1128.2 |
| 7 | δ ppm 8.79 (2H, s), 8.15 (2H, dd, J = 8.0, 1.5 Hz), 8.23 (2H, dd, J = 7.5, 1.6 Hz), 8.05 (2H, dd, J = 7.6, 1.5 Hz), 8.0-7.8 (4H, m), 7.74 (6H, td, J = 5.1, 1.6 Hz), 7.75-7.58 (4H, m), 7.37 (2H, td, J = 7.6, 1.5 Hz), 7.29 (2H, td, J = 7.5, 1.5 Hz), 7.08 (2H, td, J = 8.0, 1.5 Hz), 4.63 (1H, s), 2.60 (6H, s), 2.06 (4H, q, J = 8.1 Hz), 0.83 (6H, q, J = 8.0 Hz) | 1208.4 | 1208.3 |
| 8 | δ ppm 8.62 (2H, s), 8.22 (2H, dd, J = 7.5, 1.5 Hz), 7.99 (4H, m), 7.8-7.6 (10H,m), 7.56 (2H, dd, J = 7.5, 1.6 Hz), 7.40 (2H, td, J = 7.6, 1.5 Hz), 7.33-7.25 (4H, m), 4.64 (1H, s), 2.45 (6H, s), 1.59 (6H, s) | 1120.2 | 1120.2 |
| 9 | δ ppm 9.16 (2H, d, J = 1.5 Hz), 8.61 (2H, s), 8.43 (2H, d, J = 7.5 Hz), 8.18 (2H, dd, J = 7.6, 1.6 Hz), 8.05-7.95 (4H, m), 7.88 (2H, td, J = 7.6, 1.5 Hz), 7.73-7.64 (8H, m), 7.48 (2H, dd, J = 7.6, 1.5 Hz), 7.39 (2H, td, J = 7.6, 1.5 Hz), 7.33 (2H, td, J = 7.6, 1.6 Hz), 4.71 (1H, s), 2.75 (6H, s), 1.48 (6H, s) | 1110.3 | 1110.3 |
| 10 | δ ppm 9.06 (2H, s), 8.34 (2H, dd, J = 8.1, 1.6 Hz), 8.02 (2H, d, J = 7.5 Hz), 7.89 (2H, dd, J = 7.5, 1.6 Hz), 7.81 (4H, s), 7.60 (2H, dd, J = 7.6, 1.6 Hz), 7.02 (2H, d, J = 1.6 Hz), 7.3-7.25 (4H, m), 7.09 (2H, dd, J = 7.5, 1.5 Hz), 4.71 (1H, s), 2.87 (4H, d, J = 7.0 Hz), 2.86 (2H, sept, J = 6.9 Hz), 2.74 (6H, s), 2.29 (6H, s), 1.82 (2H, sept, J = 7.0, 6.9 Hz), 1.55 (6H, s), 1.28 (12H, d, J = 6.9 Hz), 0.86 (12H, d, J = 6.9 Hz) | 1368.7 | 1368.5 |
| 11 | δ ppm 8.20 (2H, s), 8.00 (2H, d, J = 7.5 Hz), 8.02 (2H, dd, J = 7.6, 1.6 Hz), 7.38 (2H, s), 7.64 (2H, d, J = 7.6 Hz), 7.49 (2H, dd, J = 7.6, 1.5 Hz), 7.04 (2H, d, J = 1.5 Hz), 7.40 (2H, td, J = 7.5, 1.6 Hz), 7.35-7.25 (4H, m), 6.92 (2H, d, J = 7.5 Hz), 4.65 (1H, s), 2.44 (6H, s), 2.25 (6H, s), 2.32 (6H, s), 1.51 (6H, s) | 1144.3 | 1144.3 |
| 12 | δ ppm 8.39 (2H, s), 8.29 (2H, dd, J = 7.5, 1.5 Hz), 8.10 (2H, d, J = 7.6 Hz), 7.55-7.40 (6H, m), 7.17-7.02 (6H, m), 4.63 (1H, s), 2.80 (2H, sept, J = 6.9 Hz), 2.74 (4H, q, J = 8.0 Hz), 2.30 (12H, s), 1.50 (6H, s), 1.16 (18H, dt, J = 8.1, 6.9 Hz) | 1324.6 | 1324.4 |

Evaluation Example 1 Reorganization Energy and PL Spectrum Evaluation of Compound

1. Reorganization Energy Evaluation

The reorganization energy of the compound was evaluated according to the method indicated in Table 2 and the evaluation result is shown in Table 3.

TABLE 2

| | |
|---|---|
| Reorganization energy (G) | According to the DFT calculation, the energy value in the S0 state in the S0 structure of the compound (E(S0; S0), corresponding to C of FIG. 7) is subtracted from the energy value in the S0 state in the T1 structure of the compound (E(S0; T1), corresponding to D of FIG. 7). The DFT calculation was performed by utilizing a commercial program Gaussian 09, and the basis function 6-311G(d, p) and exchange-correlation functional B3LYP were utilized. |

2. PL Spectrum Evaluation

PMMA and Compound 1 (4 wt % compared to PMMA) were mixed in $CH_2Cl_2$ solution, and then, the resultant obtained therefrom was coated on a quartz substrate utilizing a spin coater, and then heat treated in an oven at 80° C., followed by cooling to room temperature to manufacture a Film 1 having a thickness of 40 nm.

Films 2 to 12, and CE1 to CE10 were manufactured in substantially the same manner as utilized in the manufacturing method of the Film 1, except that the compounds in Table 3 were utilized instead of Compound 1.

The emission spectrum of each of Films 1-12, and CE1 to CE10 was measured by utilizing a Quantaurus-QY Absolute PL quantum yield spectrometer of Hamamatsu Inc.

(equipped with a xenon light source, a monochromator, a photonic multichannel analyzer, and an integrating sphere, and utilizing PLQY measurement software (Hamamatsu Photonics, Ltd., Shizuoka, Japan)). During measurement, the excitation wavelength was scanned from 320 nm to 380 nm at 10 nm intervals, and the spectrum measured at the excitation wavelength of 340 nm was utilized to obtain the wavelength in which the first peak of the compound included in each film ($\lambda_1$, maximum emission wavelength), the ratio of the intensity of the second peak to the intensity of the first peak ($I_2/I_1$), and FWHM. Results thereof are shown in Table 3.

TABLE 3

| Film no. | Compound No. | Wavelength of first peak, $\lambda_1$ (nm) | Intensity ratio of second peak to first peak ($I_2/I_1$) | FWHM (nm) | G (eV) |
|---|---|---|---|---|---|
| 1 | 1 | 625 | 0.140 | 46 | 0.092 |
| 2 | 2 | 631 | 0.143 | 47 | 0.092 |
| 3 | 3 | 616 | 0.142 | 45 | 0.091 |
| 4 | 4 | 619 | 0.142 | 40 | 0.086 |
| 5 | 5 | 620 | 0.160 | 47 | 0.100 |
| 6 | 6 | 614 | 0.148 | 43 | 0.091 |
| 7 | 7 | 628 | 0.136 | 41 | 0.081 |
| 8 | 8 | 630 | 0.141 | 46 | 0.091 |
| 9 | 9 | 619 | 0.131 | 40 | 0.081 |
| 10 | 10 | 615 | 0.140 | 56 | 0.102 |
| 11 | 11 | 612 | 0.152 | 39 | 0.090 |
| 12 | 12 | 615 | 0.146 | 38 | 0.084 |
| CE1 | CE1 | 627 | 0.52 | 91 | 0.25 |
| CE2 | CE2 | 652 | 0.118 | 49 | 0.087 |
| CE3 | CE3 | 675 | 0.129 | 53 | 0.089 |
| CE4 | CE4 | 650 | 0.153 | 44 | 0.089 |
| CE5 | CE5 | 498 | 0.460 | 57 | 0.197 |
| CE6 | CE6 | 492 | 0.549 | 58 | 0.213 |
| CE7 | CE7 | 608 | 0.337 | 63 | 0.168 |
| CE8 | CE8 | 589 | 0.343 | 40 | 0.150 |
| CE9 | CE9 | 505 | 0.439 | 58 | 0.195 |
| CE10 | CE10 | 534 | 0.166 | 40 | 0.101 |

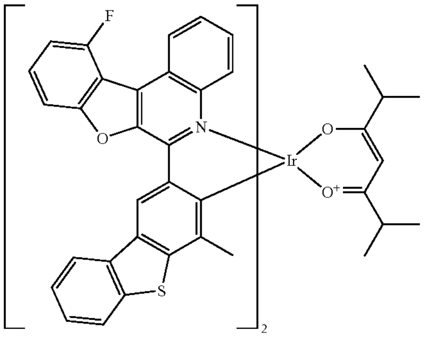

1

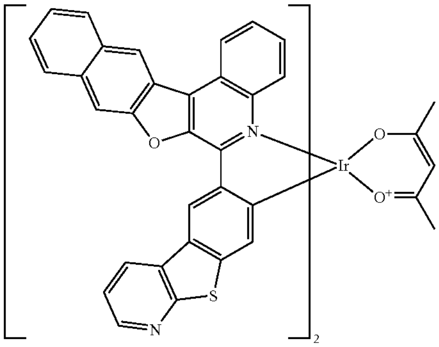

2

TABLE 3-continued

| Film no. | Compound No. | Wavelength of first peak, $\lambda_1$ (nm) | Intensity ratio of second peak to first peak ($I_2/I_1$) | FWHM (nm) | G (eV) |
|---|---|---|---|---|---|

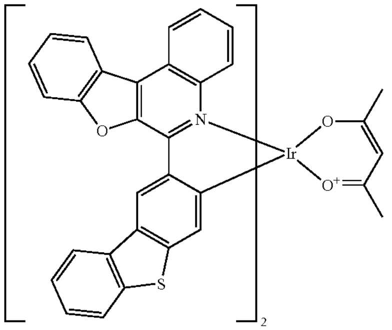

3

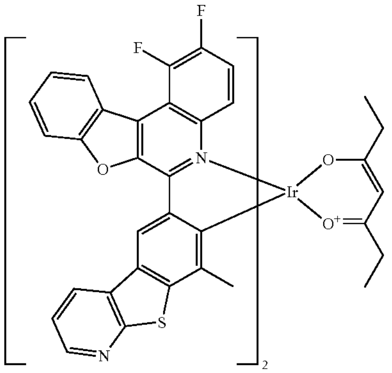

4

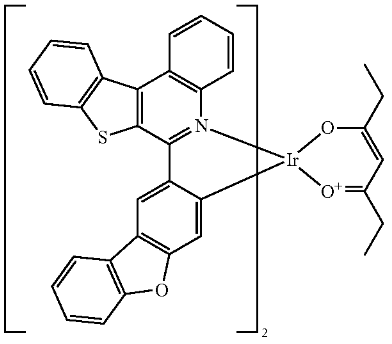

5

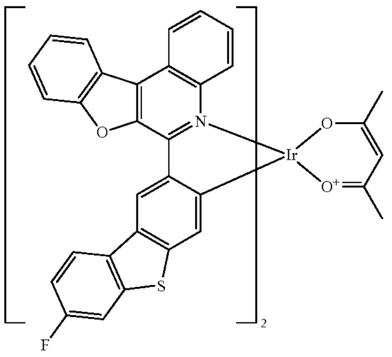

6

TABLE 3-continued
| Film no. | Compound No. | Wavelength of first peak, $\lambda_1$ (nm) | Intensity ratio of second peak to first peak ($I_2/I_1$) | FWHM (nm) | G (eV) |
|---|---|---|---|---|---|
| | 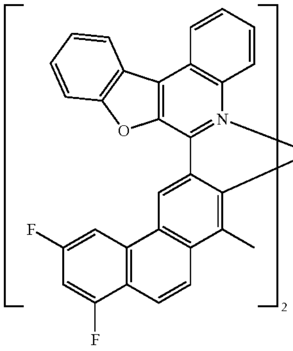 7 | | | | |
| | 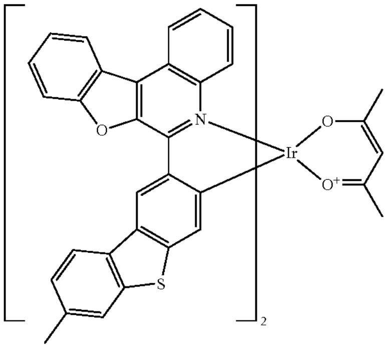 8 | | | | |
| | 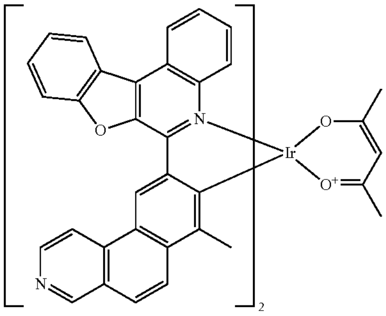 9 | | | | |
| | 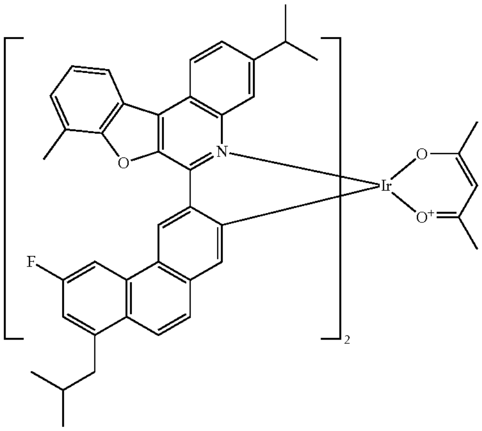 10 | | | | |
| | 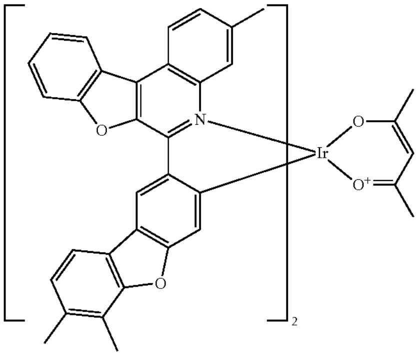 11 | | | | |
| | 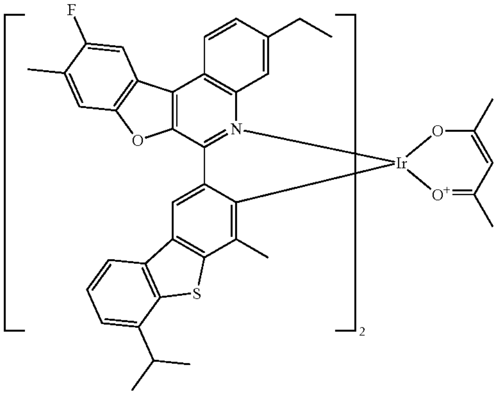 12 | | | | |
| | 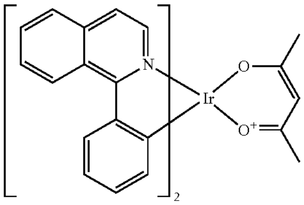 CE1 | | | | |
| | 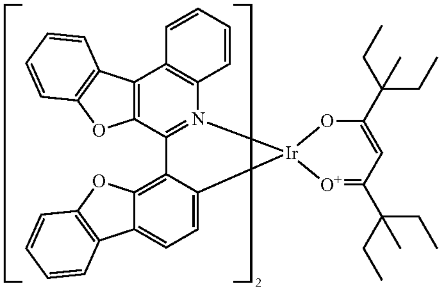 CE2 | | | | |

TABLE 3-continued

| Film no. | Compound No. | Wavelength of first peak, $\lambda_1$ (nm) | Intensity ratio of second peak to first peak ($I_2/I_1$) | FWHM (nm) | G (eV) |
|---|---|---|---|---|---|

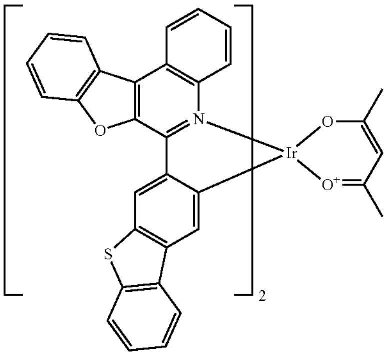

CE3

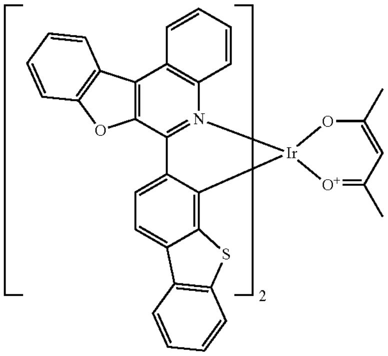

CE4

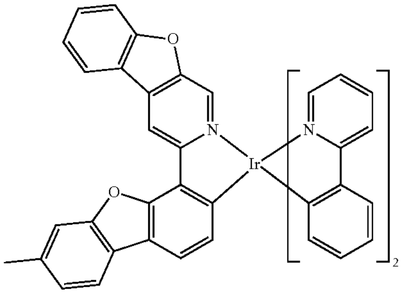

CE5

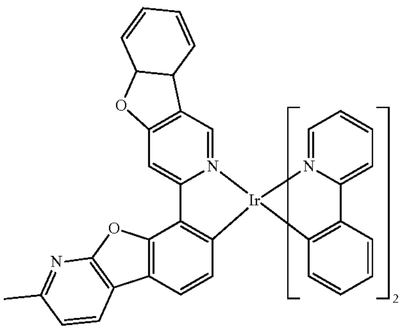

CE6

TABLE 3-continued

| Film no. | Compound No. | Wavelength of first peak, $\lambda_1$ (nm) | Intensity ratio of second peak to first peak ($I_2/I_1$) | FWHM (nm) | G (eV) |
|---|---|---|---|---|---|

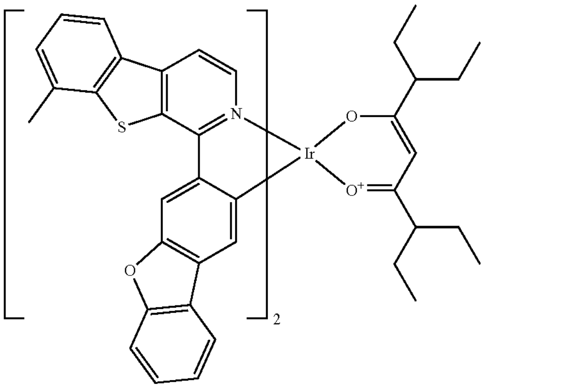

CE7

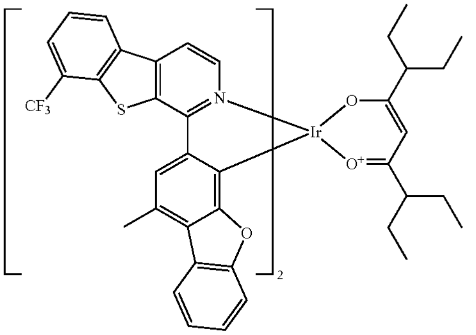

CE8

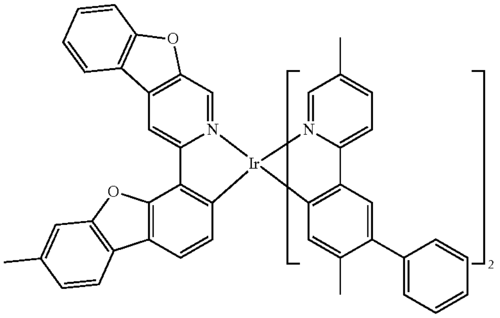

CE9

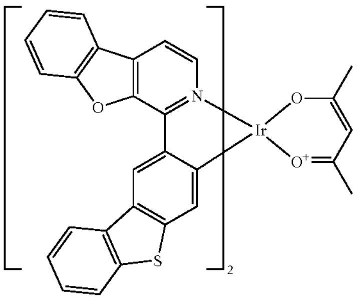

CE10

From Table 3, it is confirmed that unlike Compounds CE1 to CE10, in Compounds 1 to 12, the wavelength in which the first peak of the PL spectrum of the first light emitted by (e.g., by each of) Compounds 1 to 12 is exhibited is 610 nm to 640 nm, and the intensity ratio of the second peak to the first peak is less than or equal to a value between 0.1 and 0.2.

It is also confirmed that Compounds 1 to 12 have relatively small or equal reorganization energy and emit red light having a relatively small or equal FWHM, compared to Compounds CE1 to CE10.

Example 1

As an anode, a 15 Ω/cm$^2$ (1,200 Å) ITO glass substrate available from Corning Inc. was cut to a size of 50 mm×50 mm×0.7 mm, sonicated in isopropyl alcohol and pure water for 5 minutes each, and then cleaned by irradiation of ultraviolet rays and exposure of ozone thereto for 30 minutes. Then, the resultant ITO glass substrate was loaded onto a vacuum deposition apparatus.

HT3 was vacuum-deposited on the anode to form a hole injection layer having a thickness of 600 Å, and HT40 was vacuum-deposited on the hole injection layer to form a hole transport layer having a thickness of 250 Å.

H125 and H126 as a host and Compound 1 as a dopant were co-deposited on the hole transport layer (weight ratio=45:45:10) to form an emission layer having a thickness of 300 Å.

ET37 was vacuum-deposited on the emission layer to form a buffer layer having a thickness of 50 Å. Then, ET46 and LiQ were co-deposited on the buffer layer at a weight ratio of 5:5 to from an electron transport layer having a thickness of 310 Å, Ag/Mg was vacuum-deposited on the electron transport layer to form an electrode having a thickness of 100 Å (cathode), and Compound CP01 was deposited on the electrode to form a capping layer having a thickness of 700 Å, thereby manufacturing a light-emitting device.

HT3

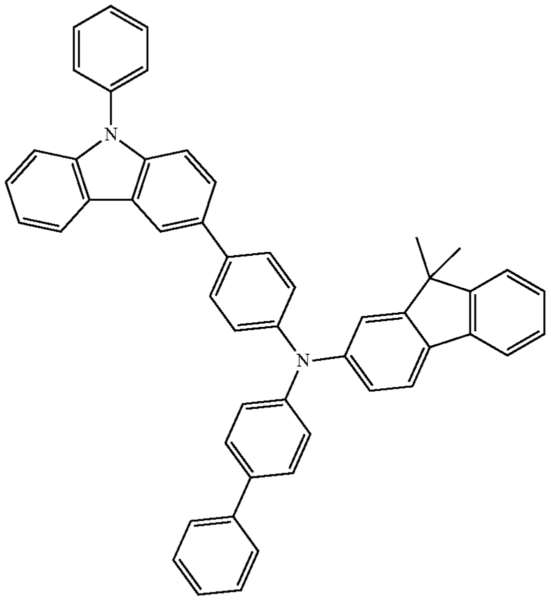

-continued

HT40

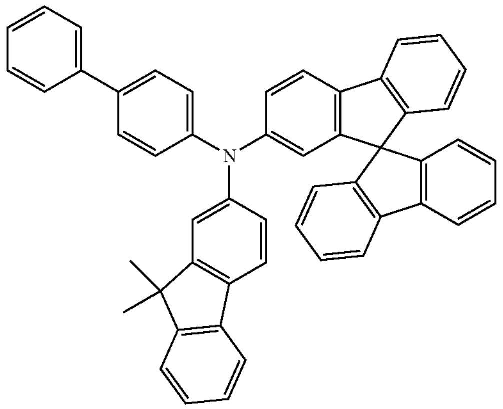

H125

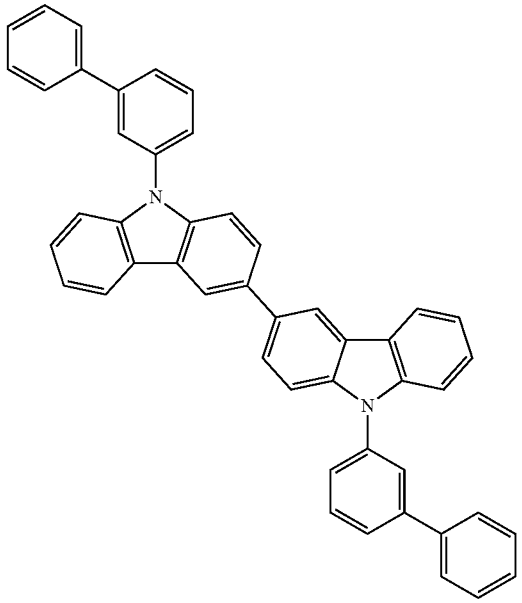

H126

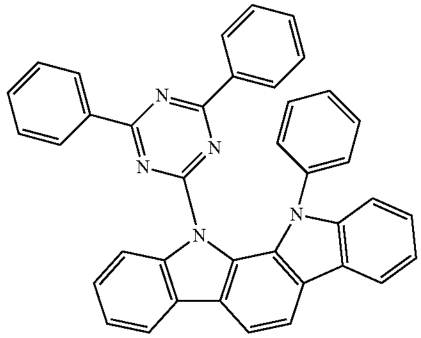

-continued

ET37

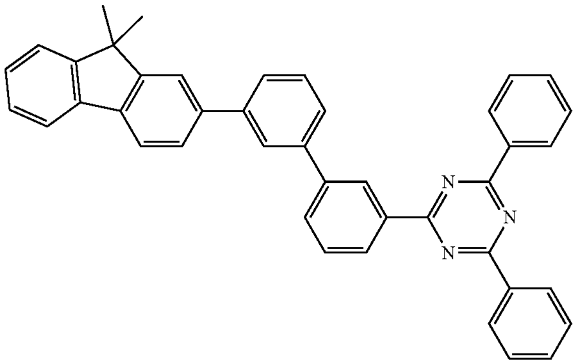

ET46

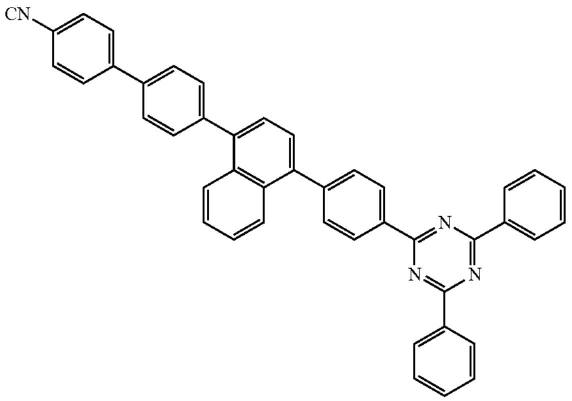

CP01

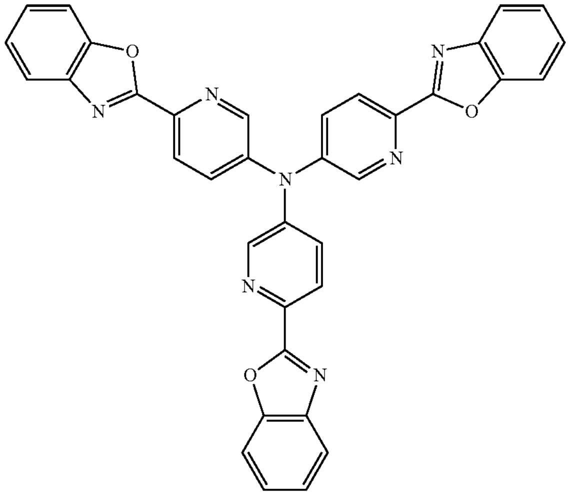

Examples 2 to 12 and Comparative Examples 1 to 10

Light-emitting devices were manufactured in substantially the same manner as in Example 1, except that the compounds in Table 4 were each utilized instead of Compound 1 in the formation of the emission layer.

Evaluation Example 2 Evaluation of Light-Emitting Device

The color purity (CIEx and CIEy coordinates) at 400 cd/m$^2$ and the frontal (0°) luminescence efficiency of the light-emitting devices manufactured according to Examples 1 to 12 and Comparative Examples 1 to 10 were evaluated by utilizing a luminance meter (Minolta Cs-1000A). Results thereof are shown in Table 4. The frontal efficiency (i.e., frontal luminescence efficiency) indicated in Table 4 is based on Comparative Example 1.

TABLE 4

| | Compound | Frontal efficiency (%) | CIE(x) | CIE(y) |
|---|---|---|---|---|
| Example 1 | 1 | 183 | 0.684 | 0.316 |
| Example 2 | 2 | 148 | 0.694 | 0.306 |
| Example 3 | 3 | 227 | 0.670 | 0.330 |
| Example 4 | 4 | 218 | 0.678 | 0.322 |
| Example 5 | 5 | 206 | 0.673 | 0.327 |
| Example 6 | 6 | 227 | 0.670 | 0.329 |
| Example 7 | 7 | 161 | 0.695 | 0.305 |
| Example 8 | 8 | 153 | 0.693 | 0.307 |
| Example 9 | 9 | 220 | 0.679 | 0.321 |
| Example 10 | 10 | 181 | 0.673 | 0.327 |
| Example 11 | 11 | 221 | 0.670 | 0.330 |
| Example 12 | 12 | 180 | 0.691 | 0.309 |
| Comparative Example 1 | CE1 | 100 | 0.688 | 0.312 |
| Comparative Example 2 | CE2 | 50 | 0.709 | 0.291 |
| Comparative Example 3 | CE3 | 11 | 0.722 | 0.278 |
| Comparative Example 4 | CE4 | 44 | 0.712 | 0.288 |
| Comparative Example 5 | CE5 | 227 | 0.204 | 0.682 |
| Comparative Example 6 | CE6 | 215 | 0.632 | 0.367 |
| Comparative Example 7 | CE7 | 131 | 0.670 | 0.330 |
| Comparative Example 8 | CE8 | 187 | 0.630 | 0.369 |
| Comparative Example 9 | CE9 | 261 | 0.227 | 0.697 |
| Comparative Example 10 | CE10 | 437 | 0.259 | 0.717 |

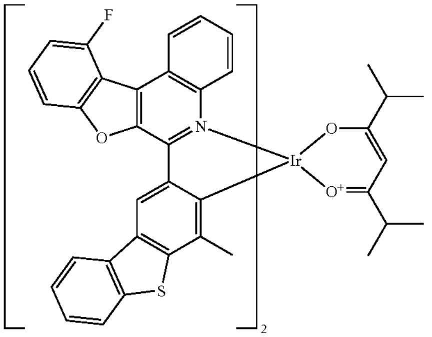

1

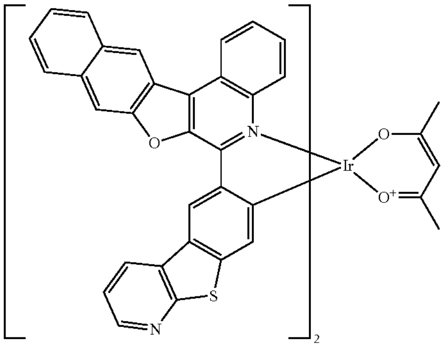

2

TABLE 4-continued
| Compound | Frontal efficiency (%) | CIE(x) | CIE(y) |
|---|---|---|---|
| 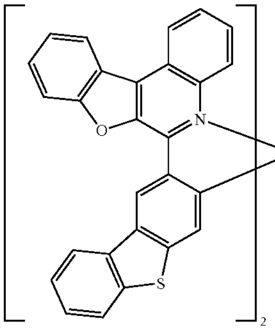 3 | | | |
| 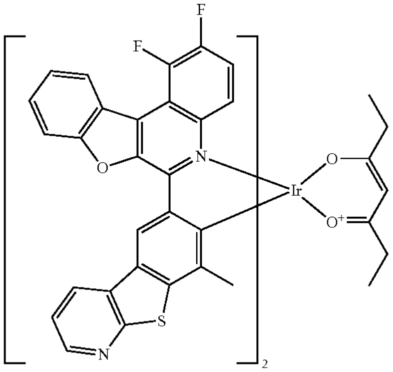 4 | | | |
| 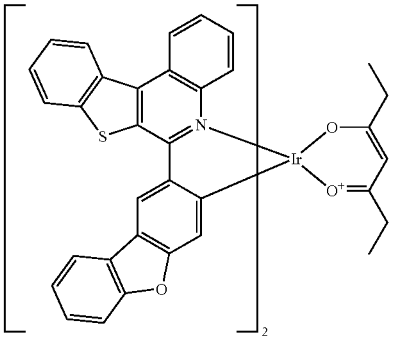 5 | | | |
| 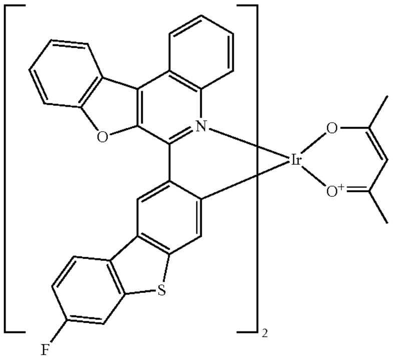 6 | | | |
TABLE 4-continued
| Compound | Frontal efficiency (%) | CIE(x) | CIE(y) |
|---|---|---|---|
| 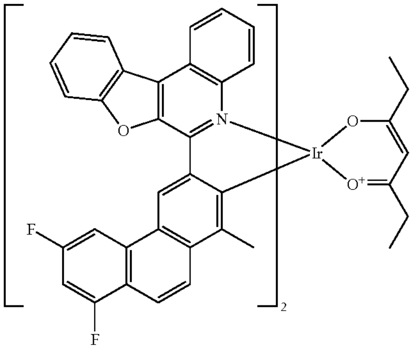 7 | | | |
| 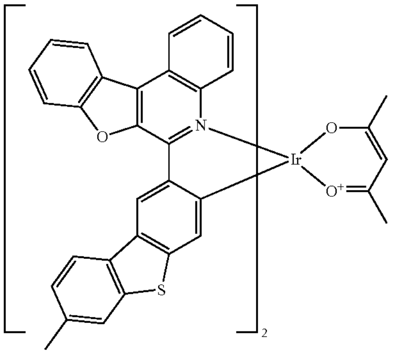 8 | | | |
| 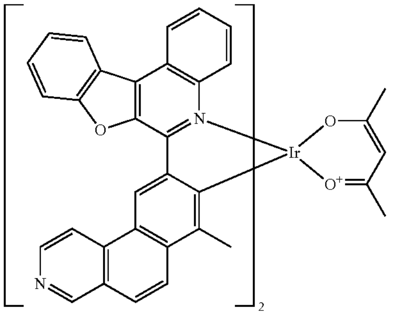 9 | | | |
| 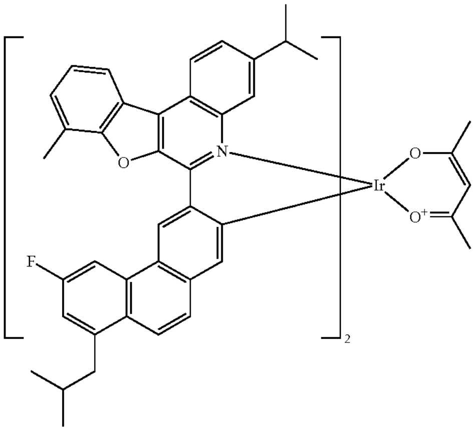 10 | | | |

TABLE 4-continued
| Compound | Frontal efficiency (%) | CIE(x) | CIE(y) |
|---|---|---|---|
| 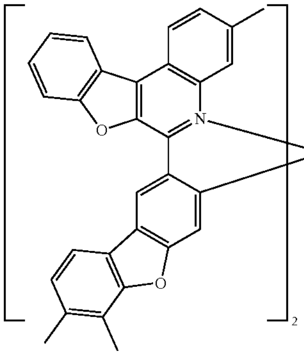 11 | | | |
| 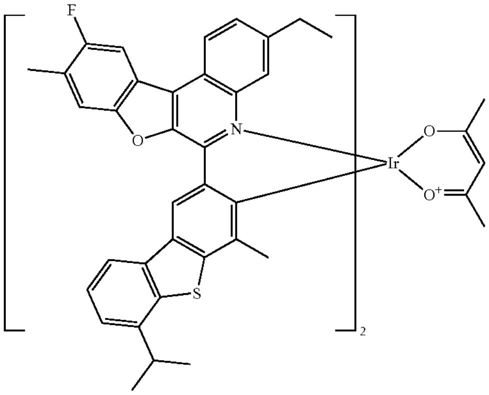 12 | | | |
| 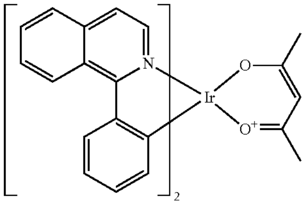 CE1 | | | |
| 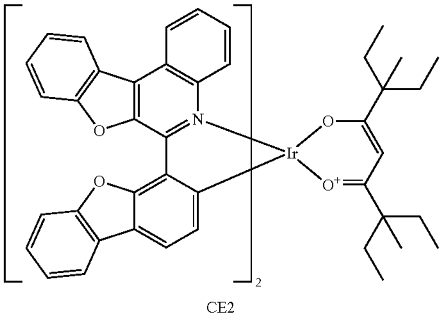 CE2 | | | |
| 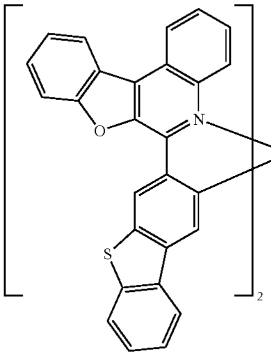 CE3 | | | |
| 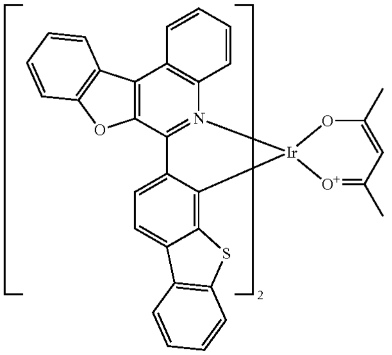 CE4 | | | |
| 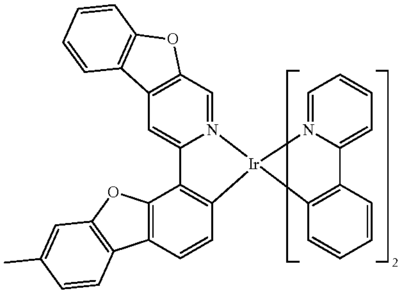 CE5 | | | |
| 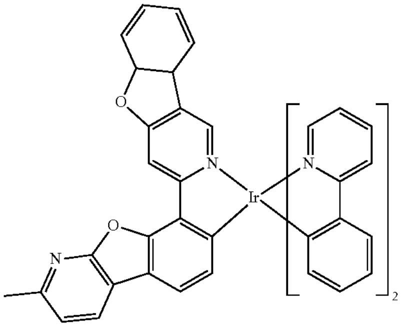 CE6 | | | |

TABLE 4-continued

| Compound | Frontal efficiency (%) | CIE(x) | CIE(y) |
|---|---|---|---|
| 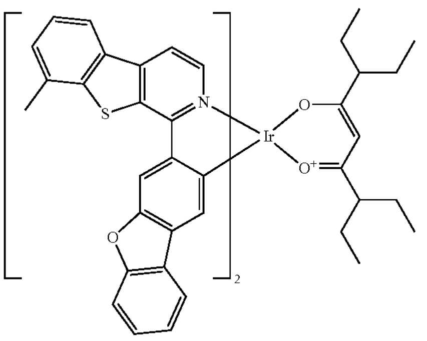 CE7 | | | |
| 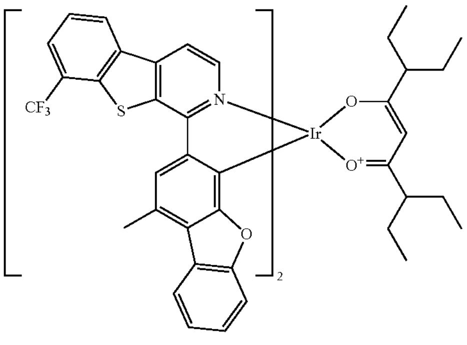 CE8 | | | |
| 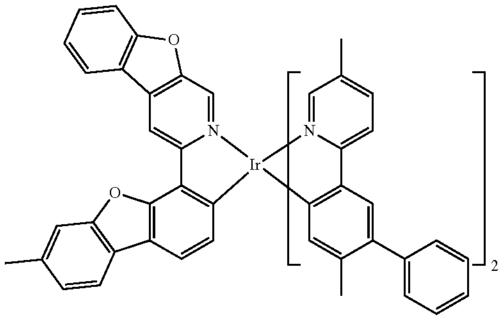 CE9 | | | |
| 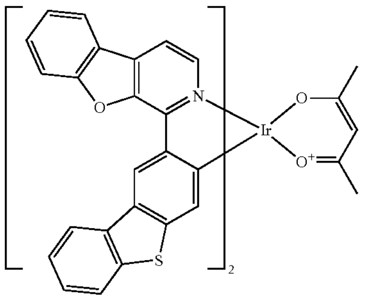 CE10 | | | |

From Table 4, it is confirmed that the light-emitting devices according to Examples 1 to 12 emit red light while having improved frontal luminescence (i.e., emission) efficiency compared to the light-emitting devices of Comparative Examples 1 to 10.

By utilizing the organometallic compound of the present disclosure, a light-emitting device having excellent, desired, or suitable emission efficiency and color purity characteristics and a high-quality electronic apparatus including the light-emitting device may be manufactured.

In the present disclosure, singular expressions may include plural expressions unless the context clearly indicates otherwise. It will be further understood that the terms “comprise,” “include,” or “have” when utilized in the present disclosure, specify the presence of stated features, integers, steps, operations, elements, and/or components, but do not preclude the presence or addition of one or more other features, integers, steps, operations, elements, components, and/or groups thereof. The “/” utilized below may be interpreted as “and” or as “or” depending on the situation.

Throughout the present disclosure, when a component such as a layer, a film, a region, or a plate is mentioned to be placed “on” another component, it will be understood that it may be directly on another component or that another component may be interposed therebetween. In some embodiments, “directly on” may refer to that there are no additional layers, films, regions, plates, etc., between a layer, a film, a region, a plate, etc. and the other part. For example, “directly on” may refer to two layers or two members are disposed without utilizing an additional member such as an adhesive member therebetween.

In the present disclosure, although the terms “first,” “second,” etc., may be utilized herein to describe one or more elements, components, regions, and/or layers, these elements, components, regions, and/or layers should not be limited by these terms. These terms are only utilized to distinguish one component from another component.

As utilized herein, the singular forms “a,” “an,” and “the” are intended to include the plural forms as well, unless the context clearly indicates otherwise. Further, the use of “may” when describing embodiments of the present disclosure refers to “one or more embodiments of the present disclosure”.

In the present disclosure, when particles are spherical, “diameter” indicates a particle diameter or an average particle diameter, and when the particles are non-spherical, the “diameter” indicates a major axis length or an average major axis length. The diameter (or size) of the particles may be measured utilizing a scanning electron microscope or a particle size analyzer. As the particle size analyzer, for example, HORIBA, LA-950 laser particle size analyzer, may be utilized. When the size of the particles is measured utilizing a particle size analyzer, the average particle diameter (or size) is referred to as D50. D50 refers to the average diameter (or size) of particles whose cumulative volume corresponds to 50 vol % in the particle size distribution (e.g., cumulative distribution), and refers to the value of the particle size corresponding to 50% from the smallest particle when the total number of particles is 100% in the distribution curve accumulated in the order of the smallest particle size to the largest particle size.

As utilized herein, the terms “substantially,” “about,” or similar terms are used as terms of approximation and not as terms of degree, and are intended to account for the inherent deviations in measured or calculated values that would be recognized by those of ordinary skill in the art. “About” as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The (organic) light-emitting device, the display device, the electronic apparatus, the electronic equipment, or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. An organometallic compound represented by Formula 1:

$$M_1(L_1)_{n1}(L_2)_{n2},$$ Formula 1 wherein, in Formula 1, $M_1$ is a transition metal, $L_1$ is a ligand represented by Formula 1A, $L_2$ is a bidentate ligand, and n1 and n2 are each independently 1 or 2, Formula 1A

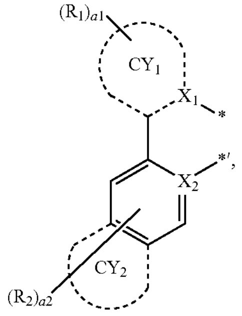

wherein, in Formula 1A, $X_1$ is C or N, $X_2$ is C or N, ring $CY_1$ and ring $CY_2$ are each independently a $C_5$-$C_{60}$ carbocyclic group or a $C_1$-$C_{60}$ heterocyclic group, ring $CY_1$ is a polycyclic group in which four or more rings are condensed with each other, $R_1$ and $R_2$ are independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_6$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, a1 and a2 are each independently an integer from 1 to 10, $R_{10a}$ is:

deuterium, —F, —Cl, —Br, —I, a hydroxyl group, a cyano group, or a nitro group;

a $C_1$-$C_{60}$ alkyl, a $C_2$-$C_{60}$ alkenyl group, a $C_2$-$C_{60}$ group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The organometallic compound of claim 1, wherein a part represented by

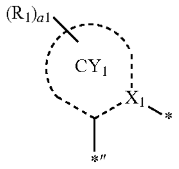

in Formula 1A is a group represented by any one selected from Formulae CY1(1) to CY1(4):

CY1(1)

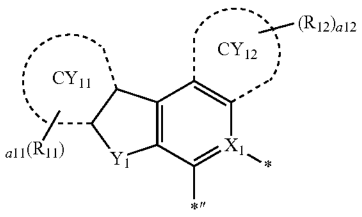

CY1(2)

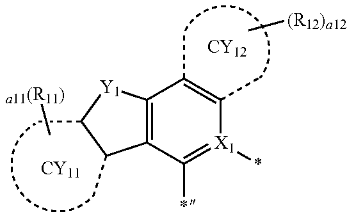

CY1(3)

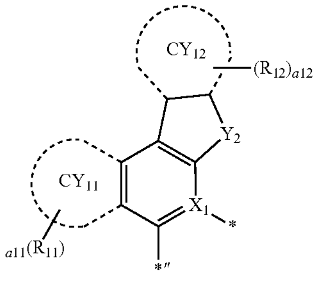

CY1(4)

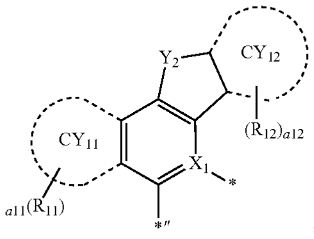

, wherein, in Formulae CY1(1) to CY1(4), ring $CY_{11}$ and ring $CY_{12}$ are each independently a $C_5$-$C_{60}$ carbocyclic group or a $C_1$-$C_{60}$ heterocyclic group, $X_1$ is C or N, $Y_1$ is O, S, Se, $N(R_{1a})$, $C(R_{1a})(R_{1b})$, or $Si(R_{1a})(R_{1b})$, $Y_2$ is O, S, Se, $N(R_{1c})$, $C(R_{1c})(R_{1d})$, or $Si(R_{1c})(R_{1d})$, $R_{11}$, $R_{12}$, $R_{1a}$, $R_{1b}$, $R_{1c}$, and $R_{1d}$ are each independently as described with respect to $R_1$ in Formula 1, a11 and a12 are each independently an integer from 1 to 10, and and *" each indicate a binding site to a neighboring atom.

3. The organometallic compound of claim 1, wherein a part represented by

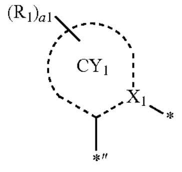

in Formula 1A is a group represented by any one selected from Formulae CY1(1A) to CY1(4A):

CY1(1A)

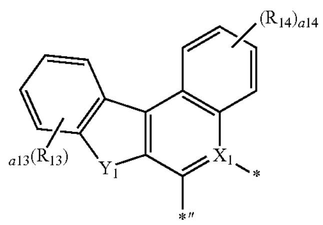

CY1(2A)

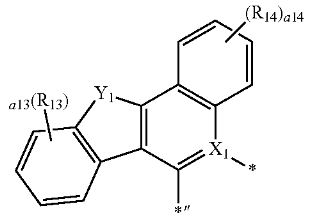

CY1(3A)

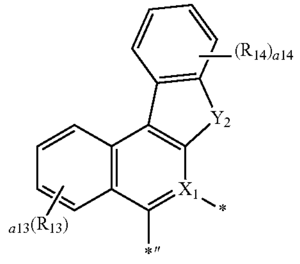

CY1(4A)

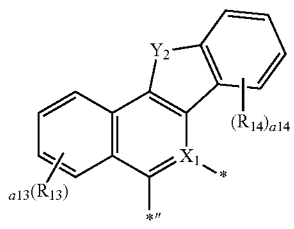

, wherein, in Formulae CY1(1A) to CY1(4A), $X_1$ is C or N, $Y_1$ is O, S, Se, $N(R_{1a})$, $C(R_{1a})(R_{1b})$, or $Si(R_{1a})(R_{1b})$, $Y_2$ is O, S, Se, $N(R_{1c})$, $C(R_{1c})(R_{1d})$, or $Si(R_{1c})(R_{1d})$, $R_{13}$, $R_{14}$, $R_{1a}$, $R_{1b}$, $R_{1c}$, and $R_{1d}$ are each independently as described with respect to $R_1$ in Formula 1, a13 and a14 are each independently an integer from 1 to 4, and and *" each indicate a binding site to a neighboring atom.

4. The organometallic compound of claim 1, wherein ring $CY_2$ is i) a polycyclic group in which two or more cyclic groups selected from Group A1 are condensed with each other, ii) a polycyclic group in which two or more cyclic groups selected from Group A2 are condensed with each other, or iii) a polycyclic group in which at least one cyclic group selected from Group A1 and at least one cyclic group selected from Group A2 are condensed with each other:

Group A1:

a cyclopentane group, a cyclopentadiene group, a furan group, a thiophene group, a pyrrole group, a silole group, an indene group, a benzofuran group, a benzothiophene group, an indole group, a benzosilole group, an oxazole group, an isooxazole group, an oxadiazole group, an isooxadiazole group, an oxatriazole group, an isooxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, Group A2:

an adamantane group, a norbornane group, a norbornene group, a cyclohexane group, a cyclohexene group, a benzene group, a pyridine group, a pyrimidine group, a pyrazine group, a pyridazine group, and a triazine group.

5. The organometallic compound of claim 1, wherein a part represented by

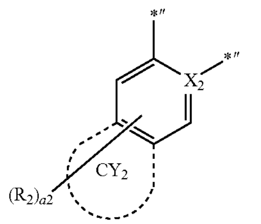

in Formula 1A is a group represented by any one selected from Formulae CY2(1) to CY2(5):

CY2(1)

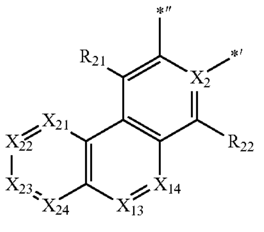

-continued

CY2(2)

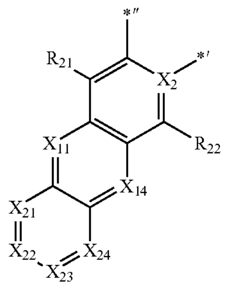

CY2(3)

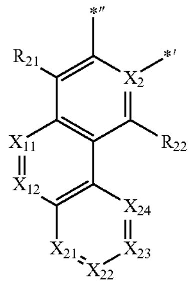

CY2(4)

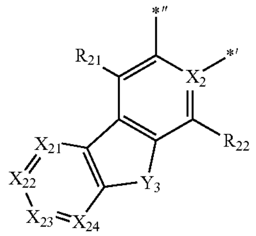

CY2(5)

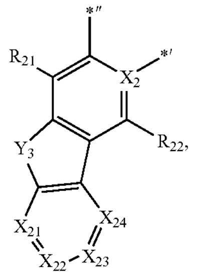

wherein, in Formulae CY2(1) to CY2(5), $X_2$ is C or N, $X_{11}$ is $C(Z_{11})$ or N, $X_{12}$ is $C(Z_{12})$ or N, $X_{13}$ is $C(Z_{13})$ or N, $X_{14}$ is $C(Z_{14})$ or N, $X_{21}$ is $C(Z_{21})$ or N, $X_{22}$ is $C(Z_{22})$ or N, $X_{23}$ is $C(Z_{23})$ or N, $X_{24}$ is $C(Z_{24})$ or N, $Y_3$ is O, S, Se, $N(R_{3a})$, $C(R_{3a})(R_{3b})$, $Si(R_{3a})(R_{3b})$, or $Ge(R_{3a})(R_{3b})$, $R_{21}$, $R_{22}$, $Z_{11}$ to $Z_{14}$, $Z_{21}$ to $Z_{24}$, $R_{3a}$, and $R_{3b}$ are each independently as described with respect to $R_2$ in Formula 1, and and *" each indicate a binding site to a neighboring atom.

6. The organometallic compound of claim 1, wherein $L_2$ is a ligand represented by Formula 1B:

Formula 1B

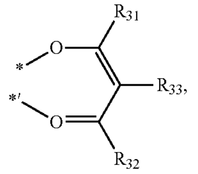

wherein, in Formula 1B, $R_{31}$ to $R_{33}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_6$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, $R_{10a}$ and $Q_1$ to $Q_3$ are each as described in Formula 1, and and *' each indicate a binding site to a neighboring atom.

7. The organometallic compound of claim 1, wherein a photoluminescence (PL) spectrum of the organometallic compound comprises a first peak ($\lambda_1$), which is a peak having a highest intensity ($I_1$), and a second peak ($\lambda_2$), which is a peak having a second-highest intensity ($I_2$), and a wavelength in which the first peak is exhibited is about 610 nm to about 640 nm.

8. The organometallic compound of claim 1, wherein a PL spectrum of the organometallic compound comprises a first peak ($\lambda_1$), which is a peak having a highest intensity ($I_1$), and a second peak ($\lambda_2$), which is a peak having a second-highest intensity ($I_2$), and a ratio of an intensity of the second peak to an intensity of the first peak ($I_2/I_1$) is less than or equal to 0.2.

9. An organometallic compound comprising a first metal and a first ligand, wherein the first metal is iridium (Ir), platinum (Pt), osmium (Os), titanium (Ti), zirconium (Zr), hafnium (Hf), europium (Eu), terbium (Tb), thulium (Tm), or rhodium (Rh), the first ligand is a bidentate ligand bonded to the first metal, the first ligand comprises a first ring and a second ring which are directly bonded to the first metal, the first ring and the second ring are each independently a $C_5$-$C_{60}$ carbocyclic group or a $C_1$-$C_{60}$ heterocyclic group, wherein the organometallic compound is to emit first light, a photoluminescence (PL) spectrum of the first light comprises a first peak ($\lambda_1$), which is a peak having a highest intensity ($I_1$), and a second peak ($\lambda_2$), which is a peak having a second-highest intensity ($I_2$), and Condition 1 and Condition 2 are each satisfied:

Condition 1 a wavelength in which the first peak is exhibited is 610 nm to 640 nm; and

Condition 2 a ratio of an intensity of the second peak to an intensity of the first peak ($I_2/I_1$) is 0.1 to 0.2.

10. The organometallic compound of claim 9, wherein reorganization energy of the organometallic compound is less than or equal to 0.11 eV.

11. The organometallic compound of claim 9, wherein the first ring is a polycyclic group in which four or more cyclic groups are condensed with each other.

12. The organometallic compound of claim 9, wherein the second ring is a polycyclic group in which three or more cyclic groups are condensed with each other.

13. The organometallic compound of claim 9, wherein the first ring comprises at least one nitrogen (N), and carbon (C) of the first ring and carbon (C) of the second ring are directly bonded to each other.

14. The organometallic compound of claim 9, further comprising a second ligand, wherein the second ligand is a bidentate ligand bonded to the first metal, and the second ligand comprises at least one oxygen (O).

15. The organometallic compound of claim 14, wherein oxygen of the second ligand is directly bonded to the first metal.

16. A light-emitting device comprising:

a first electrode;

a second electrode facing the first electrode;

an interlayer between the first electrode and the second electrode; and the organometallic compound of claim 1.

17. The light-emitting device of claim 16, wherein the interlayer comprises an emission layer, and the emission layer comprises the organometallic compound.

18. The light-emitting device of claim 16, wherein the light-emitting device is to emit light having a full width at half maximum (FWHM) of an emission spectrum at about 40 nm to about 47 nm.

19. The light-emitting device of claim 16, wherein the light-emitting device is to emit light having a CIE(x) value greater than or equal to 0.67.

20. An electronic apparatus comprising the light-emitting device of claim 16.

* * * * *